US012684779B2

(12) United States Patent
Kim et al.

(10) Patent No.: US 12,684,779 B2
(45) Date of Patent: Jul. 14, 2026

(54) SEMICONDUCTOR MEMORY DEVICE, METHOD FOR FABRICATING THE SAME AND ELECTRONIC SYSTEM INCLUDING THE SAME

(71) Applicant: Samsung Electronics Co., Ltd., Suwon-si (KR)

(72) Inventors: Byong Ju Kim, Suwon-si (KR); Dong Sung Choi, Suwon-si (KR); Won Jun Park, Suwon-si (KR); Dong Hwa Lee, Suwon-si (KR); Jae Min Jung, Suwon-si (KR); Chang Heon Cheon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 405 days.

(21) Appl. No.: 18/526,285

(22) Filed: Dec. 1, 2023

(65) Prior Publication Data
US 2024/0357824 A1     Oct. 24, 2024

(30) Foreign Application Priority Data

Apr. 18, 2023     (KR) ........................ 10-2023-0050919

(51) Int. Cl.
*H10B 43/35* (2023.01)
*H10B 43/10* (2023.01)
*H10B 43/27* (2023.01)
(52) U.S. Cl.
CPC ............. *H10B 43/35* (2023.02); *H10B 43/10* (2023.02); *H10B 43/27* (2023.02)

(58) Field of Classification Search
None
See application file for complete search history.

(56) References Cited

U.S. PATENT DOCUMENTS 7,612,403 B2 * 11/2009 Bhattacharyya ....... H10D 30/69
                                                            257/317
11,211,489 B2    12/2021 Doyle et al.
                        (Continued)

FOREIGN PATENT DOCUMENTS

CN            114823701 A      7/2022
CN            117497560 A  *  2/2024 ........... H10D 64/514
                        (Continued)

*Primary Examiner* — Michael Lebentritt
(74) *Attorney, Agent, or Firm* — HARNESS, DICKEY & PIERCE, P.L.C.

(57) ABSTRACT

There is provided a semiconductor memory device having improved reliability. The semiconductor memory device includes a cell substrate, a mold stack including mold insulating layers and gate electrodes, which are alternately stacked on the cell substrate, a semiconductor layer extended in a vertical direction crossing an upper surface of the cell substrate to pass through the mold stack, a blocking insulating pattern between the semiconductor layer and each of the gate electrodes, a charge storage layer including a charge trap portion between the semiconductor layer and the blocking insulating pattern and a first charge blocking portion between the semiconductor layer and each of the mold insulating layers, and a tunnel insulating layer between the semiconductor layer and the charge storage layer, wherein an oxygen concentration of the first charge blocking portion is higher than that of the charge trap portion.

20 Claims, 39 Drawing Sheets

10

ADDR

Row Decoder
33

30

SSL
WL
GSL

Memory Cell Array
20
BLK1
BLK2
⋮
BLKn

BL

CMD
CTRL

Control Logic
37

Page Buffer
35

DATA

(56)          References Cited

U.S. PATENT DOCUMENTS

| | | | |
|---|---|---|---|
| 11,882,705 B2 * | 1/2024 | Song ...................... | H10D 62/80 |
| 2006/0267072 A1 * | 11/2006 | Bhattacharyya ..... | H10D 64/511 |
| | | | 257/E29.128 |
| 2013/0182521 A1 * | 7/2013 | Jang ..................... | H10D 30/693 |
| | | | 365/218 |
| 2016/0284410 A1 * | 9/2016 | Lee .................... | G11C 16/0483 |
| 2019/0013074 A1 * | 1/2019 | Bhattacharyya ..... | H10D 64/685 |
| 2021/0296458 A1 | 9/2021 | Okada et al. | |
| 2023/0139541 A1 * | 5/2023 | Lee ........................ | H10B 43/27 |
| | | | 257/324 |
| 2023/0180475 A1 * | 6/2023 | Choi ...................... | H10B 41/10 |
| | | | 438/478 |
| 2023/0284450 A1 * | 9/2023 | Lee ........................ | H10B 43/27 |

FOREIGN PATENT DOCUMENTS

| | | | | | |
|---|---|---|---|---|---|
| CN | 118042841 A | * | 5/2024 | ............ | H10W 46/00 |
| EP | 4498776 A1 | * | 1/2025 | ............ | H10W 90/00 |
| KR | 102421606 B1 | | 7/2022 | | |
| KR | 20240022162 A | * | 2/2024 | ............ | H10B 43/27 |
| KR | 20250056847 A | * | 4/2025 | ............ | H10B 80/00 |
| KR | 20250141097 A | * | 9/2025 | ............ | H10D 30/689 |
| WO | WO-2021059079 A1 | * | 4/2021 | ............ | G11C 16/32 |

* cited by examiner

SEMICONDUCTOR MEMORY DEVICE, METHOD FOR FABRICATING THE SAME AND ELECTRONIC SYSTEM INCLUDING THE SAME

CROSS-REFERENCE TO RELATED APPLICATION

This U.S. non-provisional application claims priority from Korean Patent Application No. 10-2023-0050919 filed on Apr. 18, 2023 in the Korean Intellectual Property Office and all the benefits accruing therefrom under 35 U.S.C. 119, the contents of which in its entirety are herein incorporated by reference.

BACKGROUND

The present disclosure relates to semiconductor memory devices, methods for fabricating the same, and an electronic system including the same, and more particularly, to semiconductor memory devices including memory cells arranged three-dimensionally, methods for fabricating the same and electronic systems including the same.

As a semiconductor memory device capable of storing data of high capacity is required in an electronic system, methods capable of increasing data storage capacity of a semiconductor memory device have been studied. As one of methods capable of increasing data storage capacity of semiconductor memory devices, semiconductor memory devices including memory cells, which are arranged three-dimensionally instead of memory cells that are two-dimensionally, has been suggested.

SUMMARY

Aspects of the present disclosure provide semiconductor memory devices which may have improved reliability.

Other aspects of the present disclosure provide methods for fabricating semiconductor memory devices which may have improved reliability.

The aspects of the present disclosure are not limited to those mentioned above and additional aspects of the present disclosure, which are not mentioned herein, will be clearly understood by those skilled in the art from the following description of the present disclosure.

According to some aspects of the present disclosure, there is provided a semiconductor memory device comprising a cell substrate, a mold stack including mold insulating layers and gate electrodes, which are alternately stacked on the cell substrate, a semiconductor layer extended in a vertical direction crossing an upper surface of the cell substrate to pass through the mold stack, a blocking insulating pattern between the semiconductor layer and each of the gate electrodes, a charge storage layer including a charge trap portion between the semiconductor layer and the blocking insulating pattern and a first charge blocking portion between the semiconductor layer and each of the mold insulating layers, and a tunnel insulating layer between the semiconductor layer and the charge storage layer, wherein an oxygen concentration of the first charge blocking portion is higher than that of the charge trap portion.

According to some aspects of the present disclosure, there is provided a semiconductor memory device comprising a cell substrate, a mold stack including mold insulating layers and gate electrodes, which are alternately stacked on the cell substrate, and a channel structure extended in a vertical direction crossing an upper surface of the cell substrate to pass through the mold stack, wherein the channel structure includes a blocking insulating pattern on a side surface of each of the gate electrodes, a charge storage layer including a charge trap portion extended along the blocking insulating pattern and a first charge blocking portion extended along a side surface of each of the mold insulating layers, an isolation insulating pattern on the first charge blocking portion, a tunnel insulating layer extended along the charge trap portion and the isolation insulating pattern; and a semiconductor layer extended along the tunnel insulating layer, wherein an oxygen concentration of the first charge blocking portion is higher than an oxygen concentration of the charge trap portion.

According to some aspects of the present disclosure, there is provided an electronic system comprising a main board, a semiconductor memory device including a peripheral circuit structure and a memory cell structure, which are sequentially stacked on the main board, and a controller electrically connected to the semiconductor memory device on the main board, wherein the memory cell structure includes a cell substrate, a mold stack including mold insulating layers and gate electrodes, which are alternately stacked on the cell substrate, a semiconductor layer extended in a vertical direction crossing an upper surface of the cell substrate to pass through the mold stack, a blocking insulating pattern between the semiconductor layer and each of the gate electrodes, a charge storage layer including a charge trap portion between the semiconductor layer and the blocking insulating pattern and a first charge blocking portion between the semiconductor layer and each of the mold insulating layers, and a tunnel insulating layer between the semiconductor layer and the charge storage layer, wherein an oxygen concentration of the first charge blocking portion is higher than an oxygen concentration of the charge trap portion.

BRIEF DESCRIPTION OF THE DRAWINGS

The above and other aspects and features of the present disclosure will become more apparent by describing in detail example embodiments thereof with reference to the attached drawings, in which:

FIG. 6 is an energy band diagram illustrating a charge storage layer of FIG. 5;

FIGS. 13 to 30 are views illustrating intermediate steps to describe a method for fabricating a semiconductor memory device according to some example embodiments;

DETAILED DESCRIPTION

Hereinafter, semiconductor memory devices according to example embodiments of the present disclosure will be described with reference to FIGS. 1 to 12.

Figure 1:
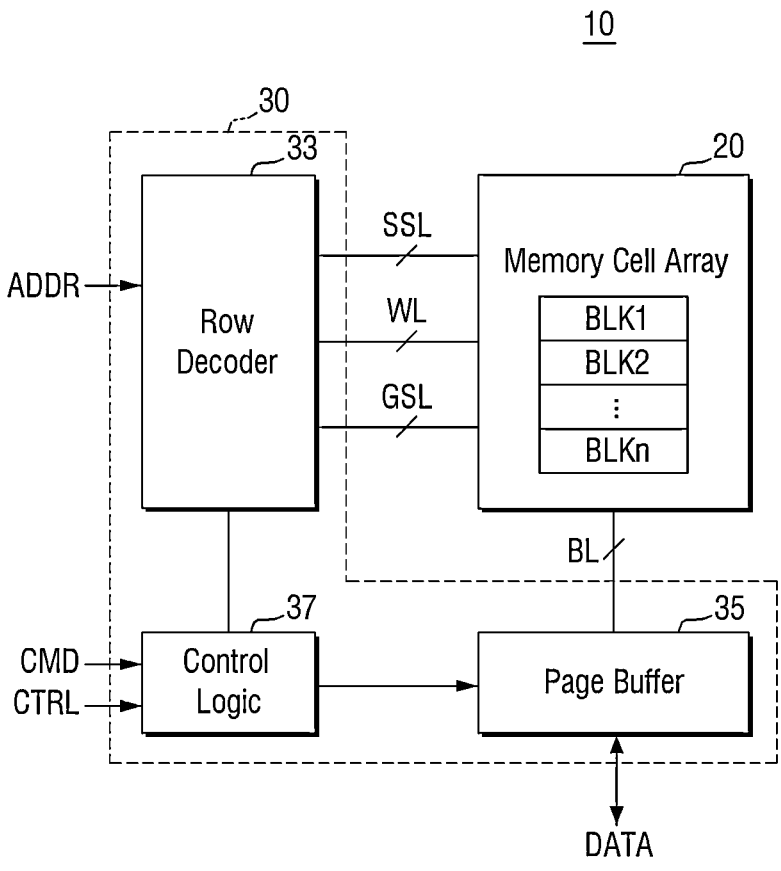
FIG. 1 is an example block diagram illustrating a semiconductor memory device according to some example embodiments.

FIG. 1 is an example block diagram illustrating a semiconductor memory device according to some example embodiments.

Referring to FIG. 1, a semiconductor memory device 10 includes a memory cell array 20 and a peripheral circuit 30.

A memory cell array 20 may include a plurality of memory cell blocks BLK1 to BLKn. Each of the memory cell blocks BLK1 to BLKn may include a plurality of memory cells. The memory cell array 20 may be connected to a peripheral circuit 30 through a bit line BL, a word line WL, at least one string selection line SSL and at least one ground selection line GSL. In detail, the memory cell blocks BLK1 to BLKn may be connected to a row decoder 33 through the word line WL, the string selection line SSL and the ground selection line GSL. In addition, the memory cell blocks BLK1 to BLKn may be connected to a page buffer 35 through the bit line BL.

The peripheral circuit 30 may receive an address ADDR, a command CMD and a control signal CTRL from the outside of the semiconductor memory device 10, and may transmit and receive data DATA to and from an external device of the semiconductor memory device 10. The peripheral circuit 30 may include the row decoder 33, the page buffer 35 and a control logic 37. Although not shown, the peripheral circuit 30 may further include various sub-circuits such as an input/output circuit, a voltage generating circuit for generating various voltages required for an operation of the semiconductor memory device 10 and an error correction circuit for correcting an error of data DATA read from the memory cell array 20.

The control logic 37 may be connected to the row decoder 33, the page buffer 35, the input/output circuit and the voltage generating circuit. The control logic 37 may control the overall operation of the semiconductor memory device 10. The control logic 37 may generate various internal control signals used in the semiconductor memory device 10 in response to the control signal CTRL. For example, the control logic 37 may adjust a voltage level provided to the word line WL and the bit line BL when a memory operation such as a program operation or an erase operation is performed.

The row decoder 33 may select at least one of the plurality of memory cell blocks BLK1 to BLKn in response to the address ADDR, and may select at least one word line WL, at least one string selection line SSL and at least one ground selection line GSL of the selected memory cell blocks BLK1 to BLKn. In addition, the row decoder 33 may transmit a voltage for performing the memory operation to the word line WL of the selected memory cell blocks BLK1 to BLKn.

The page buffer 35 may be connected to the memory cell array 20 through the bit line BL. The page buffer 35 may operate as a write driver or a sense amplifier. In detail, when a program operation is performed, the page buffer 35 may operate as a write driver to apply a voltage according to the data DATA to be stored in the memory cell array 20, to the bit line BL. Meanwhile, when a read operation is performed, the page buffer 35 may operate as a sense amplifier to sense the data DATA stored in the memory cell array 20.

Figure 2:
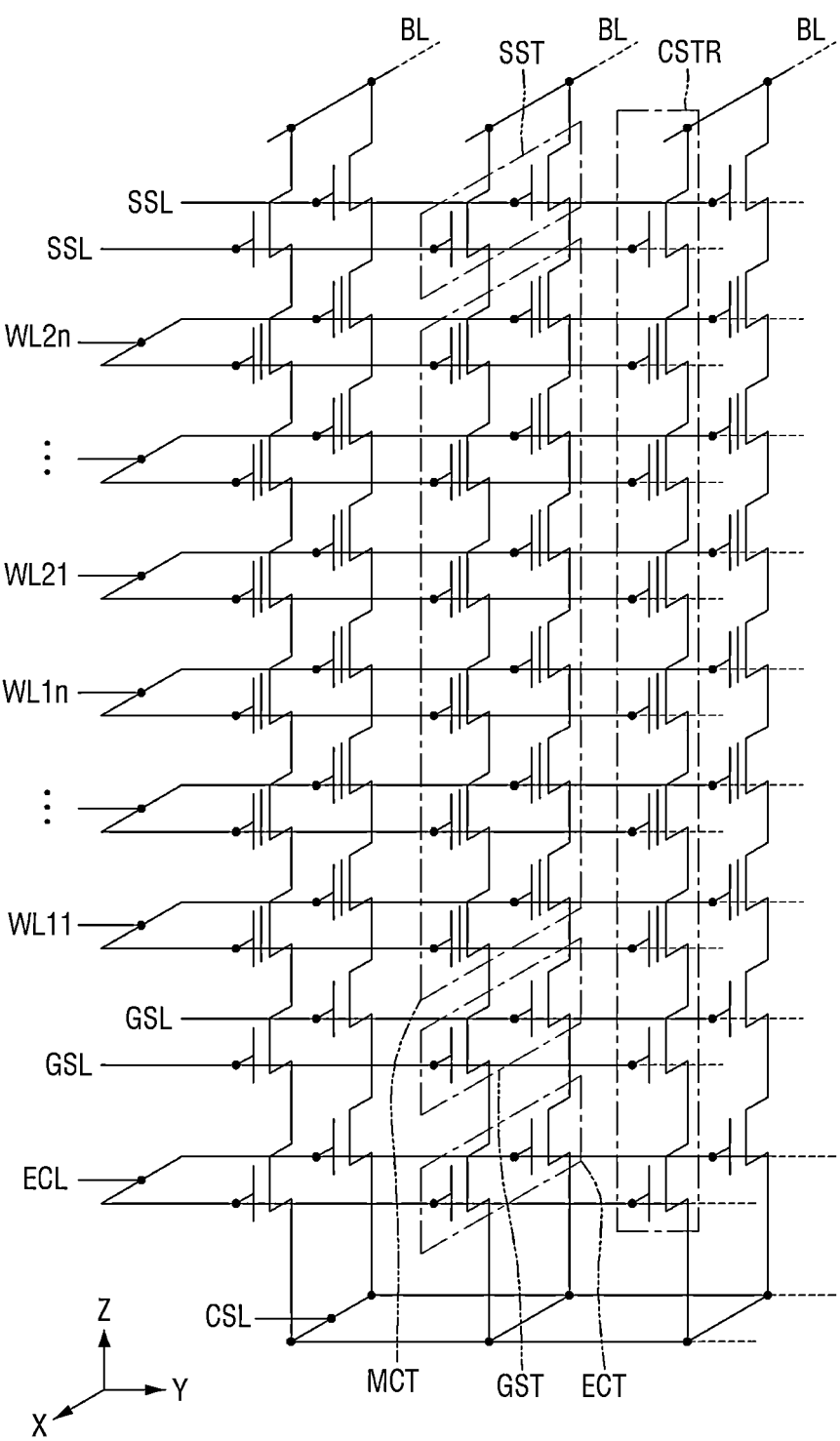
FIG. 2 is an example circuit view illustrating a semiconductor memory device according to some example embodiments.

FIG. 2 is an example circuit view illustrating a semiconductor memory device according to some example embodiments.

Referring to FIG. 2, a memory cell array (e.g., 20 of FIG. 1) of a semiconductor memory device according to some example embodiments includes a common source line CSL, a plurality of bit lines BL and a plurality of cell strings CSTR.

The common source line CSL may be extended in a first direction X. In some example embodiments, a plurality of common source lines CSL may be arranged two dimensionally. For example, the plurality of common source lines CSL may be spaced apart from each other and extended in the first direction X. Voltages that are electrically the same may be applied to the common source lines CSL, or different voltages may be applied to the common source lines CSL so that the common source lines CSL may be separately controlled.

The plurality of bit lines BL may be arranged two-dimensionally. For example, the bit lines BL may be spaced apart from each other and respectively extended in the second direction Y crossing the first direction X. The plurality of cell strings CSTR may be respectively connected to the respective bit lines BL in parallel. The cell strings CSTR may be commonly connected to the common source line CSL. That is, the plurality of cell strings CSTR may be disposed between the bit lines BL and the common source line CSL.

Each of the cell strings CSTR may include a ground selection transistor GST connected to the common source line CSL, a string selection transistor SST connected to the bit line BL and a plurality of memory cell transistors MCT disposed between the ground selection transistor GST and the string selection transistor SST. The ground selection transistor GST, the string selection transistor SST and the memory cell transistors MCT may be connected in series. Each of the memory cell transistors MCT may include a data storage element.

The common source line CSL may be commonly connected to sources of the ground selection transistors GST. In addition, the ground selection line GSL, a plurality of word lines WL11 to WL1$n$ and WL21 to WL2$n$ and the string selection line SSL may be disposed between the common source line CSL and the bit line BL. The ground selection line GSL may be used as a gate electrode of the ground selection transistor GST, the word lines WL11 to WL1$n$ and WL21 to WL2$n$ may be used as gate electrodes of the memory cell transistors MCT, and the string selection line SSL may be used as a gate electrode of the string selection transistor SST.

In some example embodiments, an erase control transistor ECT may be disposed between the common source line CSL and the ground selection transistor GST. The common source line CSL may be commonly connected to sources of the erase control transistors ECT. An erase control line ECL may be disposed between the common source line CSL and the ground selection line GSL. The erase control line ECL may be used as a gate electrode of the erase control transistor ECT. The erase control transistors ECT may generate a gate induced drain leakage (GIDL) to perform an erase operation of the memory cell array.

Figure 3:
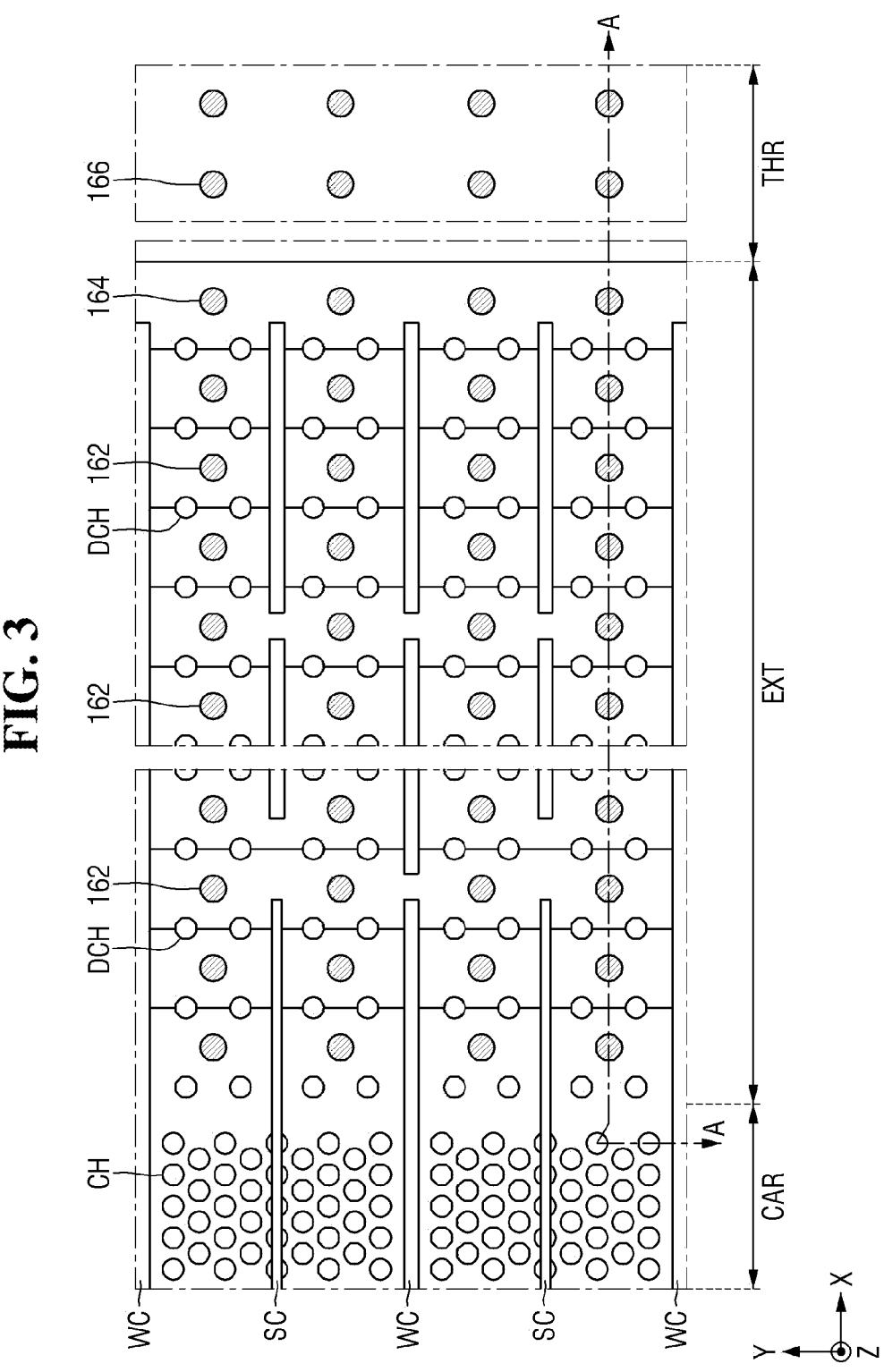
FIG. 3 is a schematic layout view illustrating a semiconductor memory device according to some example embodiments.
Figure 4:
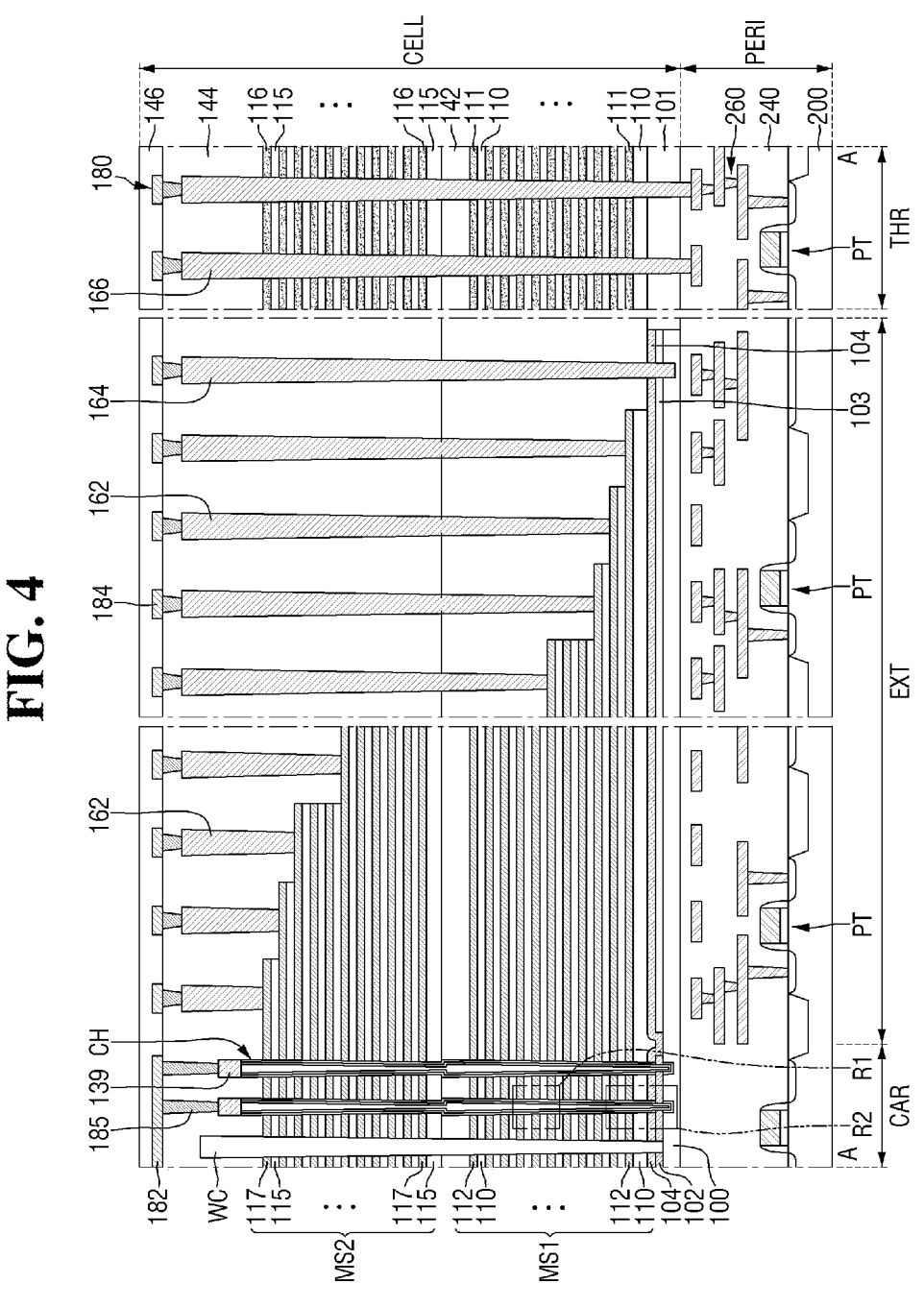
FIG. 4 is a cross-sectional view taken along line A-A of FIG. 3.
Figure 5:
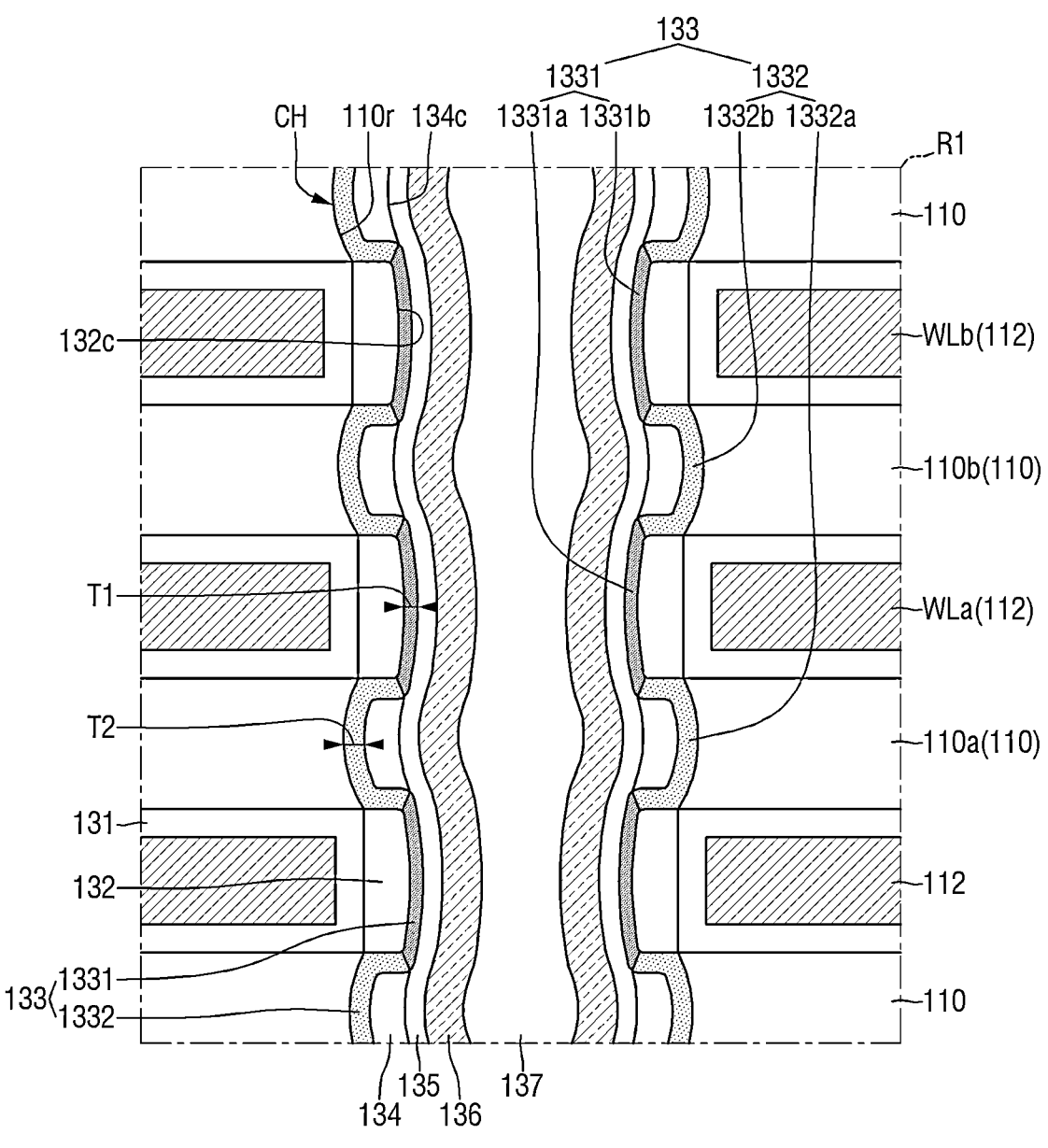
FIG. 5 is an enlarged view illustrating a region R1 of FIG. 4.
Figure 6:
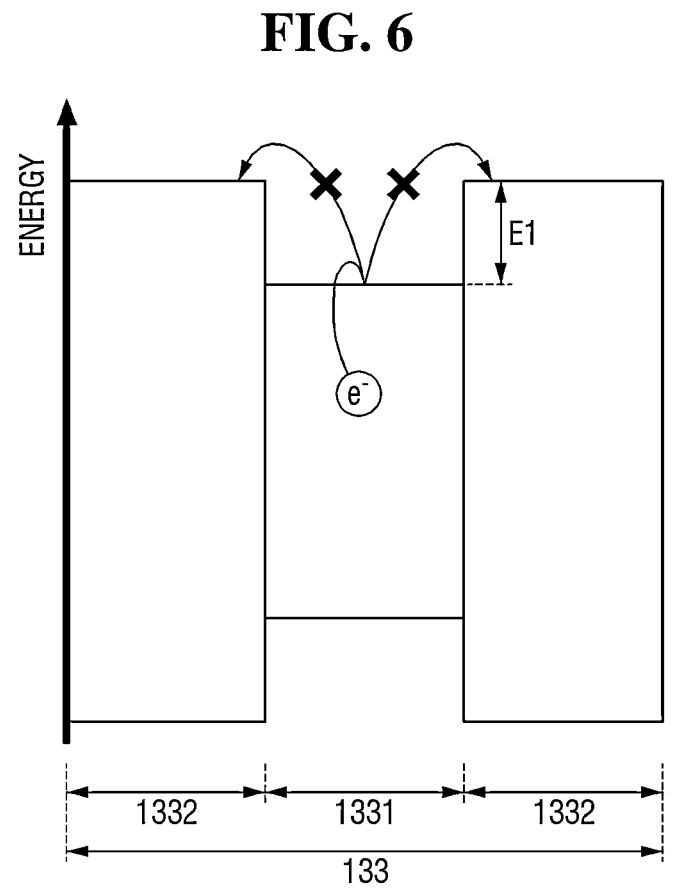
Figure 7:
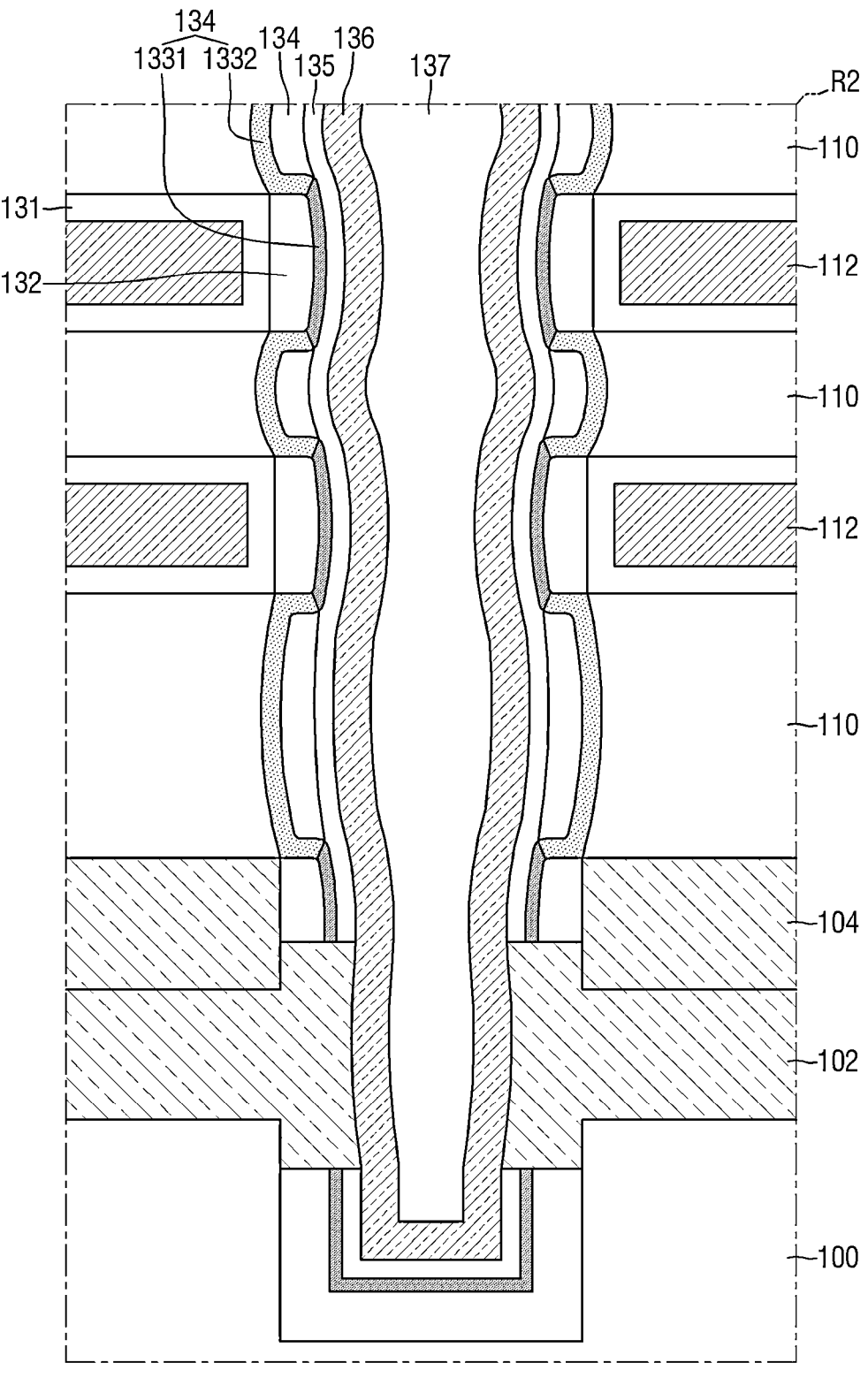
FIG. 7 is an enlarged view illustrating a region R2 of FIG. 4.

FIG. 3 is a schematic layout view illustrating a semiconductor memory device according to some example embodiments. FIG. 4 is a cross-sectional view taken along line A-A of FIG. 3. FIG. 5 is an enlarged view illustrating a region R1 of FIG. 4. FIG. 6 is an energy band diagram illustrating a charge storage layer of FIG. 5. FIG. 7 is an enlarged view illustrating a region R2 of FIG. 4.

Referring to FIGS. 3 to 7, the semiconductor memory device according to some example embodiments includes a memory cell structure CELL and a peripheral circuit structure PERI.

The memory cell structure CELL may include a cell substrate 100, an insulating substrate 101, mold stacks MS1 and MS2, a source layer 102, a source sacrificial layer 103, a support layer 104, interlayer insulating layers 142 and 144, a channel structure CH, a word line cutting region WC, a gate contact 162, a substrate contact 164, and a cell wiring structure 180.

The cell substrate 100 may include a semiconductor substrate such as, for example, a silicon substrate, a germanium substrate or a silicon-germanium substrate. Alternatively, the cell substrate 100 may include a silicon-on-insulator (SOI) substrate or a germanium-on-insulator (GOI) substrate. In some example embodiments, the cell substrate 100 may include impurities. For example, the cell substrate 100 may be an n-type substrate that includes n-type impurities (e.g., phosphorus (P), arsenic (As), etc.).

The cell substrate 100 may include a cell array region CAR and an extended region EXT.

A memory cell array (e.g., 20 of FIG. 1) including a plurality of memory cells may be formed in the cell array region CAR. For example, the channel structure CH and gate electrodes 112 and 117, which will be described later, may be disposed in the cell array region CAR. In the following description, a surface of the cell substrate 100 on which the memory cell array is disposed may be referred to as a front side of the cell substrate 100. On the contrary, a surface of the cell substrate 100, which is opposite to the front side of the cell substrate 100, may be referred to as a back side of the cell substrate 100.

The extended region EXT may be disposed near the cell array region CAR. For example, the extended region EXT may surround the cell array region CAR in view of a plane. The gate electrodes 112 and 117, which will be described later, may be stacked on the extended region EXT in a stepwise shape.

In some example embodiments, the cell substrate 100 may further include a through region THR. The through region THR may be disposed inside the cell array region CAR and/or the extended region EXT, or may be disposed outside the cell array region CAR and/or the extended region EXT. A through via 166, which will be described later, may be disposed on the through region THR.

The insulating substrate 101 may be formed in at least a portion of the cell substrate 100 of the extended region EXT and/or the through region THR. The insulating substrate 101 may form an insulating region in the cell substrate 100 of the extended region EXT and/or the through region THR. For example, the insulating substrate 101 may define the insulating region in the through region THR by replacing at least a portion of the cell substrate 100 of the through region THR. The insulating substrate 101 may include, but is not limited to, at least one of, for example, silicon oxide, silicon nitride, silicon oxynitride or silicon carbide.

The mold stacks MS1 and MS2 may be formed on the front side of the cell substrate 100. The mold stacks MS1 and MS2 may include a plurality of gate electrodes 112 and 117 and a plurality of mold insulating layers 110 and 115, which are stacked on the cell substrate 100. Each of the gate electrodes 112 and 117 and each of the mold insulating layers 110 and 115 may be a layered structure extended in a horizontal direction (e.g., the first direction X and the second direction Y) parallel with the front side of the cell substrate 100. The gate electrodes 112 and 117 may be spaced apart from each other by the mold insulating layers 110 and 115 and then sequentially stacked on the cell substrate 100.

In some example embodiments, the mold stacks MS1 and MS2 may include a plurality of stacks (e.g., a first mold stack MS1 and a second mold stack MS2) that are sequentially stacked on the cell substrate 100. Although only two stacks are shown as being stacked on the cell substrate 100, this is only for convenience of description, and the number of stacks stacked on the cell substrate 100 may be three or more.

The first mold stack MS1 may include first mold insulating layers 110 and first gate electrodes 112, which are alternately stacked on the cell substrate 100. In some example embodiments, the first gate electrodes 112 may include at least one erase control line (e.g., ECL of FIG. 2), at least one ground selection line (e.g., GSL of FIG. 2), and a plurality of first word lines (e.g., WL11 to WL1$n$ of FIG. 2), which are sequentially stacked on the cell substrate 100. The number and shape of the first mold insulating layers 110 and the first gate electrodes 112 are only examples, and the inventive concepts are not limited to the shown example.

The second mold stack MS2 may include second mold insulating layers 115 and second gate electrodes 117, which are alternately stacked on the first mold stack MS1. In some example embodiments, the second gate electrodes 117 may include a plurality of second word lines (e.g., WL21 to WL2$n$ of FIG. 2) and at least one string selection line (e.g., SSL of FIG. 2), which are sequentially stacked on the first mold stack MS1. The number and shape of the second mold insulating layers 115 and the second gate electrodes 117 are only examples, and the inventive concepts are not limited to the shown example.

Each of the gate electrodes 112 and 117 may include a conductive material, for example, a semiconductor material such as metal, such as tungsten (W), molybdenum (Mo), ruthenium (Ru), cobalt (Co) and nickel (Ni), or silicon, but is not limited thereto. For example, each of the gate electrodes 112 and 117 may include at least one of tungsten (W), molybdenum (Mo) or ruthenium (Ru). For another example, each of the gate electrodes 112 and 117 may include polysilicon.

In some example embodiments, each of the gate electrodes 112 and 117 may include a barrier metal layer and a filling metal layer, which are sequentially stacked. The barrier metal layer may include, for example, a metal nitride layer such as a titanium nitride layer (TiN). The filling metal layer may fill a region of the gate electrodes 112 and 117 remaining after the barrier metal layer is filled.

The mold insulating layers 110 and 115 may include at least one of, for example, silicon oxide, silicon nitride or silicon oxynitride, but is not limited thereto. For example, each of the mold insulating layers 110 and 115 may include a silicon oxide layer.

In some example embodiments, the mold stacks MS1 and MS2 on the through region THR may include a plurality of mold insulating layers 110 and 115 and a plurality of mold sacrificial layers 111 and 116, which are stacked on the cell substrate 100 and/or the insulating substrate 101. Each of the mold insulating layers 110 and 115 and each of the mold sacrificial layers 111 and 116 may have a layered structure extended parallel with an upper surface of the cell substrate 100. The mold sacrificial layers 111 and 116 may be spaced apart from each other by the mold insulating layers 110 and 115 and then may be sequentially stacked on the cell substrate 100 and/or the insulating substrate 101.

In some example embodiments, the first mold stack MS1 on the through region THR may include first mold insulating layers 110 and first mold sacrificial layers 111 alternately stacked on the cell substrate 100 and/or the insulating substrate 101, and the second mold stack MS2 on the through region THR may include second mold insulating layers 115 and second mold sacrificial layers 116 alternately stacked on the first mold stack MS1.

Each of the mold sacrificial layers 111 and 116 may include an insulating material, for example, at least one of silicon oxide, silicon nitride or silicon oxynitride, but is not limited thereto. The mold sacrificial layers 111 and 116 may include a material having an etch selectivity with respect to the mold insulating layers 110 and 115. For example, each of the mold insulating layers 110 and 115 may include a silicon oxide layer, and each of the mold sacrificial layers 111 and 116 may include a silicon nitride layer.

The interlayer insulating layers 142 and 144 may be formed on the front side of the cell substrate 100 to cover the mold stacks MS1 and MS2. In some example embodiments, the interlayer insulating layers 142 and 144 may include a first interlayer insulating layer 142 and a second interlayer insulating layer 144, which are sequentially stacked on the cell substrate 100. The first interlayer insulating layer 142 may cover the first mold stack MS1, and the second interlayer insulating layer 144 may cover the second mold stack MS2. The interlayer insulating layers 142 and 144 may include at least one of, for example, silicon oxide, silicon oxynitride or a low dielectric constant (low-k) material having a dielectric constant lower than that of silicon oxide, but is not limited thereto.

The channel structure CH may be formed on the cell array region CAR of the cell substrate 100. The channel structure CH may be extended in a vertical direction (e.g., a third direction Z) crossing the upper surface of the cell substrate 100 to pass through the mold stacks MS1 and MS2. For example, the channel structure CH may be a pillar type (e.g., cylindrical) structure extended in the third direction Z. Therefore, the channel structure CH may cross the plurality of gate electrodes 112 and 117.

In some example embodiments, a plurality of channel structures CH may be arranged in a zigzag shape. For example, as shown in FIG. 3, the plurality of channel structures CH may be alternately arranged in the first direction X and the second direction Y. The channel structures CH may further improve the degree of integration of the semiconductor memory device. The number and arrangement of the channel structures CH are only example, and are not limited to the shown example. In some other example embodiments, the plurality of channel structures CH may be arranged in a honeycomb shape.

In some example embodiments, the channel structure CH may have a step difference between the first mold stack MS1 and the second mold stack MS2. For example, as shown in FIG. 4, a side surface of the channel structure CH may be bent at a boundary between the first mold stack MS1 and the second mold stack MS2.

As shown in FIG. 5, the channel structure CH may include a blocking insulating pattern 132, a charge storage layer 133, an isolation insulating pattern 134, a tunnel insulating layer 135, a semiconductor layer 136, and a filling insulating layer 137. The blocking insulating pattern 132, the charge storage layer 133, the isolation insulating pattern 134, the tunnel insulating layer 135, the semiconductor layer 136 and the filling insulating layer 137 may be sequentially stacked in the mold stacks MS1 and MS2. In FIG. 5, only the channel structure CH in the first mold stack MS1 is shown, but the person with ordinary skill in the art would understand that the channel structure CH in the second mold stack MS2 may be also similar to that in the first mold stack MS1.

The blocking insulating pattern 132 may be formed on a side surface of each of the gate electrodes 112 and 117. The blocking insulating pattern 132 may be more protruded than a side surface of each of the mold insulating layers 110 and 115. In addition, the blocking insulating pattern 132 may be interposed between each of the gate electrodes 112 and 117 and the semiconductor layer 136. The blocking insulating pattern 132 may not be formed on the side surfaces of the mold insulating layers 110 and 115. For example, a plurality of blocking insulating patterns 132 corresponding to the plurality of gate electrodes 112 and 117 may be spaced apart from each other and arranged along the third direction Z.

The blocking insulating pattern 132 may include an oxide, such as silicon oxide (SiO) or silicon oxynitride (SiON). For example, the blocking insulating pattern 132 may include a silicon oxide layer.

In some example embodiments, a gate dielectric layer 131 may be interposed between each of the gate electrodes 112 and 117 and the blocking insulating pattern 132. The gate dielectric layer 131 may be extended along an outer surface of each of the gate electrodes 112 and 117. For example, the gate dielectric layer 131 may be extended to be conformal along a lower surface, a side surface and an upper surface of each of the gate electrodes 112 and 117. In some other example embodiments, the gate dielectric layer 131 may be omitted. In a case where the gate dielectric layer 131 is omitted, the gate electrodes 112 and 117 may fill a region of the gate dielectric layer 131 that is shown.

The gate dielectric layer 131 may include at least one of, for example, silicon oxide, silicon nitride, silicon oxynitride or a high dielectric constant material having a dielectric constant greater than that of silicon oxide. The high dielectric constant material may include at least one of aluminum oxide, hafnium oxide, lanthanum oxide, tantalum oxide, titanium oxide, lanthanum hafnium oxide, lanthanum aluminum oxide, dysprosium scandium oxide or their combination. For example, the gate dielectric layer 131 may include an aluminum oxide layer.

The charge storage layer 133 may be formed on the side surfaces of the mold insulating layers 110 and 115 and on the blocking insulating pattern 132. The charge storage layer 133 may be extended along each of the mold insulating layers 110 and 115 and the blocking insulating pattern 132. As the blocking insulating pattern 132 is more protruded than the side surface of each of the mold insulating layers 110 and 115, the charge storage layer 133 may be extended in the form of a snake having an uneven cross-section. In addition, the charge storage layer 133 may be interposed between each of the mold insulating layers 110 and 115 and the semiconductor layer 136 and between the blocking insulating pattern 132 and the semiconductor layer 136. Charges passing through the tunnel insulating layer 135 from the semiconductor layer 136 may be stored in the charge storage layer 133. The charges stored in the charge storage layer 133 may be changed by, for example, Fowler-Nordheim tunneling caused by a voltage difference between the semiconductor layer 136 and the gate electrodes 112 and 117.

The charge storage layer 133 may include a charge trap portion 1331 and a first charge blocking portion 1332. The charge trap portion 1331 may be a portion of the charge storage layer 133 conformally extended along a side surface of the blocking insulating pattern 132, and the first charge blocking portion 1332 may be a portion of the charge storage layer 133 conformally extended along the side surface of each of the mold insulating layers 110 and 115. In addition, the charge trap portion 1331 may be interposed between the blocking insulating pattern 132 and the semiconductor layer 136, and the first charge blocking portion 1332 may be interposed between each of the mold insulating layers 110 and 115 and the semiconductor layer 136. As the gate electrodes 112 and 117 and the mold insulating layers 110 and 115 are alternately stacked in the third direction Z, the charge trap portion 1331 and the first charge blocking portion 1332 may be alternately arranged in the third direction Z.

For example, the first mold stack MS1 may include a first insulating pattern 110a, a first electrode pattern WLa, a second insulating pattern 110b and a second electrode pattern WLb, which are sequentially stacked on the cell substrate 100. The charge trap portion 1331 may include a first trap portion 1331a on a side surface of the first electrode pattern WLa and a second trap portion 1331b on a side surface of the second electrode pattern WLb. The first charge blocking portion 1332 may include a first blocking portion 1332a on a side surface of the first insulating pattern 110a and a second blocking portion 1332b on a side surface of the second insulating pattern 110b. The first blocking portion 1332a, the first trap portion 1331a, the second blocking portion 1332b and the second trap portion 1331b may be sequentially arranged along the third direction Z.

In some example embodiments, the charge trap portion 1331 and the first charge blocking portion 1332 may be connected to each other to form a series of charge storage layers 133 having a cross section extended in a snake shape. For example, the first trap portion 1331a may connect the first blocking portion 1332a with the second blocking portion 1332b, and the second blocking portion 1332b may connect the first trap portion 1331a with the second trap portion 1331b.

In some example embodiments, a portion of the first charge blocking portion 1332 may further extend along a lower surface or an upper surface of the blocking insulating pattern 132. For example, the second blocking portion 1332b may be conformally extended along the side surface of the second insulating pattern 110b, the upper surface of the blocking insulating pattern 132 on the side surface of the first electrode pattern WLa, and the lower surface of the blocking insulating pattern 132 on the side surface of the second electrode pattern WLb.

In some example embodiments, each of the mold insulating layers 110 and 115 may include a recess 110r concave toward the semiconductor layer 136. The first charge blocking portion 1332 may be extended conformally along the recess 110r of each of the mold insulating layers 110 and 115.

In some example embodiments, the blocking insulating pattern 132 may include a convex surface 132c convex toward the semiconductor layer 136. The charge trap portion 1331 may be conformally extended along the convex surface 132c of the blocking insulating pattern 132.

The first charge blocking portion 1332 may be formed by at least partially oxidizing a material included in the charge trap portion 1331. That is, an oxygen concentration of the first charge blocking portion 1332 may be greater than that of the charge trap portion 1331. For example, the charge trap portion 1331 may include a silicon nitride layer, and the first charge blocking portion 1332 may include a silicon oxynitride layer formed by partially oxidizing the silicon nitride layer.

Therefore, a conduction band of the first charge blocking portion 1332 may have an energy level higher than that of the charge trap portion 1331. For example, as shown in FIG. 6, a first energy barrier E1 may be formed between the conduction band of the first charge blocking portion 1332 and the conduction band of the charge trap portion 1331. The first charge blocking portion 1332 may effectively prevent or reduce in likelihood the charges trapped in the charge trap portion 1331 from being lost by forming the first energy barrier E1.

In some example embodiments, a thickness T2 of the first charge blocking portion 1332 may be greater than a thickness T1 of the charge trap portion 1331. This may be due to the fact that the degree of oxidation of the first charge blocking portion 1332 is greater than the degree of oxidation of the charge trap portion 1331.

The isolation insulating pattern 134 may be formed on a side surface of the first charge blocking portion 1332. In addition, the isolation insulating pattern 134 may be spaced apart from the blocking insulating pattern 132 by the charge storage layer 133. The isolation insulating pattern 134 may not be formed on a side surface of the charge trap portion 1331. For example, a plurality of isolation insulating patterns 134 corresponding to a plurality of first charge blocking portions 1332 may be spaced apart from each other and arranged along the third direction Z. In some example embodiments, the blocking insulating pattern 132 and the isolation insulating pattern 134 may be alternately arranged in the third direction Z.

The isolation insulating pattern 134 may include, for example, silicon oxide (SiO) or silicon oxynitride (SiON), but is not limited thereto. For example, the isolation insulating pattern 134 may include a silicon oxide layer.

The tunnel insulating layer 135 may be formed on a side surface of the charge storage layer 133. For example, the tunnel insulating layer 135 may be extended conformally along the charge trap portion 1331 and the isolation insulating pattern 134. In addition, the tunnel insulating layer 135 may be interposed between the charge storage layer 133 and the semiconductor layer 136. For example, the tunnel insulating layer 135 may be interposed between the charge trap portion 1331 and the semiconductor layer 136 and between the isolation insulating pattern 134 and the semiconductor layer 136.

The tunnel insulating layer 135 may include, for example, silicon oxide (SiO) or silicon oxynitride (SiON), but is not limited thereto. Alternatively, the tunnel insulating layer 135 may be formed of a double layer of a silicon oxide layer and a silicon nitride layer. For example, the tunnel insulating layer 135 may include a silicon oxide layer.

In some example embodiments, the isolation insulating pattern 134 may include a concave surface 134c concave toward the semiconductor layer 136. The tunnel insulating layer 135 may be extended conformally along the concave surface 134c of the isolation insulating pattern 134.

The semiconductor layer 136 may be formed on a side surface of the tunnel insulating layer 135. For example, the semiconductor layer 136 may be extended conformally along the tunnel insulating layer 135. Although the semiconductor layer 136 is shown as having only a cup shape, this is only example. For example, the semiconductor layer 136 may have various shapes such as a cylindrical shape, a quadrangular barrel shape and a filled pillar shape. The semiconductor layer 136 may include, for example, a semiconductor material such as monocrystalline silicon, polycrystalline silicon, an organic semiconductor material and a carbon nanostructure, but is not limited thereto. For example, the semiconductor layer 136 may include a polysilicon layer.

In some example embodiments, the channel structure CH may further include a filling insulating layer 137. The filling insulating layer 137 may be formed to fill the inside of the cup-shaped semiconductor layer 136. The filling insulating layer 137 may include an insulating material, for example, silicon oxide, but is not limited thereto.

In some example embodiments, the channel structure CH may further include a channel pad 139. The channel pad 139 may be formed to be connected to an upper portion of the semiconductor layer 136. The channel pad 139 may include, for example, polysilicon doped with impurities, but is not limited thereto.

In some example embodiments, a dummy channel structure DCH may be formed on the extended region EXT of the cell substrate 100. The dummy channel structure DCH may be extended in the third direction Z to pass through the mold stacks MS1 and MS2.

The dummy channel structure DCH may be formed at the same level as that of the channel structure CH, or may be formed at a level different from that of the channel structure CH. For example, when the dummy channel structure DCH is formed at the same level as that of the channel structure CH, the dummy channel structure DCH may include the blocking insulating pattern 132, the charge storage layer 133, the isolation insulating pattern 134, the tunnel insulating layer 135, the semiconductor layer 136 and the filling insulating layer 137. For another example, when the dummy channel structure DCH is formed at a level different from that of the channel structure CH, the dummy channel structure DCH may be filled with an insulating material or a conductive material. In some example embodiments, a size of the dummy channel structure DCH may be greater than that of the channel structure CH.

The source layer 102 may be formed on the cell substrate 100. The source layer 102 may be interposed between the cell substrate 100 and the mold stacks MS1 and MS2. For example, the source layer 102 may be extended conformally along the upper surface of the cell substrate 100. In some example embodiments, the source layer 102 may be formed on the cell array region CAR, and may not be formed on the extended region EXT.

The source layer 102 may be connected with the semiconductor layer 136 of each of the channel structures CH. For example, as shown in FIG. 7, the source layer 102 may be in contact with a side surface of the semiconductor layer 136 by passing through the blocking insulating pattern 132, the charge storage layer 133, and the tunnel insulating layer 135. The source layer 102 may be provided as a common source line (e.g., CSL of FIG. 2) of the semiconductor memory device. The source layer 102 may include a conductive material, for example, polysilicon doped with impurities or metal, but is not limited thereto.

In some example embodiments, a portion of the source layer 102 adjacent to the semiconductor layer 136 may be protruded toward the blocking insulating pattern 132, the charge storage layer 133, and the tunnel insulating layer 135. For example, in a region adjacent to the semiconductor layer 136, a length in which the source layer 102 is extended in the third direction Z may be longer than another portion of the source layer 102. Therefore, the source layer 102 may be in contact with the semiconductor layer 136 in a wider area.

In some example embodiments, the channel structure CH may pass through the source layer 102. For example, a lower portion of the channel structure CH may be disposed in the cell substrate 100 below the source layer 102. In some other example embodiments, unlike the shown example, the channel structure CH may not pass through the source layer 102.

Although not shown, a base insulating layer may be interposed between the cell substrate 100 and the source layer 102. The base insulating layer may include at least one of, for example, silicon oxide, silicon nitride, or silicon oxynitride, but is not limited thereto.

In some example embodiments, the cell substrate 100 may include a conductive layer (not shown). The conductive layer may include, for example, polysilicon doped with impurities, metal or metal silicide. The conductive layer may be formed of multiple layers. For example, the cell substrate 100 may include a first conductive layer including metal silicide such as tungsten silicide (WSi), and a second conductive layer stacked on the first conductive layer, including doped polysilicon. Each of the source layer 102 and the conductive layer may be provided as the common source line (e.g., CSL of FIG. 2) of the semiconductor memory device.

The source sacrificial layer 103 may be formed on the extended region EXT of the cell substrate 100. The source sacrificial layer 103 may be interposed between the cell substrate 100 and the mold stacks MS1 and MS2. For example, the source sacrificial layer 103 may be extended conformally along the upper surface of the cell substrate 100. In some example embodiments, the source sacrificial layer 103 may be formed on the extended region EXT, and may not be formed on the cell array region CAR.

The source sacrificial layer 103 may be disposed at the same level as that of the source layer 102. In the present disclosure, the expression "disposed at the same level" refers to "disposed at the same height based on the upper surface of the cell substrate 100". For example, a lower surface of the source sacrificial layer 103 may be disposed at the same height as that of the lower surface of the source layer 102.

In some example embodiments, the source layer 102 and/or the source sacrificial layer 103 may not be formed on the insulating substrate 101. Although the upper surface of the insulating substrate 101 is shown as being disposed on an upper surface and a coplanar surface of the support layer 104, this is only example. As another example, the upper surface of the insulating substrate 101 may be formed to be higher than the upper surface of the support layer 104.

The source sacrificial layer 103 may be a layer remaining after being partially replaced with the source layer 102. In this case, a thickness of the source layer 102 may be the same as that of the source sacrificial layer 103. In the present disclosure, the term "same" includes not only completely identical but also a fine difference that may occur due to a process margin or the like. For example, an upper surface of the source sacrificial layer 103 may be disposed at the same height as that of an upper surface of the source layer 102.

The source sacrificial layer 103 may include an insulating material, for example, at least one of silicon oxide, silicon nitride or silicon oxynitride, but is not limited thereto. In some example embodiments, the source sacrificial layer 103 may include a material having an etch selectivity with respect to the mold insulating layers 110 and 115. For example, each of the mold insulating layers 110 and 115 may include a silicon oxide layer, and the source sacrificial layer 103 may include a silicon nitride layer.

The support layer 104 may be formed on the cell substrate 100, the source layer 102, and the source sacrificial layer 103. The support layer 104 may be interposed between the source layer 102 and the mold stacks MS1 and MS2 and between the source sacrificial layer 103 and the mold stacks MS1 and MS2. For example, the support layer 104 may be extended conformally along the upper surface of the cell substrate 100, the upper surface of the source layer 102 and the upper surface of the source sacrificial layer 103.

The support layer 104 may include a material having an etch selectivity with respect to the source sacrificial layer 103. For example, the source sacrificial layer 103 may include a silicon nitride layer, and the support layer 104 may include a polysilicon layer.

The support layer 104 may be used as a support for preventing or reducing in likelihood collapse or falling of the mold stack in a replacement process for forming the source layer 102. For example, the source layer 102 and/or the source sacrificial layer 103 may expose a portion of the upper surface of the cell substrate 100, and a portion of the support layer 104 may be extended along the exposed upper surface of the exposed cell substrate 100 to contact the upper surface of the cell substrate 100.

The word line cutting region WC may be extended in the first direction X to cut the mold stacks MS1 and MS2. In addition, a plurality of word line cutting regions WC may be spaced apart from each other and extended in parallel in the first direction X. The mold stacks MS1 and MS2 may be divided by the word line cutting regions WC to form a plurality of memory cell blocks (e.g., BLK1 to BLKn of FIG. 1). For example, two adjacent word line cutting regions WC may define one memory cell block therebetween. A plurality of channel structures CH may be disposed in each of the memory cell blocks defined by the word line cutting regions WC.

In some example embodiments, the word line cutting region WC may be extended in the first direction X to cut the source layer 102 and the support layer 104. Although a lower surface of the word line cutting region WC is shown as being only disposed on the lower surface and the coplanar surface of the source layer 102, this is only example. As another example, the lower surface of the word line cutting region WC may be lower than the upper surface of the cell substrate 100.

In some example embodiments, the word line cutting region WC may include an insulating material. For example, the word line cutting region WC may include at least one of silicon oxide, silicon nitride or silicon oxynitride, but is not limited thereto.

In some example embodiments, a string isolation pattern SC may be formed in the second mold stack MS2. The string isolation pattern SC may be extended in the first direction X to cut the string selection line (SSL of FIG. 2; e.g., a gate electrode disposed at the uppermost portion of the second gate electrodes 117). Each of the memory cell blocks defined by the word line cutting regions WC may be divided by the string isolation pattern SC to form a plurality of string regions. For example, the string isolation pattern SC may define two string regions in one memory cell block. The string isolation pattern SC may include an insulating material, for example, at least one of silicon oxide, silicon nitride or silicon oxynitride, but is not limited thereto.

The gate contact 162 may be connected to each of the gate electrodes 112 and 117. For example, the gate electrodes 112 and 117 may be stacked on the extended region EXT in a stepwise shape. A plurality of gate contacts 162 may be extended in the third direction Z to pass through the interlayer insulating layers 142 and 144, and may be connected to corresponding gate electrodes 112 and 117 on the extended region EXT.

The substrate contact 164 may be connected to the cell substrate 100. For example, the substrate contact 164 may be extended in the third direction Z to pass through the interlayer dielectric layers 142 and 144, and may be connected to the cell substrate 100 on the extended region EXT. In some example embodiments, the mold stacks MS1 and MS2 may expose a portion of the upper surface of the support layer 104. The substrate contact 164 may be connected to the cell substrate 100 by passing through the support layer 104 and the source sacrificial layer 103.

The cell wiring structure 180 may be formed on the mold stacks MS1 and MS2. For example, a first inter-wiring insulating layer 146 may be formed on the second interlayer insulating layer 144, and the cell wiring structure 180 may be formed in the first inter-wiring insulating layer 146. The cell wiring structure 180 may be electrically connected to the cell substrate 100, the plurality of channel structures CH, and/or the plurality of gate electrodes 112 and 117. The number and arrangement of the shown cell wiring structures 180 are only example, and are not limited thereto.

For example, the cell wiring structure 180 may include a plurality of first conductive lines 182 formed on the mold stacks MS1 and MS2. Each of the first conductive lines 182 may be extended in the second direction Y and then connected to the plurality of channel structures CH arranged along the second direction Y. The first conductive lines 182 may be provided as the bit lines (e.g., BL of FIG. 2) of the semiconductor memory device. For example, a bit line contact 185 connected to the channel pad 139 may be formed in the second interlayer insulating layer 144. Each of the first conductive lines 182 may be electrically connected to the channel structures CH through the bit line contact 185.

In addition, for example, the cell wiring structure 180 may include a plurality of second conductive lines 184 formed on the mold stacks MS1 and MS2. The second conductive lines 184 may be connected to the gate contacts 162 and/or the substrate contacts 164. The second conductive lines 184 may be electrically connected to the gate electrodes 112 and 117 through the gate contacts 162, and may be electrically connected to the cell substrate 100 through the substrate contact 164.

The peripheral circuit structure PERI may include a peripheral circuit board 200, a peripheral circuit element PT, and a peripheral circuit wiring structure 260.

The peripheral circuit board 200 may include, for example, a semiconductor substrate such as a silicon substrate, a germanium substrate, or a silicon-germanium substrate. Alternatively, the peripheral circuit board 200 may include a silicon-on-insulator (SOI) substrate or a germanium-on-insulator (GOI) substrate.

The peripheral circuit element PT may be formed on the peripheral circuit board 200. The peripheral circuit element PT may constitute the peripheral circuit (e.g., 30 of FIG. 1)

that controls the operation of the semiconductor memory device. For example, the peripheral circuit element PT may include a control logic (e.g., 37 of FIG. 1), a row decoder (e.g., 33 of FIG. 1), and a page buffer (e.g., 35 of FIG. 1). In the following description, a surface of the peripheral circuit board 200 on which the peripheral circuit element PT is disposed may be referred to as a front side of the peripheral circuit board 200. On the contrary, a surface of the peripheral circuit board 200, which is opposite to the front side of the peripheral circuit board 200, may be referred to as a back side of the peripheral circuit board 200.

The peripheral circuit element PT may include, for example, a transistor, but is not limited thereto. For example, the peripheral circuit element PT may include various passive elements such as a capacitor, a resistor and an inductor as well as various active elements such as a transistor.

The peripheral circuit wiring structure 260 may be formed on the peripheral circuit element PT. For example, a second inter-wiring insulating layer 240 may be formed on the front side of the peripheral circuit board 200, and the peripheral circuit wiring structure 260 may be formed in the second inter-wiring insulating layer 240. The peripheral circuit wiring structure 260 may be electrically connected to the peripheral circuit element PT. The number and arrangement of the shown peripheral circuit wiring structures 260 are only example, and are not limited thereto.

In some example embodiments, the memory cell structure CELL may be stacked on the peripheral circuit structure PERI. For example, the memory cell structure CELL may be stacked on the second inter-wiring insulating layer 240.

In some example embodiments, the back side of the cell substrate 100 may face the front side of the peripheral circuit board 200. For example, the cell substrate 100 and/or the insulating substrate 101 may be stacked on the upper surface of the second inter-wiring insulating layer 240.

In some example embodiments, the through via 166 connecting the cell wiring structure 180 with the peripheral circuit wiring structure 260 may be formed. The through via 166 may be formed on the through region THR. The through via 166 may be extended in the third direction Z to pass through the mold stacks MS1 and MS2 on the through region THR. The cell wiring structure 180 may be electrically connected to the peripheral circuit wiring structure 260 through the through via 166. Therefore, the cell substrate 100, the plurality of channel structures CH, and/or the plurality of gate electrodes 112 and 117 may be electrically connected to the peripheral circuit element PT.

In the semiconductor memory device including memory cells arranged in three dimensions, when the charge storage layer continuously is extended between the memory cells arranged in the vertical direction, a problem occurs in that charges are lost in a direction (i.e., the vertical direction) in which the charge storage layer is extended. This causes coupling between the memory cells adjacent to each other in the vertical direction to lower reliability of the semiconductor memory device.

However, the semiconductor memory device according to some example embodiments may prevent or reduce in likelihood the charges from being lost in the vertical direction by using the charge storage layer 133 that is chemically cut between the memory cells arranged in the vertical direction. In detail, as described above, the charge storage layer 133 may include a charge trap portion 1331 interposed between each of the gate electrodes 112 and 117 and the semiconductor layer 136, and a first charge blocking portion 1332 interposed between each of the mold insulating layers 110 and 115 and the semiconductor layer 136. In addition, as the first charge blocking portion 1332 is formed by at least partially oxidizing a material included in the charge trap portion 1331, the energy barrier (e.g., E1 of FIG. 6) may be formed between the conduction band of the first charge blocking portion 1332 and the conduction band of the charge trap portion 1331. Therefore, coupling between the memory cells adjacent to each other in the vertical direction may be effectively prevented or reduced in likelihood from occurring, whereby the semiconductor memory device with improved reliability may be provided.

FIGS. 8A to 8E are various other enlarged views illustrating the region R2 of FIG. 4. FIG. 9 is an energy band diagram illustrating a charge storage layer of FIG. 8E. For convenience of description, portions duplicated with those described with reference to FIGS. 1 to 7 will be briefly described or omitted.

Figure 8A:
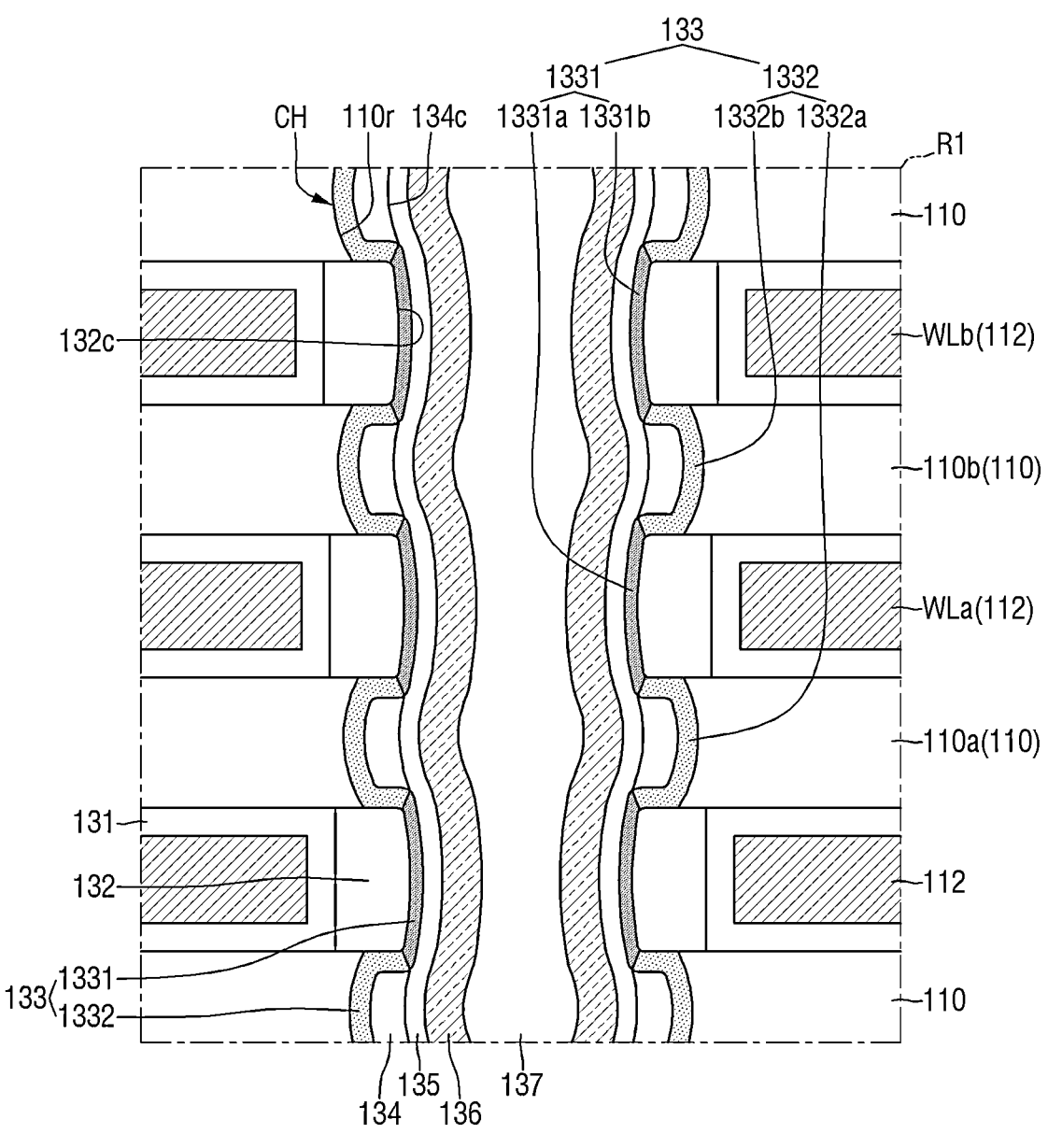
FIGS. 8A to 8E are various other enlarged views illustrating the region R2 of FIG. 4.
Figure 9:
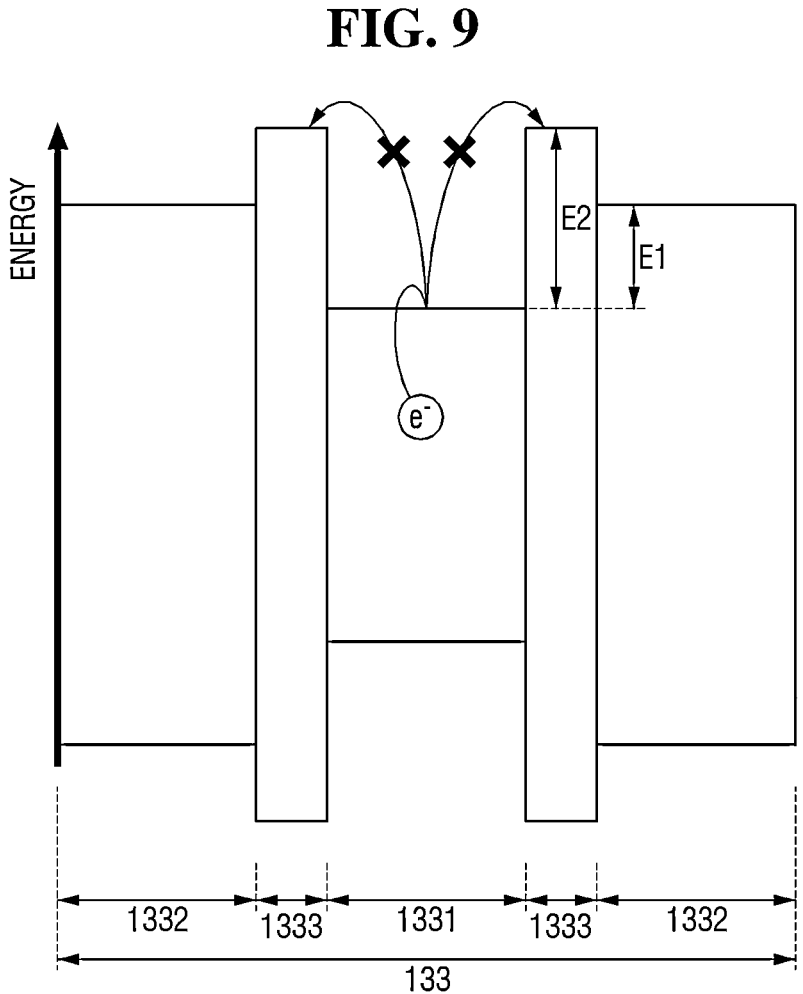
FIG. 9 is an energy band diagram illustrating a charge storage layer of FIG. 8D.

Referring to FIG. 8A, in the semiconductor memory device according to some example embodiments, the mold insulating layers 110 and 115 are more protruded toward the semiconductor layer 136 than the gate dielectric layer 131.

In this case, a portion of the blocking insulating pattern 132 may be in contact with the mold insulating layers 110 and 115 adjacent thereto. For example, a portion of the blocking insulating pattern 132 adjacent to the first electrode pattern WLa may be in contact with the upper surface of the first insulating pattern 110a and the lower surface of the second insulating pattern 110b. When the gate dielectric layer 131 is omitted, the mold insulating layers 110 and 115 may be protruded toward the semiconductor layer 136 than the gate electrodes 112 and 117.

Figure 8B:
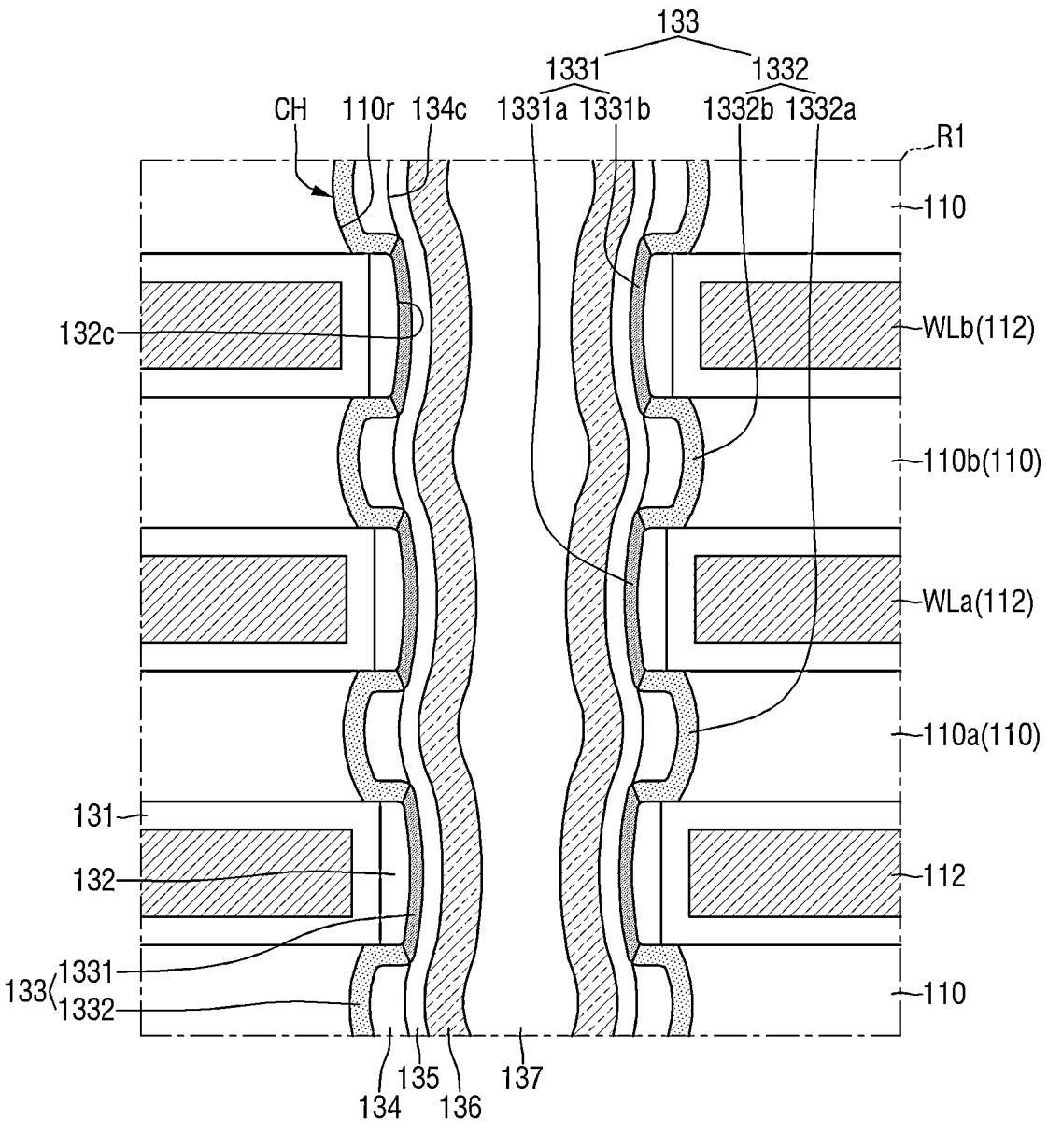

Referring to FIG. 8B, in the semiconductor memory device according to some example embodiments, the gate dielectric layer 131 may protrude toward the semiconductor layer 136 more than the mold insulating layers 110 and 115.

In this case, a portion of the gate dielectric layer 131 may be in contact with the charge storage layer 133 adjacent thereto. For example, a portion of the gate dielectric layer 131 surrounding the first electrode pattern WLa may be in contact with an upper portion of the first blocking portion 1332a and a lower portion of the second blocking portion 1332b. When the gate dielectric layer 131 is omitted, the gate electrodes 112 and 117 may be more protruded toward the semiconductor layer 136 than the mold insulating layers 110 and 115.

Figure 8C:
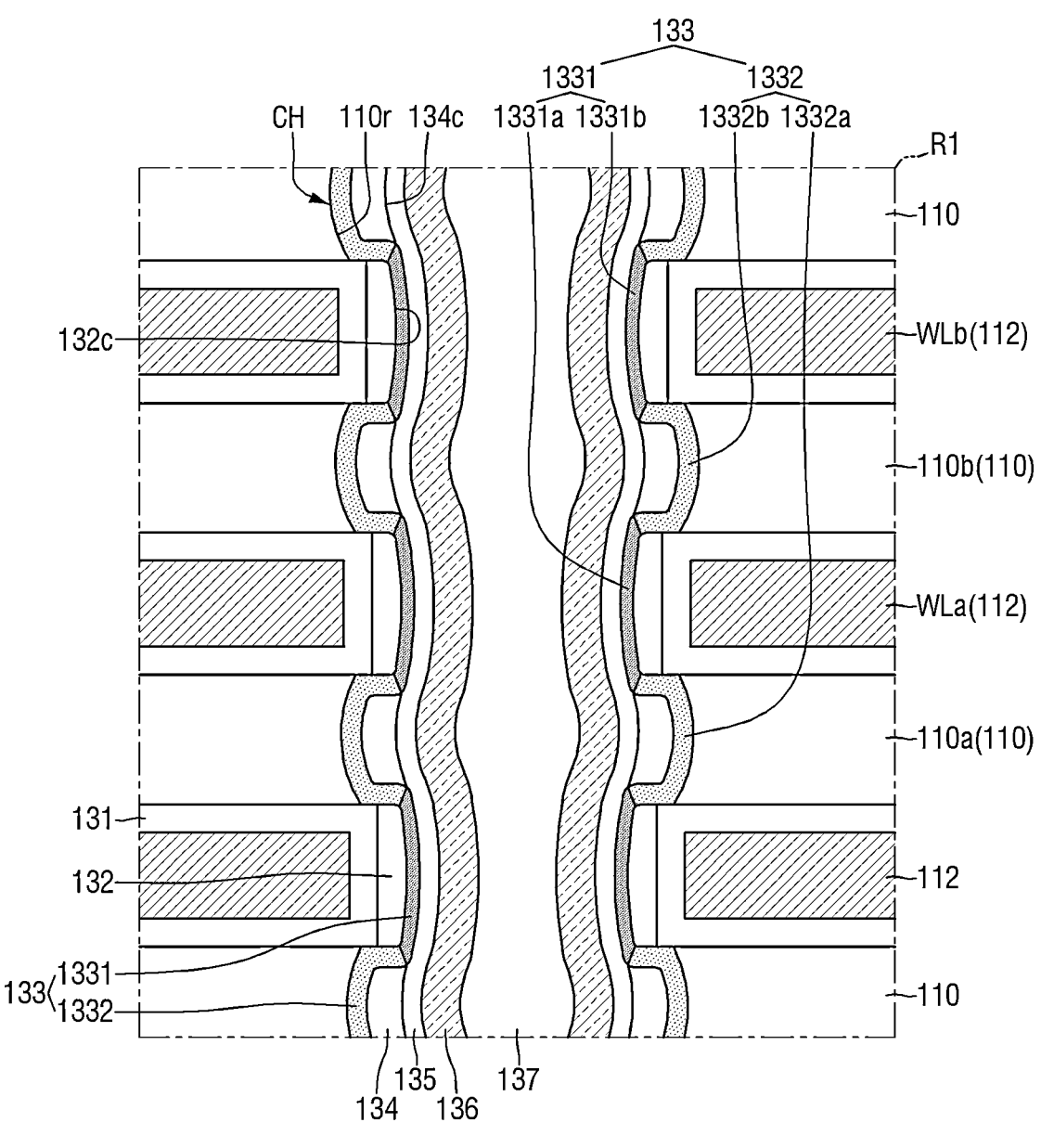

Referring to FIG. 8C, in the semiconductor memory device according to some example embodiments, a portion of the charge trap portion 1331 is further extended along the lower surface and/or the upper surface of the blocking insulating pattern 132.

For example, each of the first trap portion 1331a and the second trap portion 1331b may be conformally extended along the side of the blocking insulating pattern 132, at least a portion of the lower surface of the blocking insulating pattern 132, and at least a portion of the upper surface of the blocking insulating pattern 132. In some example embodiments, the isolation insulating pattern 134 may cover or contact a portion of the charge trap portion 1331.

Figure 8D:
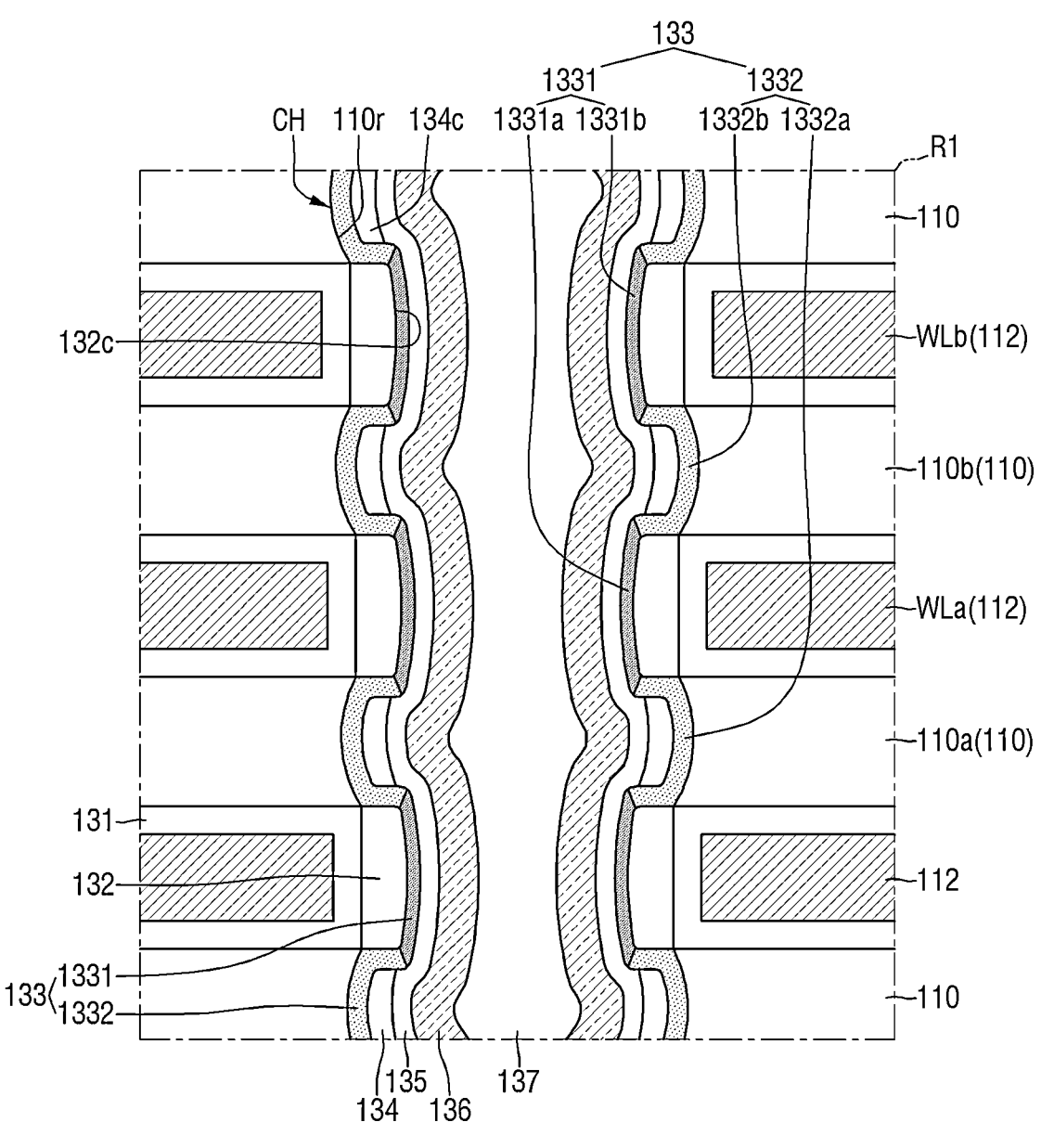

Referring to FIG. 8D, in the semiconductor memory device according to some example embodiments, the isolation insulating pattern 134 may expose a portion of the first charge blocking portion 1332.

For example, the isolation insulating pattern 134 on the second blocking portion 1332b may expose the lower portion of the second blocking portion 1332b adjacent to the first trap portion 1331a and the upper portion of the second blocking portion 1332b adjacent to the second trap portion 1331b.

Figure 8E:
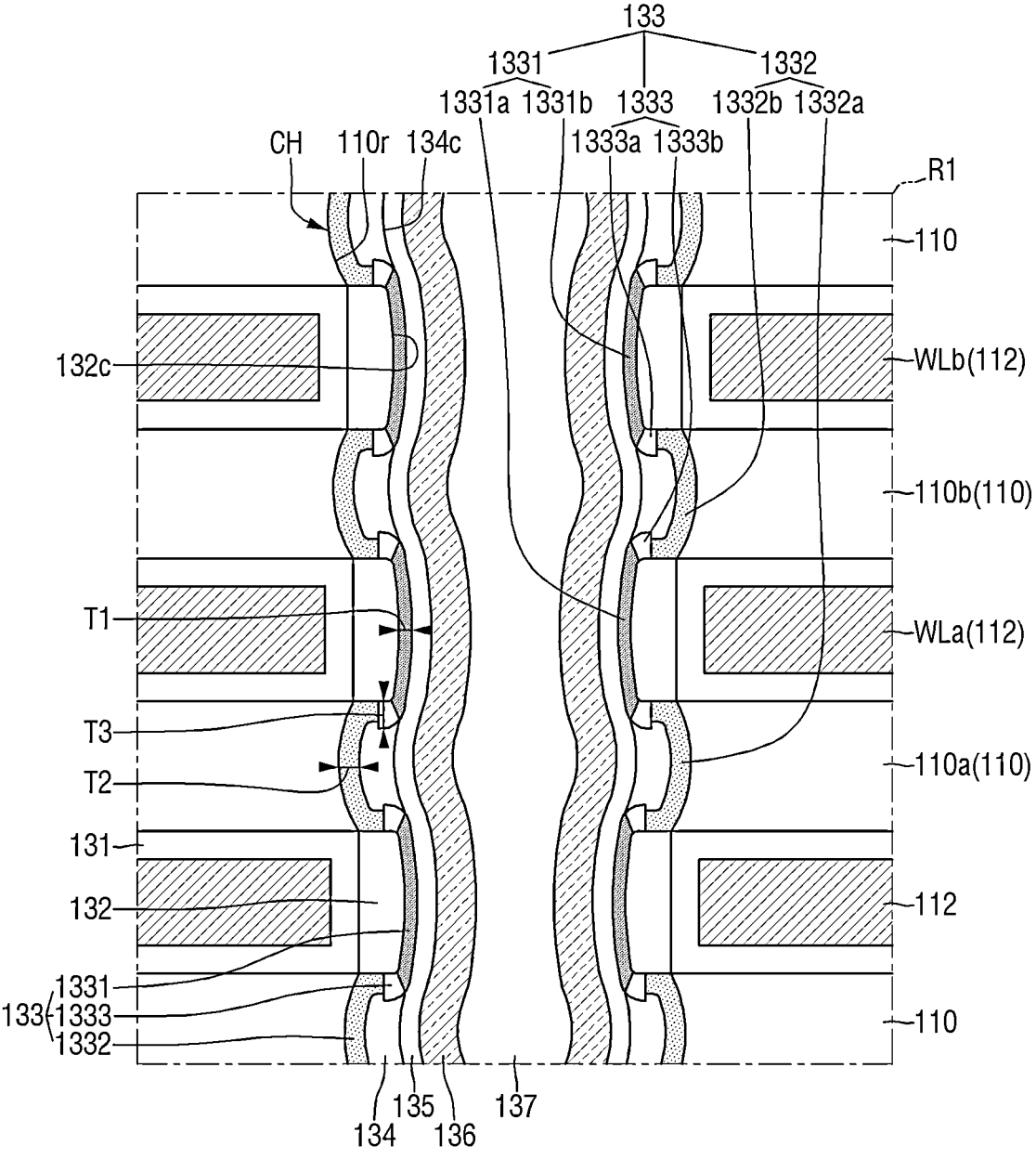

Referring to FIGS. 8E and 9, in the semiconductor memory device according to some example embodiments, the charge storage layer 133 further includes a second charge blocking portion 1333.

The second charge blocking portion 1333 may be interposed between the charge trap portion 1331 and the first charge blocking portion 1332. The second charge blocking portion 1333 may be extended along a portion of the blocking insulating pattern 132. For example, the second charge blocking portion 1333 may include a third blocking portion 1333*a* interposed between the first trap portion 1331*a* and the second blocking portion 1332*b*, and a fourth blocking portion 1333*b* interposed between the second trap portion 1331*b* and the second blocking portion 1332*b*. The first trap portion 1331*a*, the third blocking portion 1333*a*, the second blocking portion 1332*b*, the fourth blocking portion 1333*b* and the second trap portion 1331*b* may be sequentially arranged along the third direction Z.

In some example embodiments, the charge trap portion 1331, the first charge blocking portion 1332, and the second charge blocking portion 1333 may be connected to one another to form a series of charge storage layers 133 having a cross section extended in a snake shape. For example, the third blocking portion 1333*a* may connect the second trap portion 1331*b* with the second blocking portion 1332*b*, and the fourth blocking portion 1333*b* may connect the second blocking portion 1332*b* with the first trap portion 1331*a*.

The second charge blocking portion 1333 may be formed by at least partially oxidizing a material included in the charge trap portion 1331. In addition, the degree of oxidation of the second charge blocking portion 1333 may be greater than the degree of oxidation of the first charge blocking portion 1332. That is, an oxygen concentration of the second charge blocking portion 1333 may be greater than that of the first charge blocking portion 1332. For example, the charge trap portion 1331 may include a silicon nitride layer, the first charge blocking portion 1332 may include a silicon oxynitride layer formed by partially oxidizing the silicon nitride layer, and the second charge blocking portion 1333 may include a silicon oxide layer formed by completely oxidizing the silicon nitride layer.

Therefore, a conduction band of the second charge blocking portion 1333 may have an energy level higher than the conduction band of the charge trap portion 1331 and the conduction band of the first charge blocking portion 1332. For example, as shown in FIG. 9, a second energy barrier E2 greater than the first energy barrier E1 may be formed between the conduction band of the second charge blocking portion 1333 and the conduction band of the charge trap portion 1331. The second charge blocking portion 1333 may effectively prevent or reduce in likelihood the charges trapped in the charge trap portion 1331 from being lost by forming the second energy barrier E2.

In some example embodiments, a thickness T3 of the second charge blocking portion 1333 may be greater than the thickness T1 of the charge trap portion 1331 and the thickness T2 of the first charge blocking portion 1332. This may be due to the fact that the degree of oxidation of the second charge blocking portion 1333 is greater than the degree of oxidation of the first charge blocking portion 1332.

Therefore, coupling between adjacent memory cells in the vertical direction may be more effectively prevented or reduced in likelihood from occurring, whereby the semiconductor memory device having more improved reliability may be provided.

Figure 10:
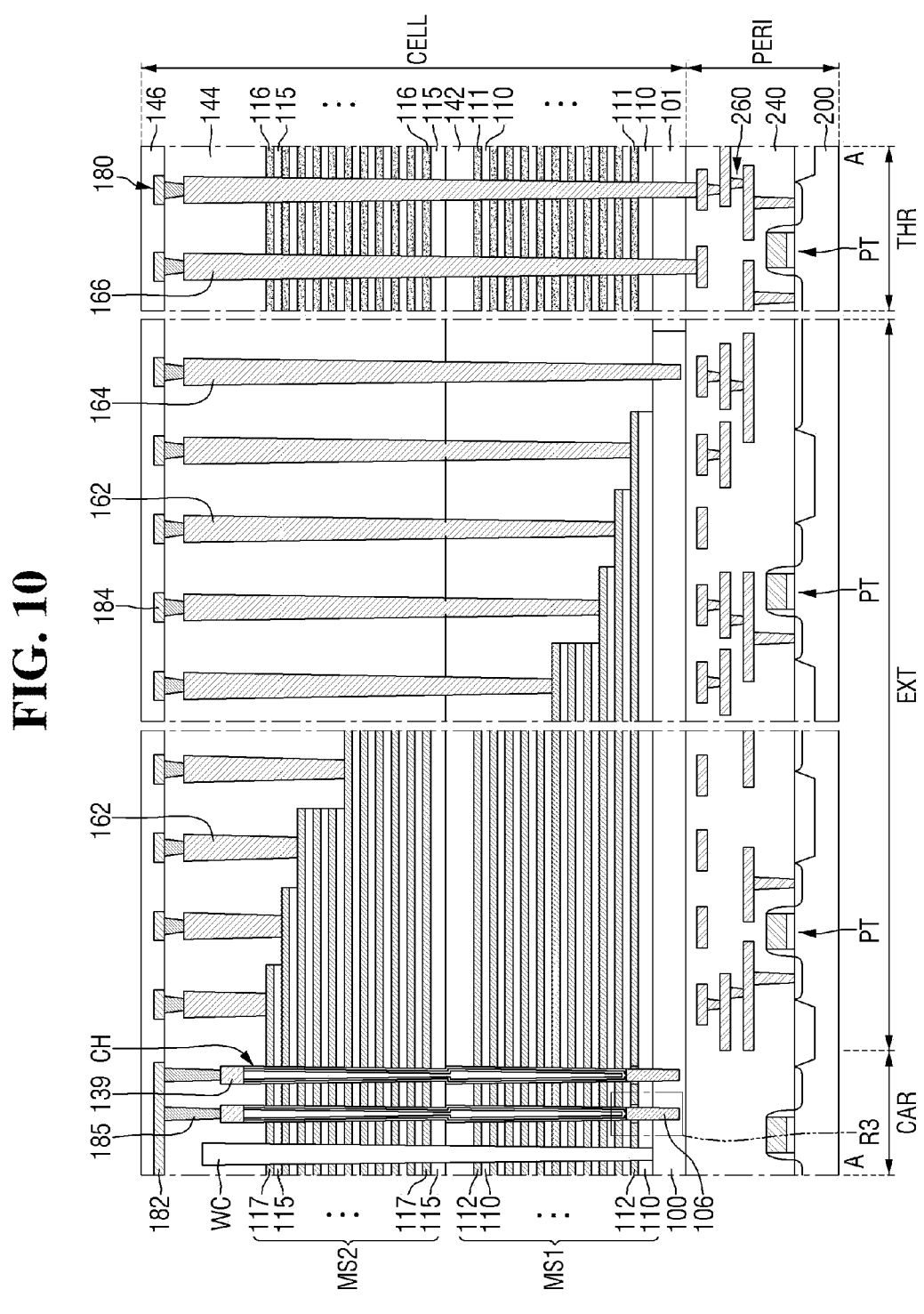
FIG. 10 is a cross-sectional view illustrating a semiconductor memory device according to some example embodiments.
Figure 11:
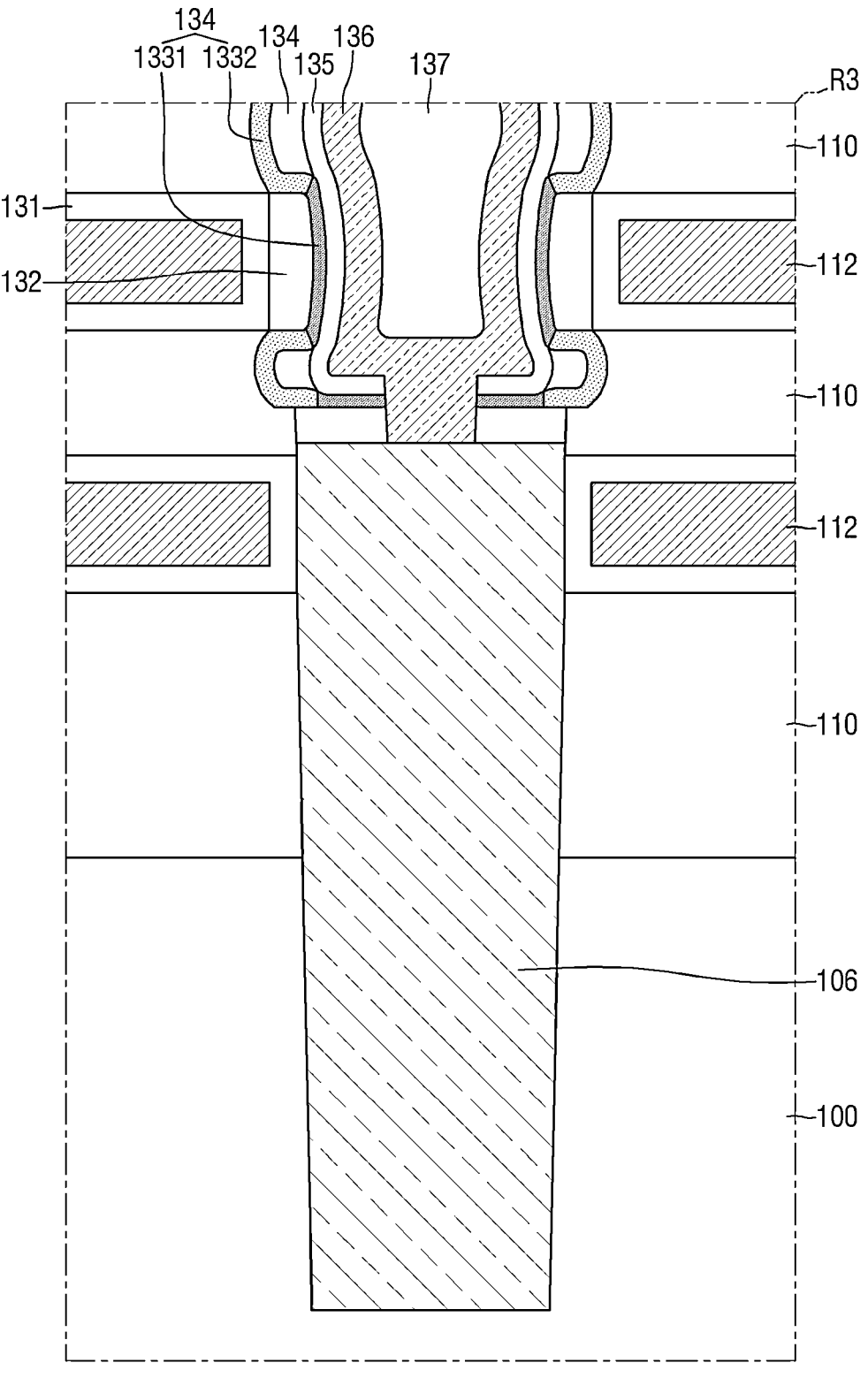
FIG. 11 is an enlarged view illustrating a region R3 of FIG. 10.

FIG. 10 is a cross-sectional view illustrating a semiconductor memory device according to some example embodiments. FIG. 11 is an enlarged view illustrating a region R3 of FIG. 10. For convenience of description, portions duplicated with those described with reference to FIGS. 1 to 8*e* will be briefly described or omitted.

Referring to FIGS. 10 and 11, the semiconductor memory device according to some example embodiments includes a source pattern 106.

The source pattern 106 may be formed on the cell substrate 100. The source pattern 106 may be connected to the semiconductor layer 136 of the channel structure CH. For example, as shown in FIG. 11, the semiconductor layer 136 may be in contact with the upper surface of the source pattern 106 by passing through the blocking insulating pattern 132, the charge storage layer 133 and the tunnel insulating layer 135. The source pattern 106 and the cell substrate 100 may be provided as a common source line (e.g., CSL of FIG. 2) of the semiconductor memory device. The source pattern 106 may include a conductive material, for example, polysilicon doped with impurities or metal, but is not limited thereto. In some example embodiments, the source pattern 106 may be formed from the cell substrate 100 by a selective epitaxial growth process.

The lower portion of the source pattern 106 is shown as being only embedded in the cell substrate 100, but this is only example. As another example, the lower surface of the source pattern 106 may be disposed on the upper surface and the coplanar surface of the cell substrate 100.

In some example embodiments, the source pattern 106 may cross a portion of the gate electrodes 112 and 117. For example, the upper surface of the source pattern 106 may be formed to be higher than the upper surface of the erase control line (ECL of FIG. 2; for example, the gate electrode disposed at the lowermost portion of the first gate electrodes 112).

Figure 12:
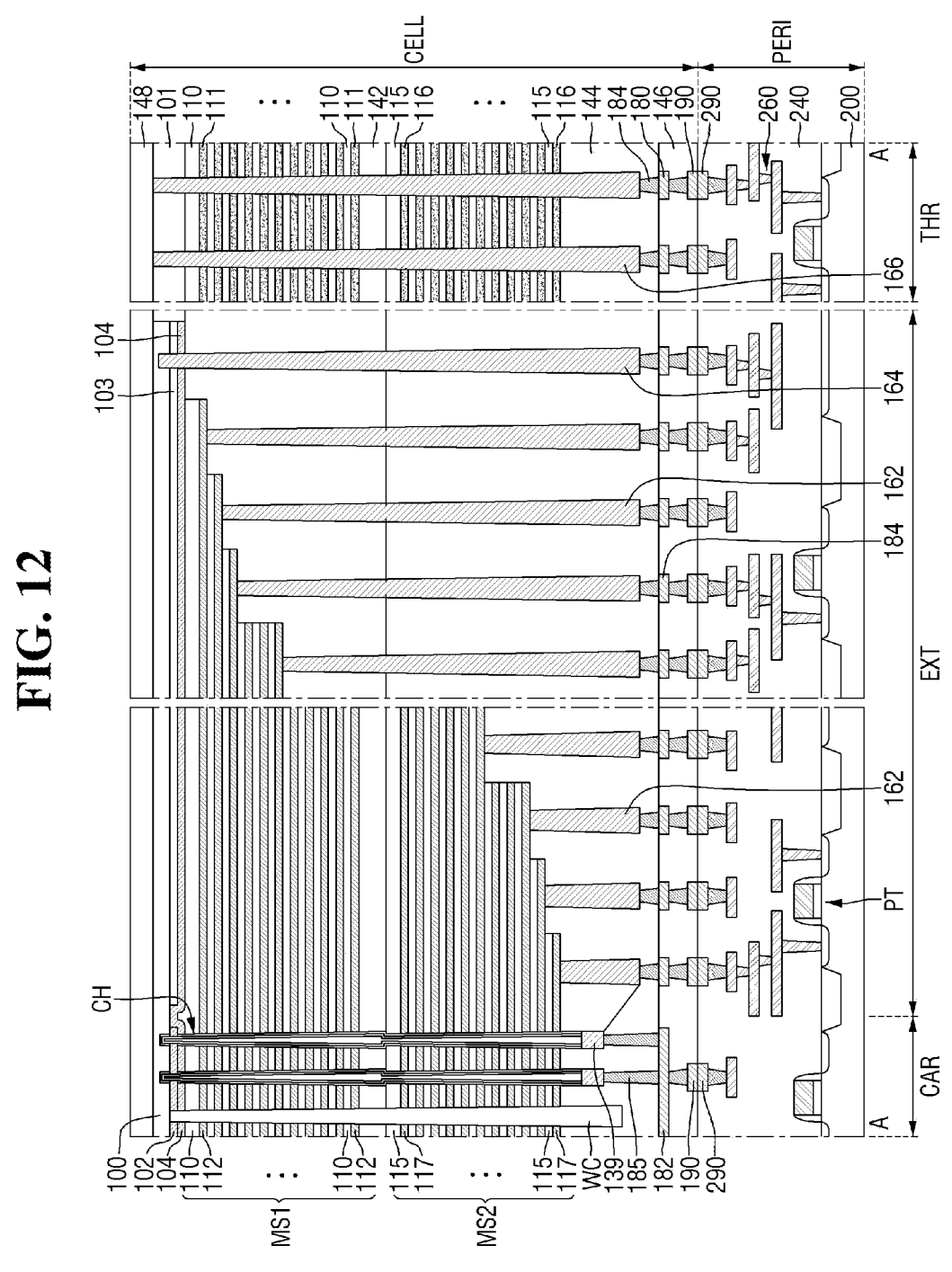
FIG. 12 is a cross-sectional view illustrating a semiconductor memory device according to some example embodiments.

FIG. 12 is a cross-sectional view illustrating a semiconductor memory device according to some example embodiments. For convenience of description, portions duplicated with those described with reference to FIGS. 1 to 11 will be briefly described or omitted.

Referring to FIG. 12, in the semiconductor memory device according to some example embodiments, the front side of the cell substrate 100 faces the front side of the peripheral circuit board 200.

For example, the semiconductor memory device according to some example embodiments may be a chip to chip (C2C) structure. The C2C structure means that an upper chip including a memory cell structure CELL is fabricated on a first wafer (e.g., the cell substrate 100) and a lower chip including a peripheral circuit structure PERI is fabricated on a second wafer (e.g., the peripheral circuit board 200) different from the first wafer, and then the upper chip and the lower chip are connected to each other by a bonding method.

As an example, the bonding method may mean a method of electrically connecting a first bonding metal 190 formed on the uppermost metal layer of the upper chip with a second bonding metal 290 formed on the uppermost metal layer of the lower chip. For example, when the first bonding metal 190 and the second bonding metal 290 are formed of copper (Cu), the bonding method may be a Cu—Cu bonding method. However, this is only example, and the first bonding metal 190 and the second bonding metal 290 may be formed of various other metals such as aluminum (Al) or tungsten (W).

As the first bonding metal 190 and the second bonding metal 290 are bonded to each other, the cell wiring structure 180 may be electrically connected to the peripheral circuit wiring structure 260. Therefore, the cell substrate 100, the plurality of channel structures CH, and/or the plurality of gate electrodes 112 and 117 may be electrically connected to the peripheral circuit element PT.

In some example embodiments, a passivation layer 148 may be formed on the back side of the cell substrate 100. The passivation layer 148 may cover the cell substrate 100 and/or the insulating substrate 101. The passivation layer 148 may include an insulating material, for example, at least one of silicon oxide, silicon nitride, silicon oxynitride, silicon oxycarbonitride or their combination, but is not limited thereto.

In some example embodiments, the through via 166 may be electrically connected with an external device. For example, the through via 166 may be exposed from the passivation layer 148 and connected with the external device.

Hereinafter, a method for fabricating a semiconductor memory device according to example embodiments will be described below with reference to FIGS. 1 to 32.

FIGS. 13 to 30 are views illustrating intermediate steps to describe a method for fabricating a semiconductor memory device according to some example embodiments. For convenience of description, portions duplicated with those described with reference to FIGS. 1 to 12 will be briefly described or omitted.

Figure 13:
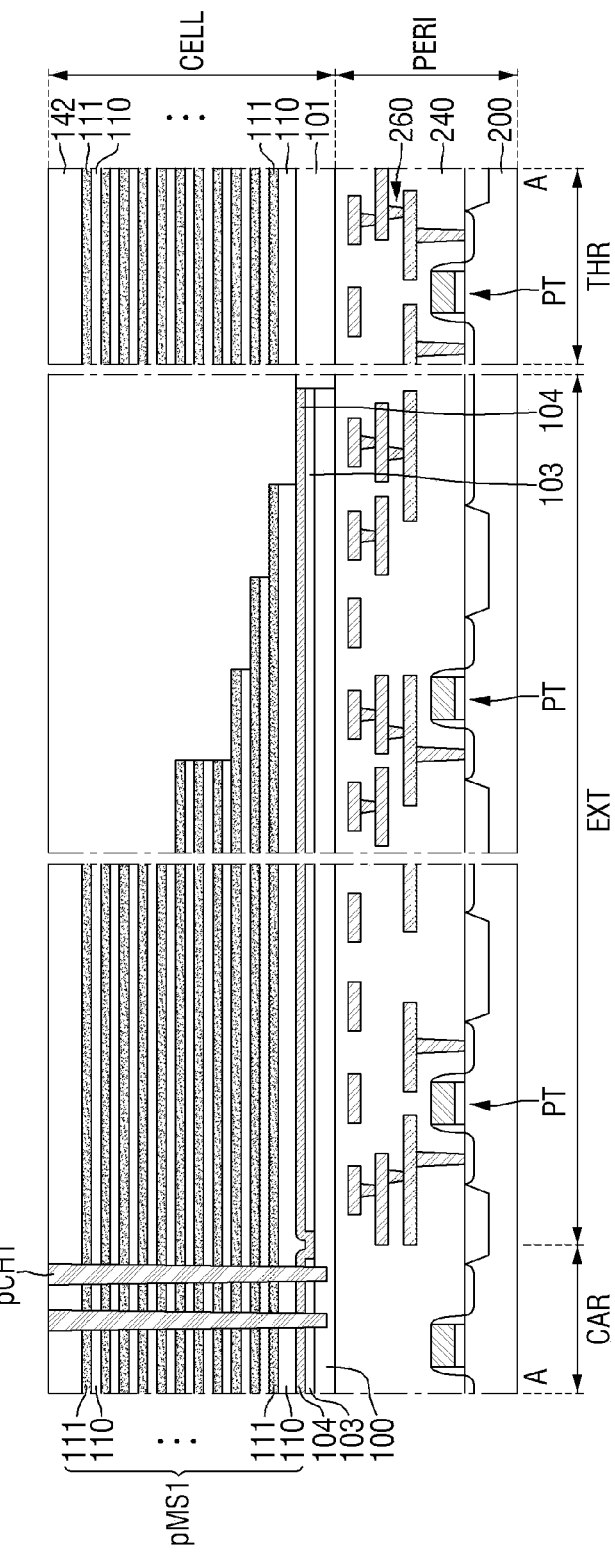

Referring to FIG. 13, a first preliminary mold pMS1 and a first preliminary channel pCH1 are formed on the cell substrate 100 and/or the insulating substrate 101.

The first preliminary mold pMS1 may be formed on the front side of the cell substrate 100. The first preliminary mold pMS1 may include a plurality of first mold insulating layers 110 and a plurality of first mold sacrificial layers 111, which are alternately stacked on the cell substrate 100. The first mold sacrificial layers 111 may include a material having an etch selectivity with respect to the first mold insulating layers 110. For example, the first mold insulating layers 110 may include a silicon oxide layer, and the first mold sacrificial layers 111 may include a silicon nitride layer.

The first preliminary mold pMS1 on the extended region EXT may be patterned in a stepwise shape. Therefore, the first preliminary mold pMS1 may be stacked in a stepwise shape.

In some example embodiments, the cell substrate 100 and/or the insulating substrate 101 may be stacked on the peripheral circuit structure PERI. For example, the peripheral circuit element PT, the peripheral circuit wiring structure 260, and the second inter-wiring insulating layer 240 may be formed on the peripheral circuit board 200. The cell substrate 100 and/or the insulating substrate 101 may be stacked on the second inter-wiring insulating layer 240.

In some example embodiments, the source sacrificial layer 103 and the support layer 104 may be formed on the cell substrate 100 before the first preliminary mold pMS1 is formed. The source sacrificial layer 103 may include a material having an etch selectivity with respect to the first mold insulating layers 110. The support layer 104 may include a material having an etch selectivity with respect to the source sacrificial layer 103. For example, the source sacrificial layer 103 may include a silicon nitride layer, and the support layer 104 may include a polysilicon layer.

The first preliminary channel pCH1 may pass through the first preliminary mold pMS1 on the cell array region CAR. In some example embodiments, the first preliminary channel pCH1 may be connected to the source sacrificial layer 103. For example, the first interlayer insulating layer 142 covering the first preliminary mold pMS1 may be formed on the cell substrate 100. The first preliminary channel pCH1 may pass through the first interlayer insulating layer 142, the first preliminary mold pMS1, and the support layer 104. Although the first preliminary channel pCH1 is shown as only passing through the source sacrificial layer 103, this is only example, and the first preliminary channel pCH1 may not pass through the source sacrificial layer 103.

The first preliminary channel pCH1 may include a material having an etch selectivity with respect to the first mold insulating layers 110 and the first mold sacrificial layers 111. For example, the first preliminary channel pCH1 may include poly-silicon (poly-Si).

Figure 14:
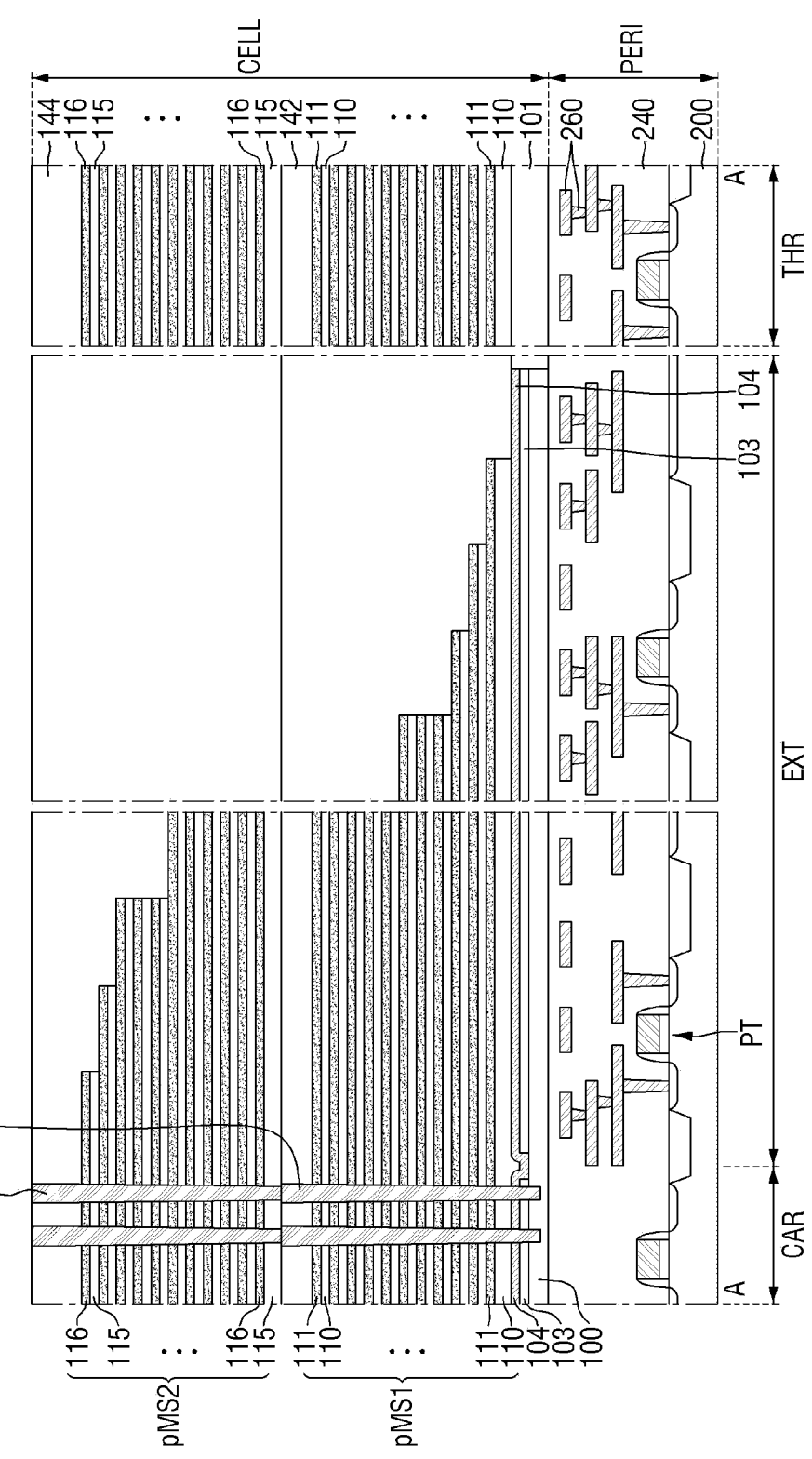

Referring to FIG. 14, a second preliminary mold pMS2 and a second preliminary channel pCH2 are formed on the first preliminary mold pMS1 and the first preliminary channel pCH1.

The second preliminary mold pMS2 may include a plurality of second mold insulating layers 115 and a plurality of second mold sacrificial layers 116, which are alternately stacked on the first preliminary mold pMS1. The formation of the second preliminary mold pMS2 may be similar to that of the first preliminary mold pMS1, and thus its detailed description will be omitted.

The second preliminary channel pCH2 may pass through the second preliminary mold pMS2 on the cell array region CAR. In addition, the second preliminary channel pCH2 may be connected to the first preliminary channel pCH1. The formation of the second preliminary channel pCH2 may be similar to that of the first preliminary channel pCH1, and thus its detailed description will be omitted.

Figure 15:
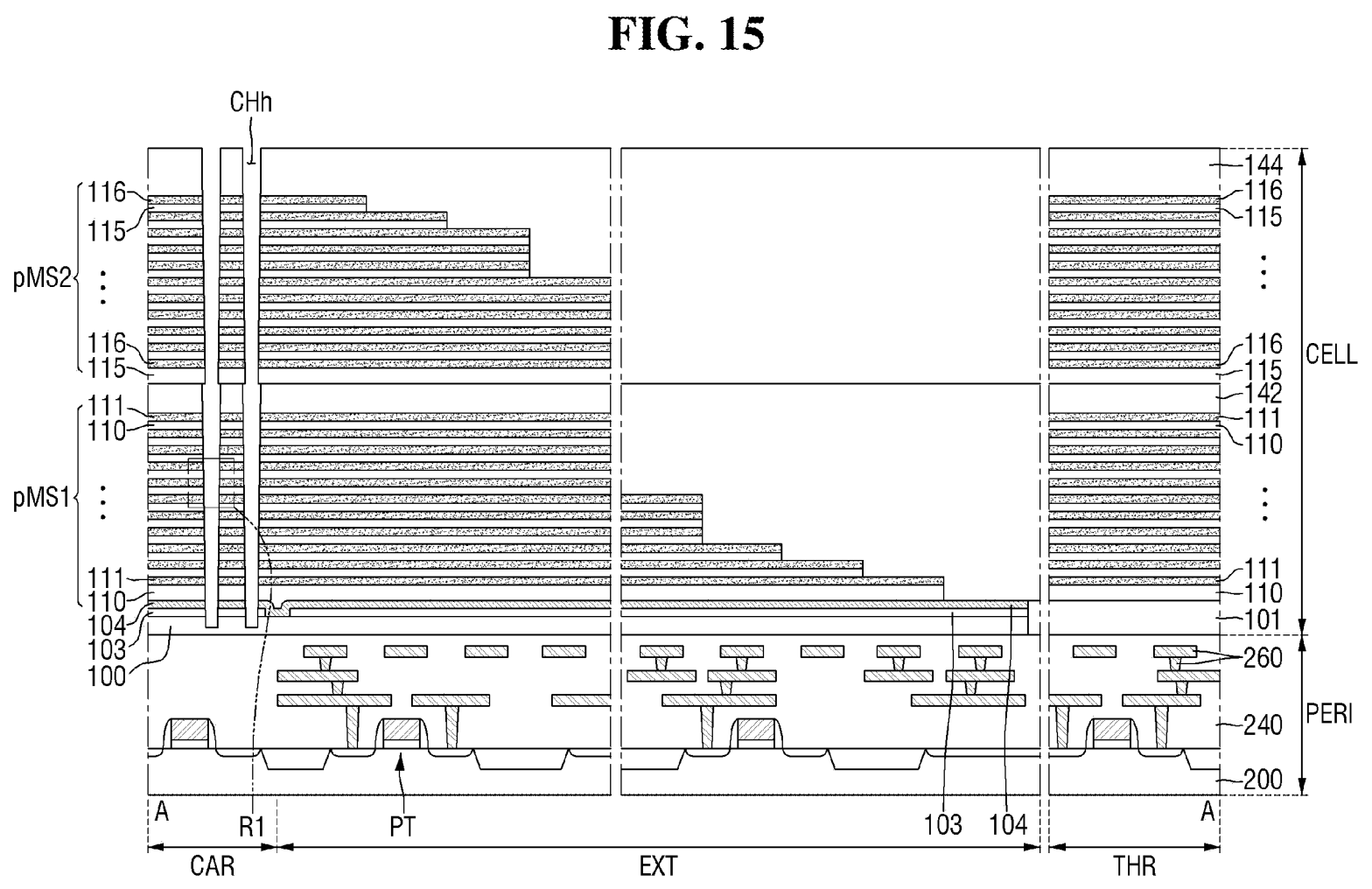
Figure 16:
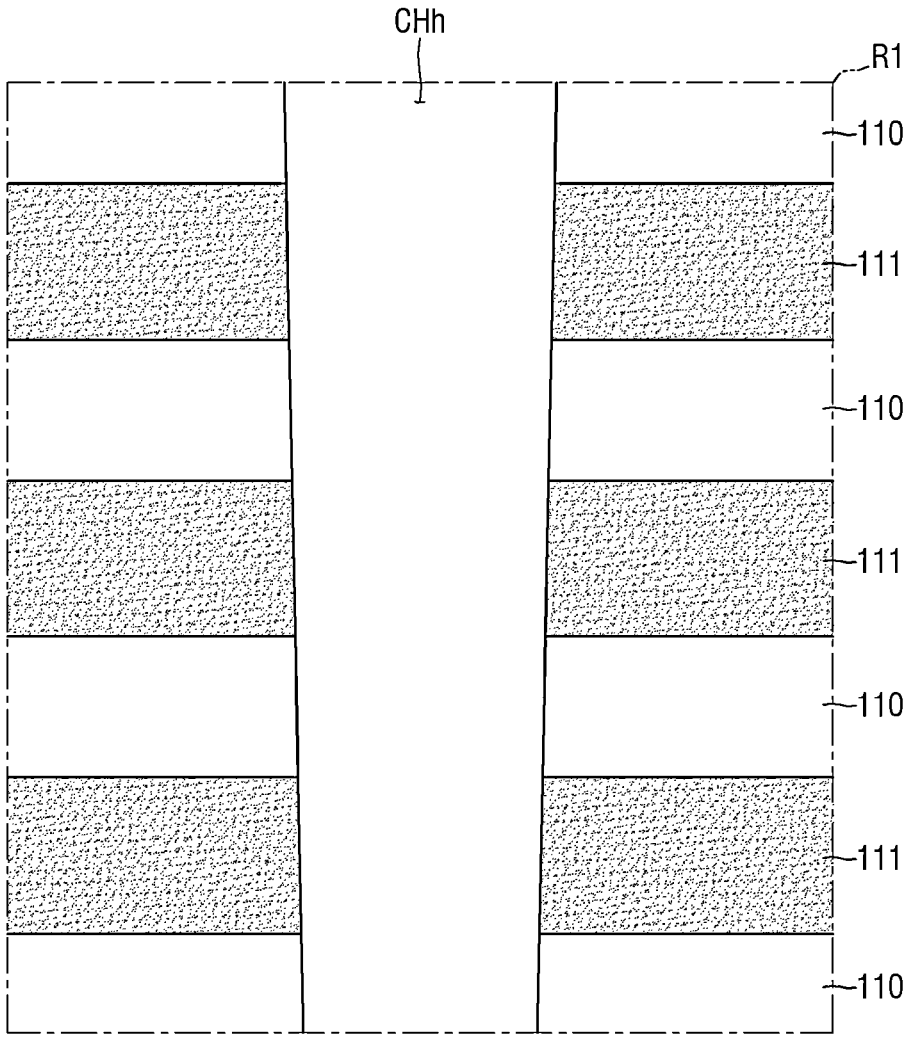

Referring to FIGS. 15 and 16, a channel hole CHh is formed in the first preliminary mold pMS1 and the second preliminary mold pMS2. For reference, FIG. 16 is an enlarged view illustrating a region R1 of FIG. 15.

In detail, the first preliminary channel pCH1 and the second preliminary channel pCH2 of FIG. 14 may be removed. The first preliminary channel pCH1 and the second preliminary channel pCH2 may include a material having an etch selectivity with respect to the mold insulating layers 110 and 115 and the mold sacrificial layers 111 and 116, respectively, and thus may be selectively removed. As the first preliminary channel pCH1 and the second preliminary channel pCH2 are removed, the channel hole CHh extended in the third direction Z, passing through the first preliminary mold pMS1 and the second preliminary mold pMS2 may be formed.

Figure 17:
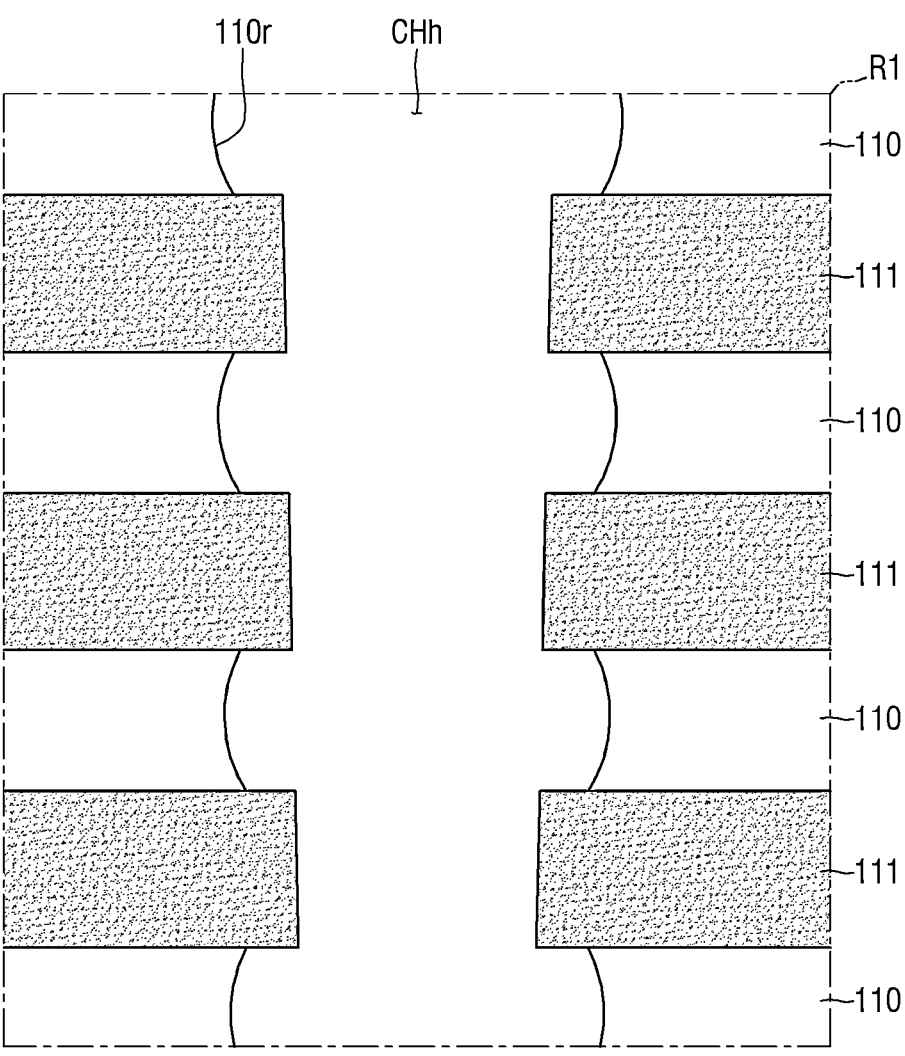

Referring to FIG. 17, a first recess process is performed for the mold insulating layers 110 and 115.

As the first recess process is performed, the side surface of each of the mold insulating layers 110 and 115 exposed by the channel hole CHh may be recessed so that a recess 110r may be formed. In addition, as the recess 110r is formed, a portion of each of the mold sacrificial layers 111 and 116 may be protruded toward the channel hole CHh. In some example embodiments, the recess 110r may be concave toward the channel hole CHh. This may be due to characteristics of the first recess process.

Figure 18:
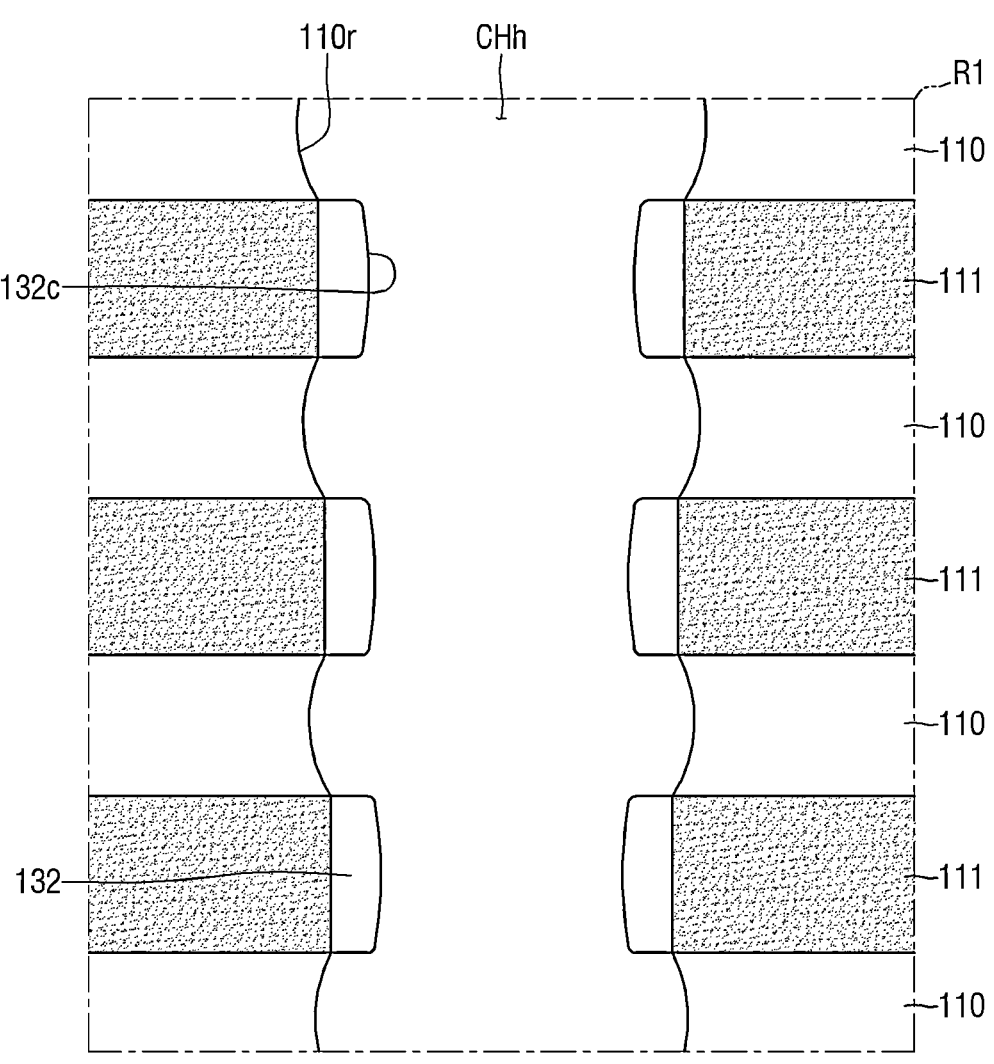

Referring to FIG. 18, a first oxidation process is performed for the mold sacrificial layers 111 and 116.

The first oxidation process may include, for example, a radical plasma oxidation process, but is not limited thereto. As the first oxidation process is performed, a portion of each of the mold sacrificial layers 111 and 116 exposed by the mold insulating layers 110 and 115 may be oxidized so that a blocking insulating pattern 132 may be formed. Therefore, the blocking insulating pattern 132 including an oxide, such as silicon oxide (SiO) or silicon oxynitride (SiON), may be formed. For example, the blocking insulating pattern 132 may include a silicon oxide layer.

In some example embodiments, the blocking insulating pattern 132 may include a convex surface 132$c$ convex toward the channel hole CHh.

A depth at which the mold sacrificial layers 111 and 116 are oxidized is shown as being only the same as a depth at which the recess 110$r$ is formed, but this is only example. The depth at which the mold sacrificial layers 111 and 116 are oxidized may be deeper than the recess 110$r$, or may be shallower than the recess 110$r$.

Figure 19:
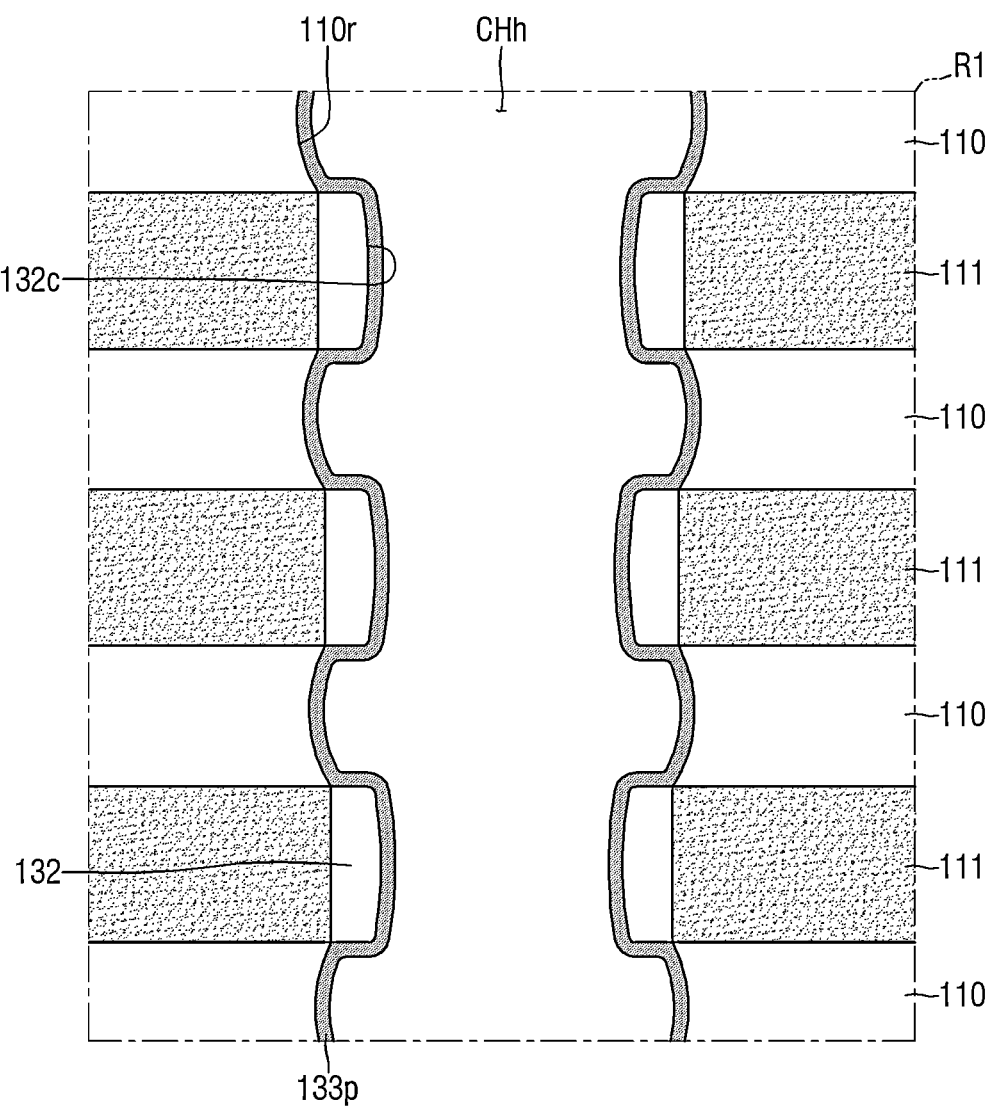

Referring to FIG. 19, a preliminary charge storage layer 133$p$ is formed in the channel hole CHh.

The preliminary charge storage layer 133$p$ may be formed on the side surface of each of the mold insulating layers 110 and 115 and the blocking insulating pattern 132. For example, the preliminary charge storage layer 133$p$ may be extended conformally along each of the mold insulating layers 110 and 115 and the blocking insulating pattern 132. As the blocking insulating pattern 132 is more protruded than the side surface of each of the mold insulating layers 110 and 115, the preliminary charge storage layer 133$p$ may be extended in the form of a snake having an uneven cross-section. The preliminary charge storage layer 133$p$ may include, for example, a silicon nitride layer.

Figure 20:
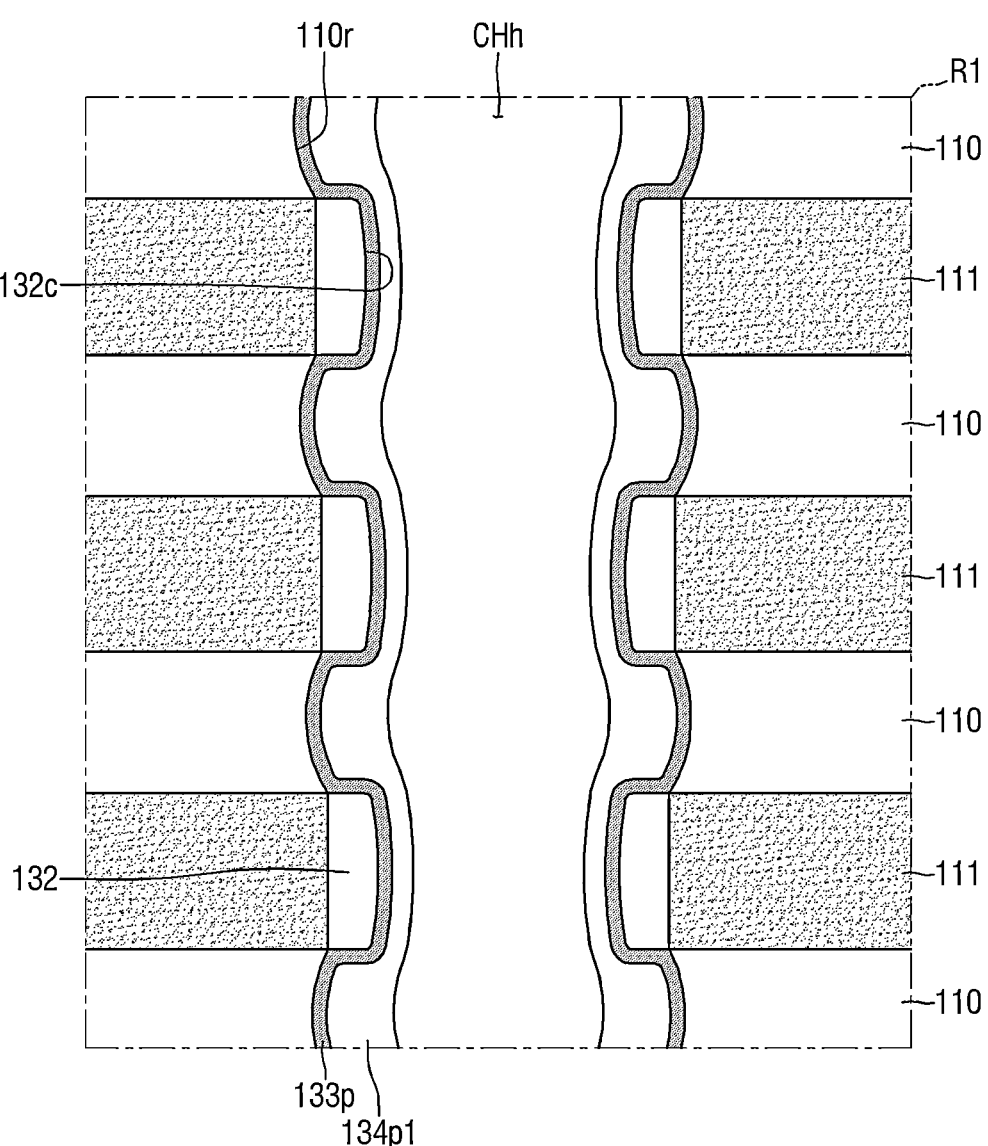

Referring to FIG. 20, a first isolation insulating layer 134$p$1 is formed in the channel hole CHh.

The first isolation insulating layer 134$p$1 may be formed on the preliminary charge storage layer 133$p$. The first isolation insulating layer 134$p$1 may include, for example, an oxide such as silicon oxide (SiO) or silicon oxynitride (SiON). For example, the first isolation insulating layer 134$p$1 may include a silicon oxide layer.

Figure 21:
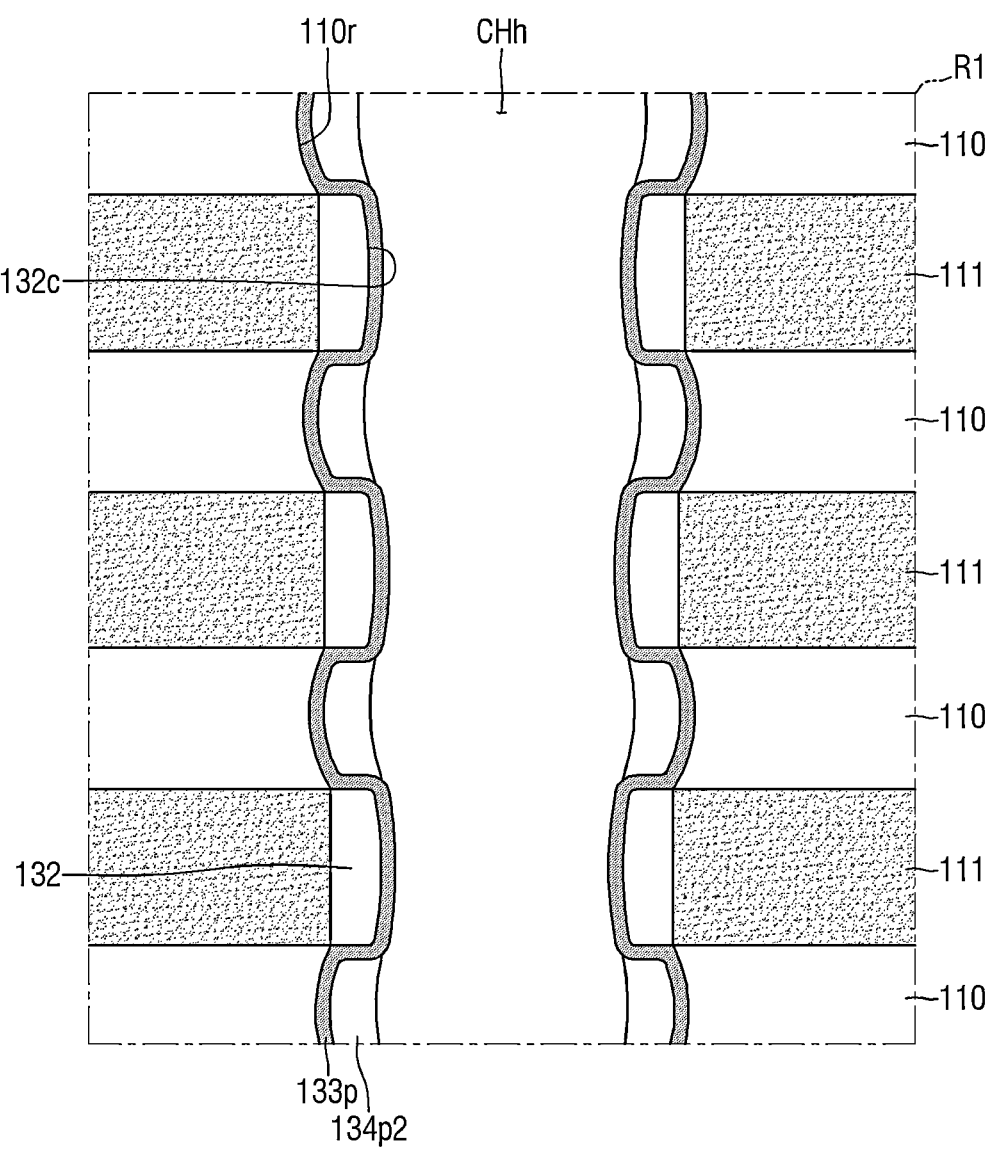

Referring to FIGS. 20 and 21, a second recess process is performed for the first isolation insulating layer 134$p$1.

As the second recess process is performed, the first isolation insulating layer 134$p$1 may be recessed so that a preliminary isolation insulating pattern 134$p$2 exposing a portion of the preliminary charge storage layer 133$p$ may be formed. In detail, the preliminary isolation insulating pattern 134$p$2 may expose the preliminary charge storage layer 133$p$ on the side surface of the blocking insulating pattern 132, and may cover the preliminary charge storage layer 133$p$ on the side surface of each of the mold insulating layers 110 and 115.

Figure 22:
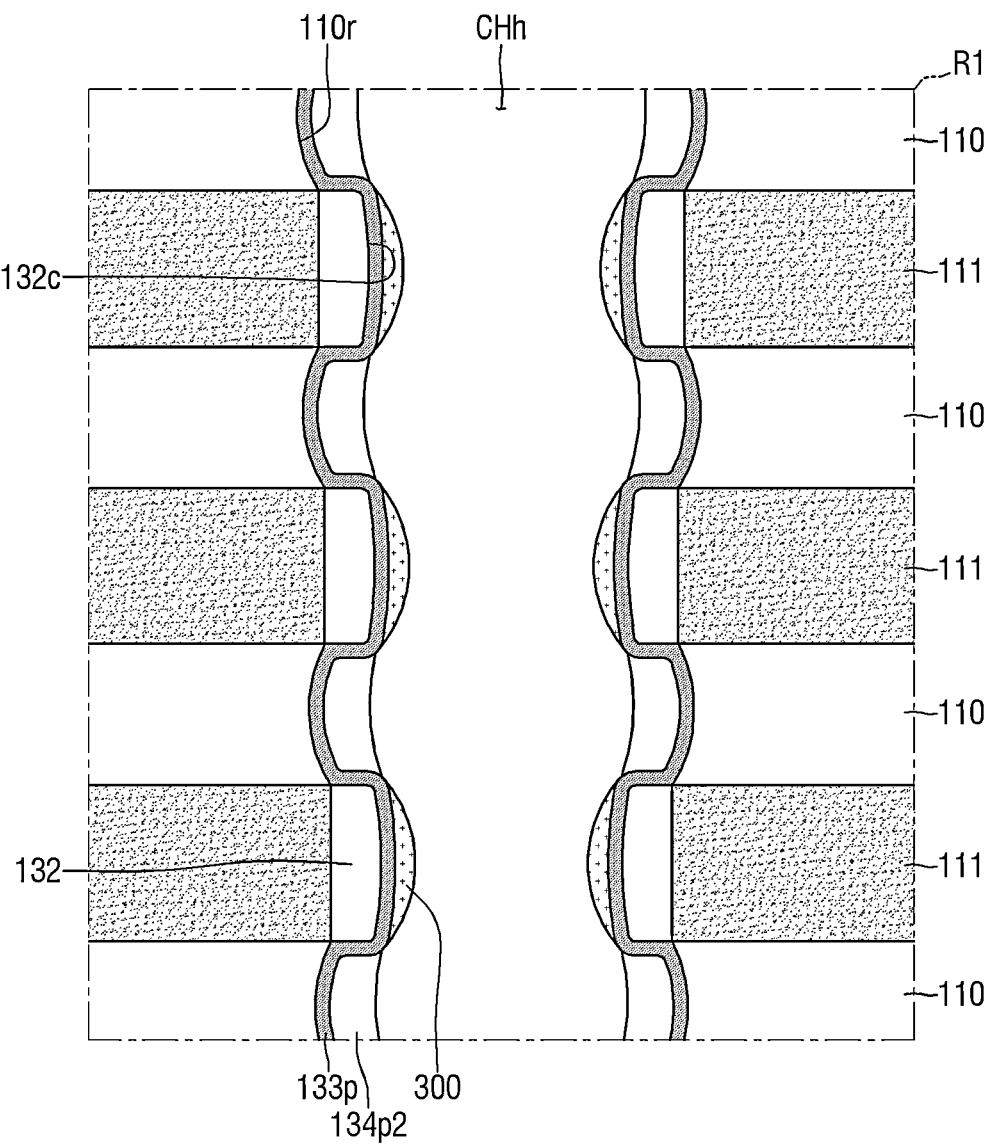

Referring to FIG. 22, a mask pattern 300 is formed on the preliminary charge storage layer 133$p$ exposed by the preliminary isolation insulating pattern 134$p$2.

For example, a selective deposition process for the preliminary charge storage layer 133$p$ may be performed. As the selective deposition process is performed, the mask pattern 300 may be selectively formed on the preliminary charge storage layer 133$p$ exposed by the preliminary isolation insulating pattern 134$p$2, and may not be formed on a side surface of the preliminary isolation insulating pattern 134$p$2. The mask pattern 300 may include, for example, a polysilicon layer, but is not limited thereto.

Figure 23:
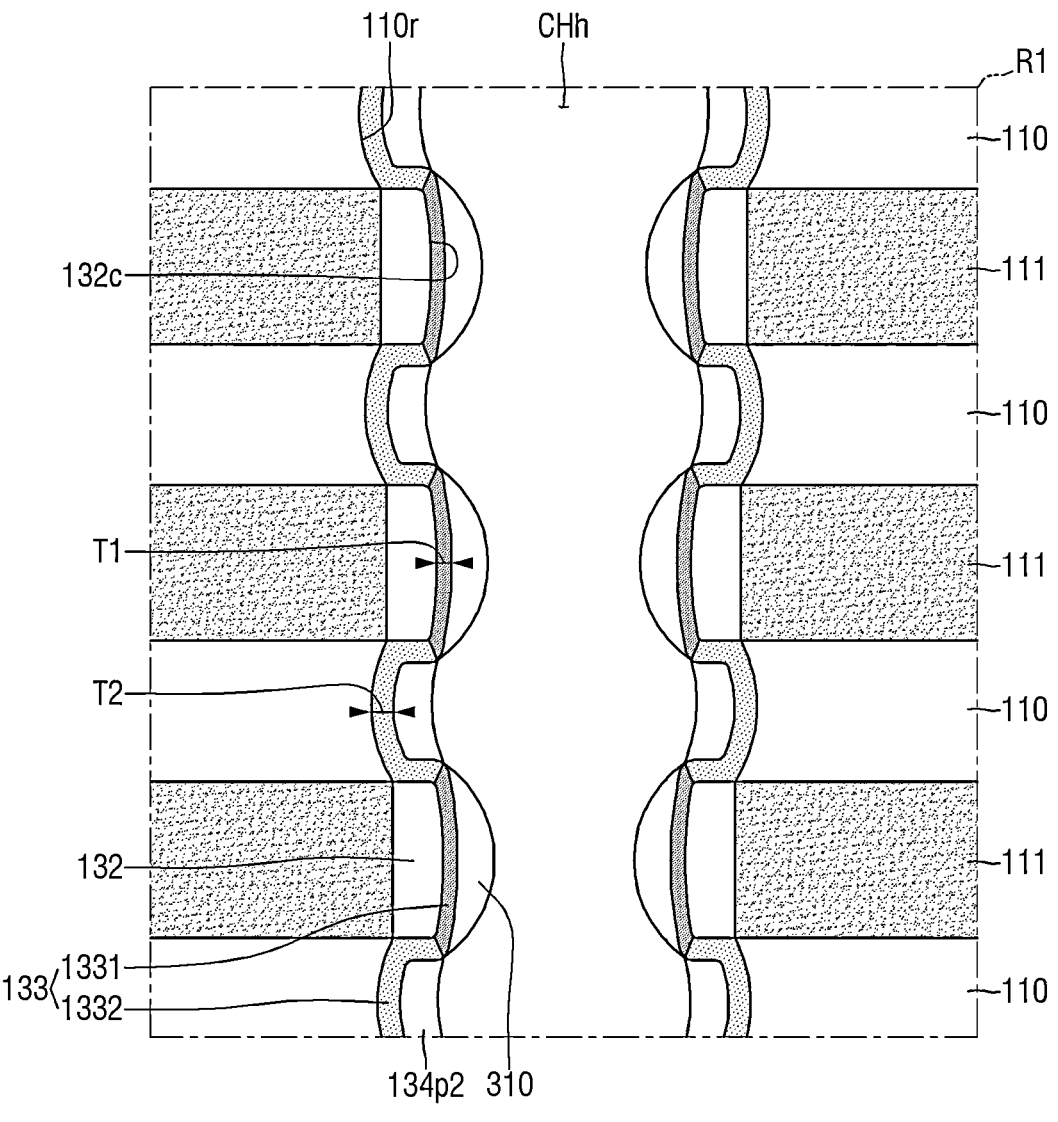

Referring to FIGS. 22 and 23, a second oxidation process is performed for the preliminary charge storage layer 133$p$.

The second oxidation process may include, for example, a radical plasma oxidation process, but is not limited thereto. In the second oxidation process, the degree of oxidation of the region of the preliminary charge storage layer 133$p$ may be changed depending on the position at which the mask pattern 300 is formed. In detail, in the second oxidation process, the degree of oxidation of the region of the preliminary charge storage layer 133$p$, which is not covered by the mask pattern 300, may be greater than that of the region of the preliminary charge storage layer 133$p$, which is covered by the mask pattern 300. Therefore, a charge storage layer 133 including a charge trap portion 1331 and a first charge blocking portion 1332 may be formed.

For example, an oxygen radical (O radical) generated in the radical plasma oxidation process may be diffused into the preliminary isolation insulating pattern 134$p$2 containing an oxide to at least partially oxidize the region of the preliminary charge storage layer 133$p$ adjacent to the preliminary isolation insulating pattern 134$p$2. Therefore, the first charge blocking portion 1332 extended along the side surface of each of the mold insulating layers 110 and 115 may be formed. For example, the first charge blocking portion 1332 may include a silicon oxynitride layer formed by partially oxidizing a silicon nitride layer of the preliminary charge storage layer 133$p$.

Alternatively, the mask pattern 300 may protect the region of the preliminary charge storage layer 133$p$, which is covered by the mask pattern 300, from the oxygen radical. That is, the region of the preliminary charge storage layer 133$p$, which is covered by the mask pattern 300, may not be oxidized, or may be relatively weakly oxidized. Therefore, the charge trap portion 1331 extended along the side surface of the blocking insulating pattern 132 may be formed. For example, the charge trap portion 1331 may include the silicon nitride layer of the preliminary charge storage layer 133$p$.

In some example embodiments, the mask pattern 300 may be at least partially oxidized to form an oxidation mask pattern 310. For example, the mask pattern 300 including a polysilicon layer may be completely oxidized to form the oxidation mask pattern 310 including a silicon oxide layer.

In some example embodiments, the degree of oxidation of the first charge blocking portion 1332 and the mask pattern 300 may be controlled in accordance with an oxygen partial pressure of the second oxidation process. For example, the second oxidation process may include a radical plasma oxidation process that uses $H_2$ and $O_2$ as source gases. In this case, as the $O_2$ partial pressure in the source gas is reduced (or as the $H_2$ partial pressure is increased), the degree of oxidation of the polysilicon layer relative to the silicon nitride layer may be increased. Therefore, the degree of oxidation of the mask pattern 300 including the polysilicon layer relative to the first charge blocking portion 1332 including the silicon nitride layer may be controlled.

Figure 24:
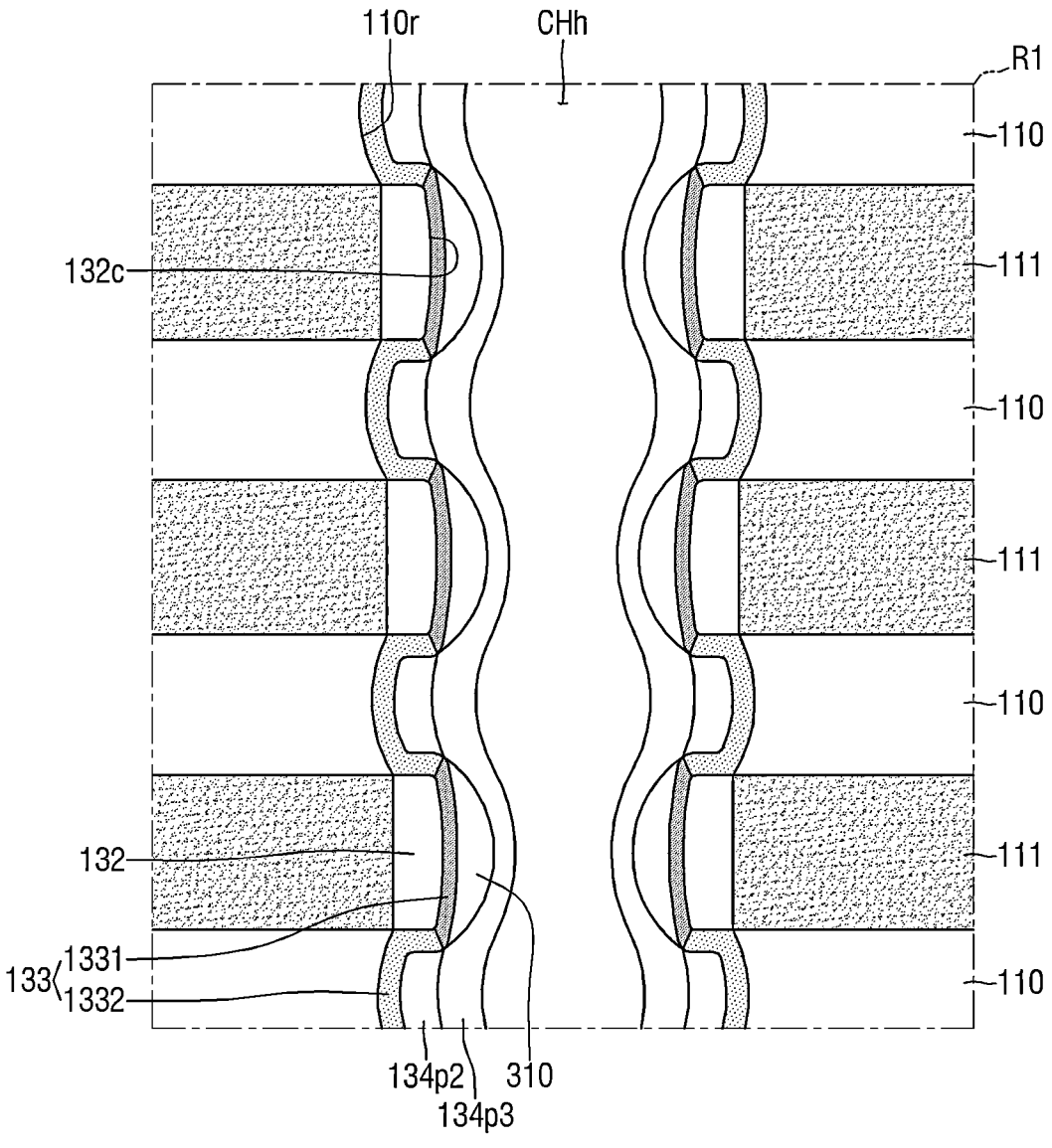

Referring to FIG. 24, a second isolation insulating layer 134$p$3 is formed in the channel hole CHh.

The second isolation insulating layer 134$p$3 may be formed on the mask pattern 300 and the preliminary isolation insulating pattern 134$p$2. The second isolation insulating layer 134$p$3 may include, for example, silicon oxide (SiO) or silicon oxynitride (SiON), but is not limited thereto. For example, the isolation insulating pattern 134 may include a silicon oxide layer.

Figure 25:
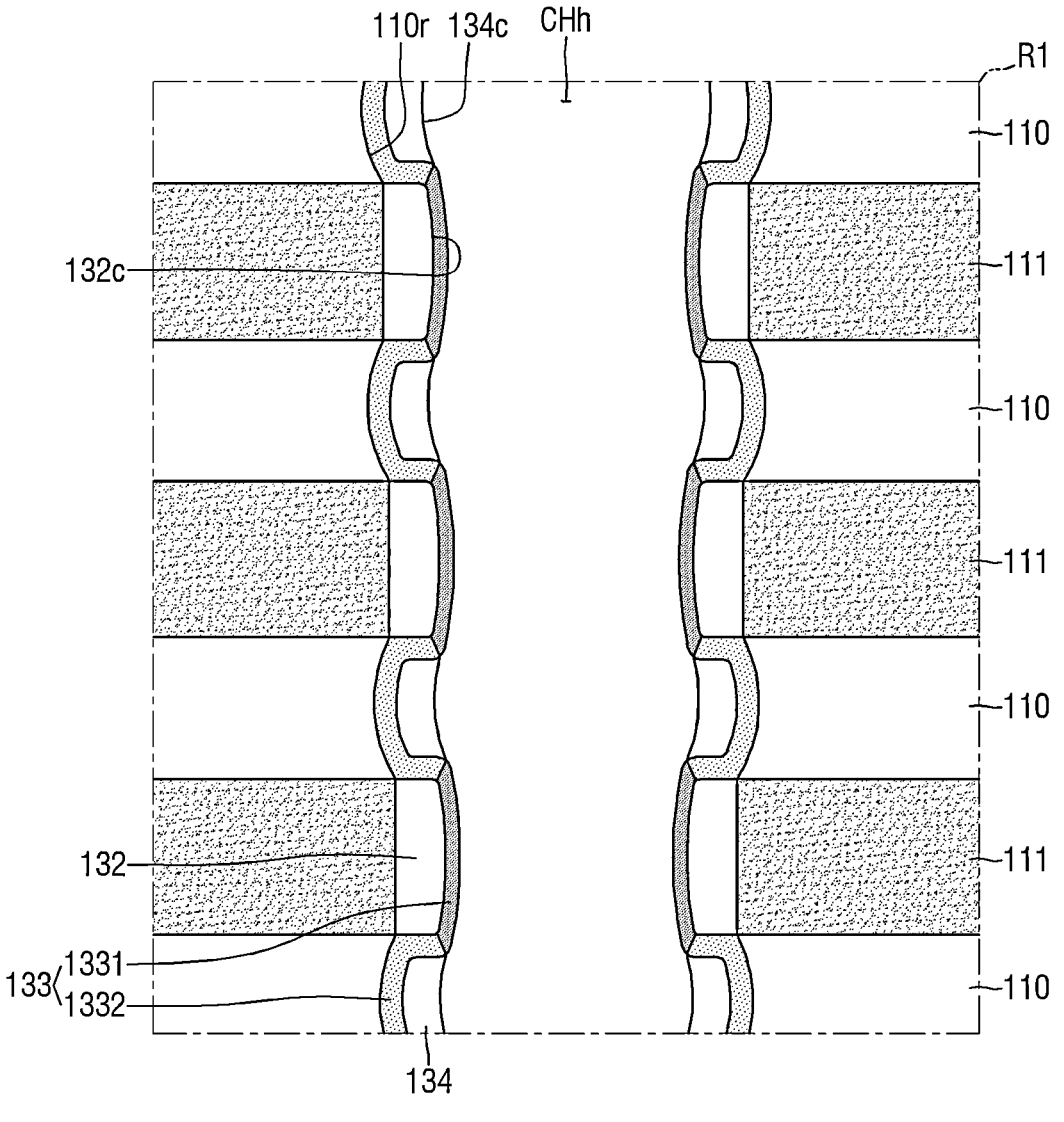

Referring to FIGS. 24 and 25, a third recess process is performed for the mask pattern 300, the preliminary isolation insulating pattern 134$p$2 and/or the second isolation insulating layer 134$p$3.

As the third recess process is performed, the isolation insulating pattern 134 exposing the charge trap portion 1331 may be formed. In some example embodiments, the isolation insulating pattern 134 may cover the first charge blocking portion 1332.

Figure 26:
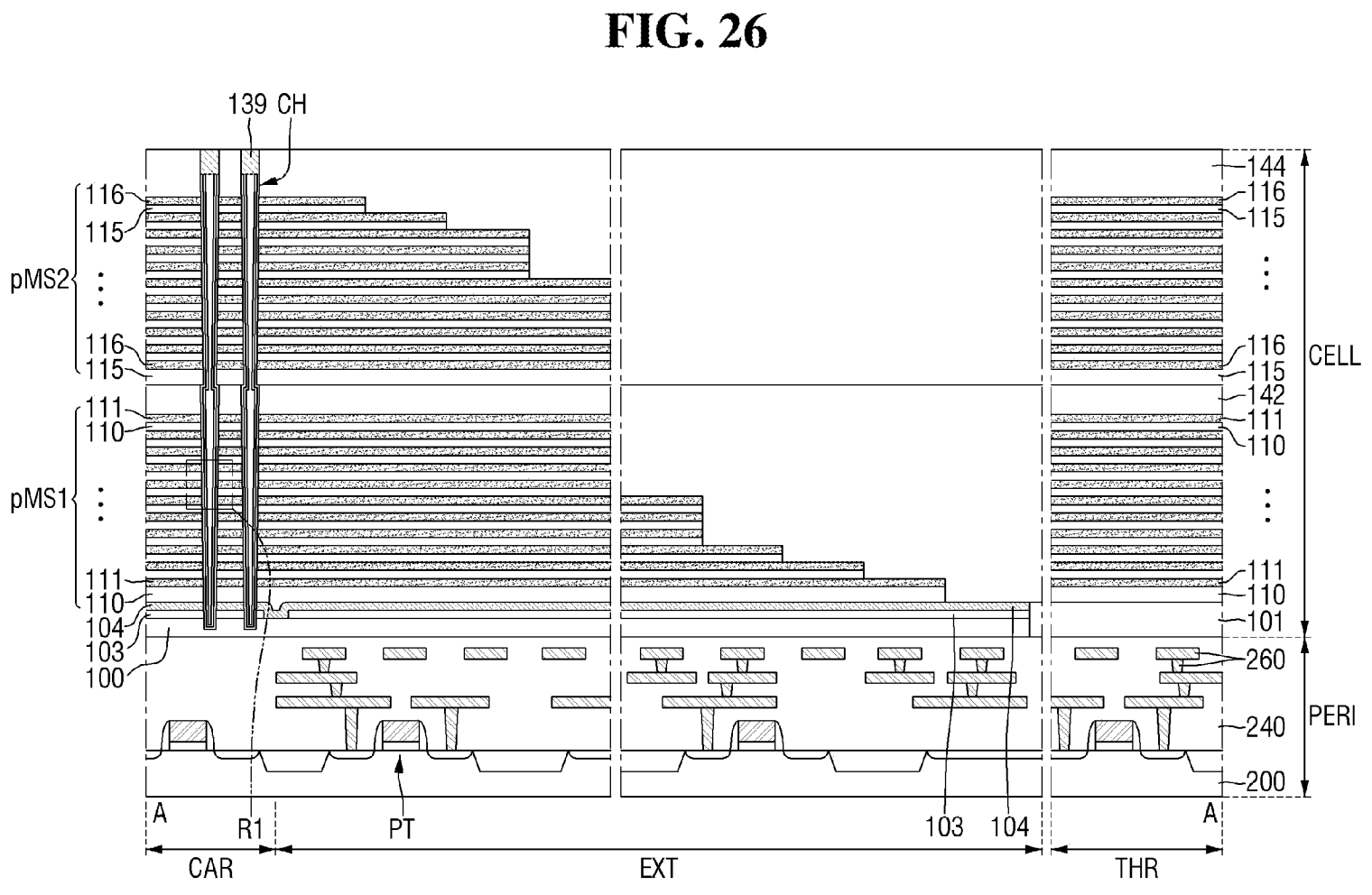
Figure 27:
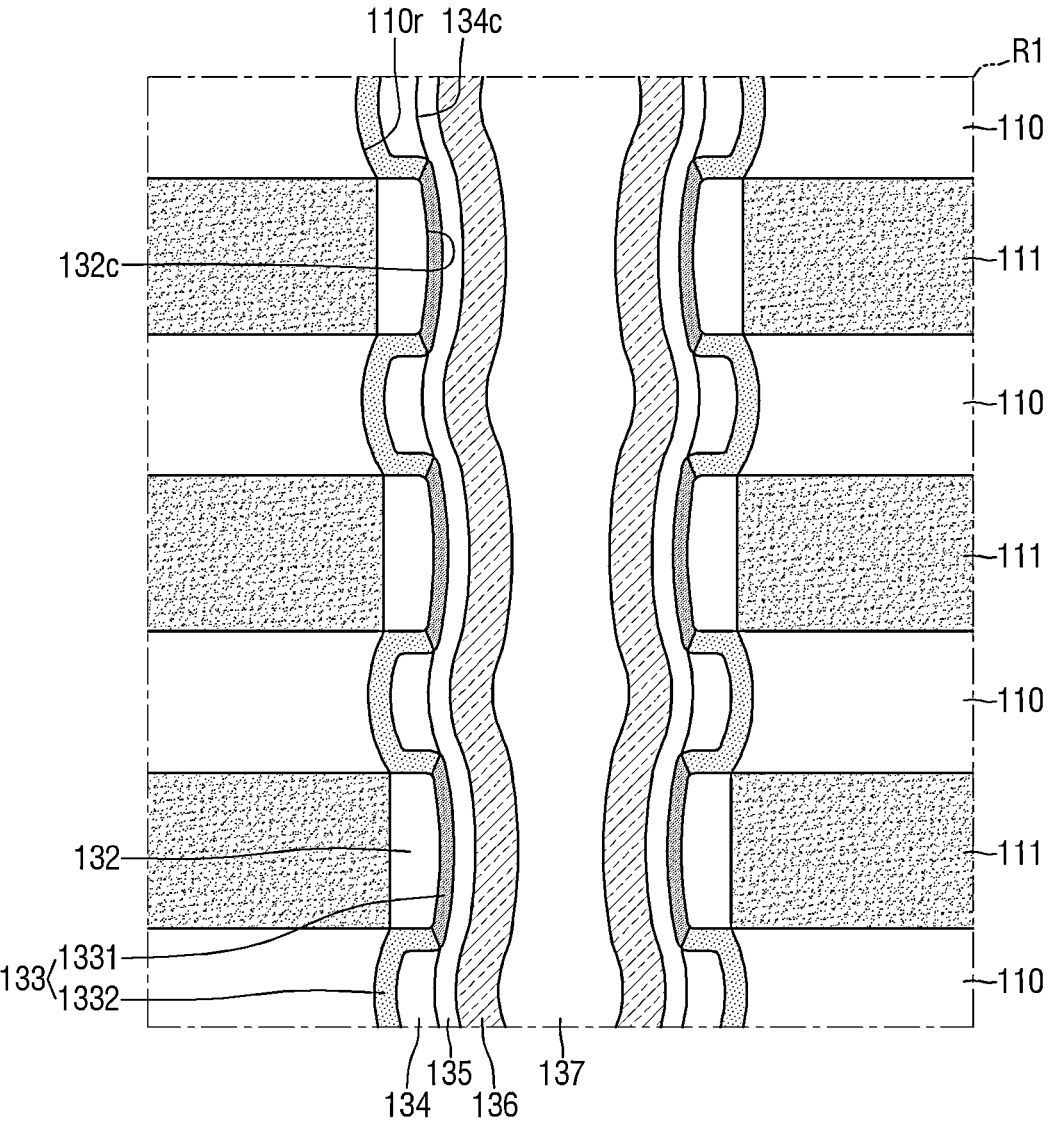

Referring to FIGS. 25, 26 and 27, a tunnel insulating layer 135, a semiconductor layer 136, and a filling insulating layer 137 are formed in the channel hole CHh. For reference, FIG. 27 is an enlarged view illustrating a region R1 of FIG. 26.

The tunnel insulating layer 135, the semiconductor layer 136, and the filling insulating layer 137 may be sequentially stacked on the charge storage layer 133 and the isolation insulating pattern 134. As a result, the channel structure CH including the blocking insulating pattern 132, the charge storage layer 133, the isolation insulating pattern 134, the tunnel insulating layer 135, the semiconductor layer 136 and the filling insulating layer 137 may be formed.

Figure 28:
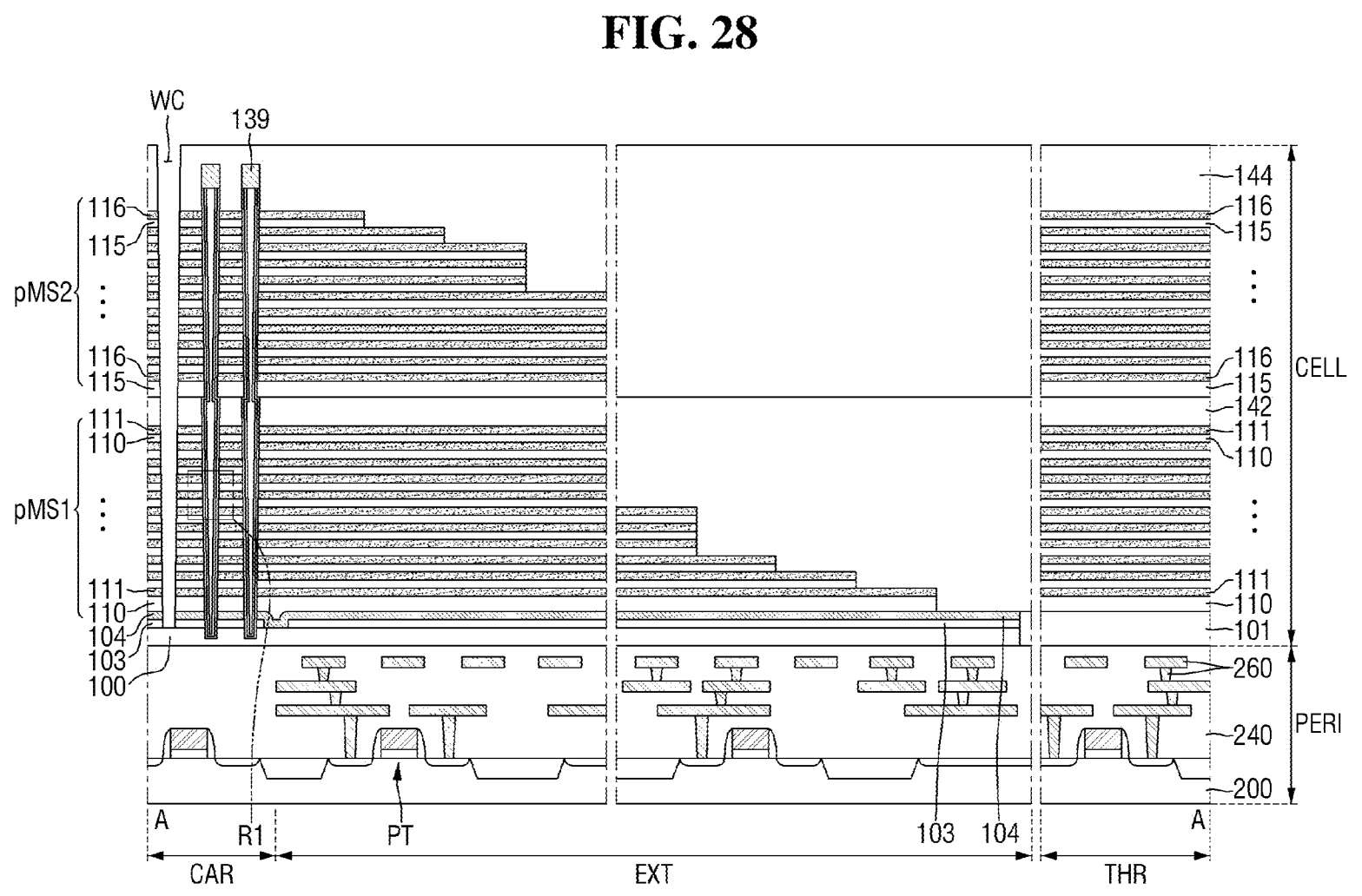

Referring to FIG. 28, a word line cutting region WC is formed in the first preliminary mold pMS1 and the second preliminary mold pMS2.

The word line cutting region WC may be extended in the first direction X to cut the first preliminary mold pMS1 and the second preliminary mold pMS2.

Figure 29:
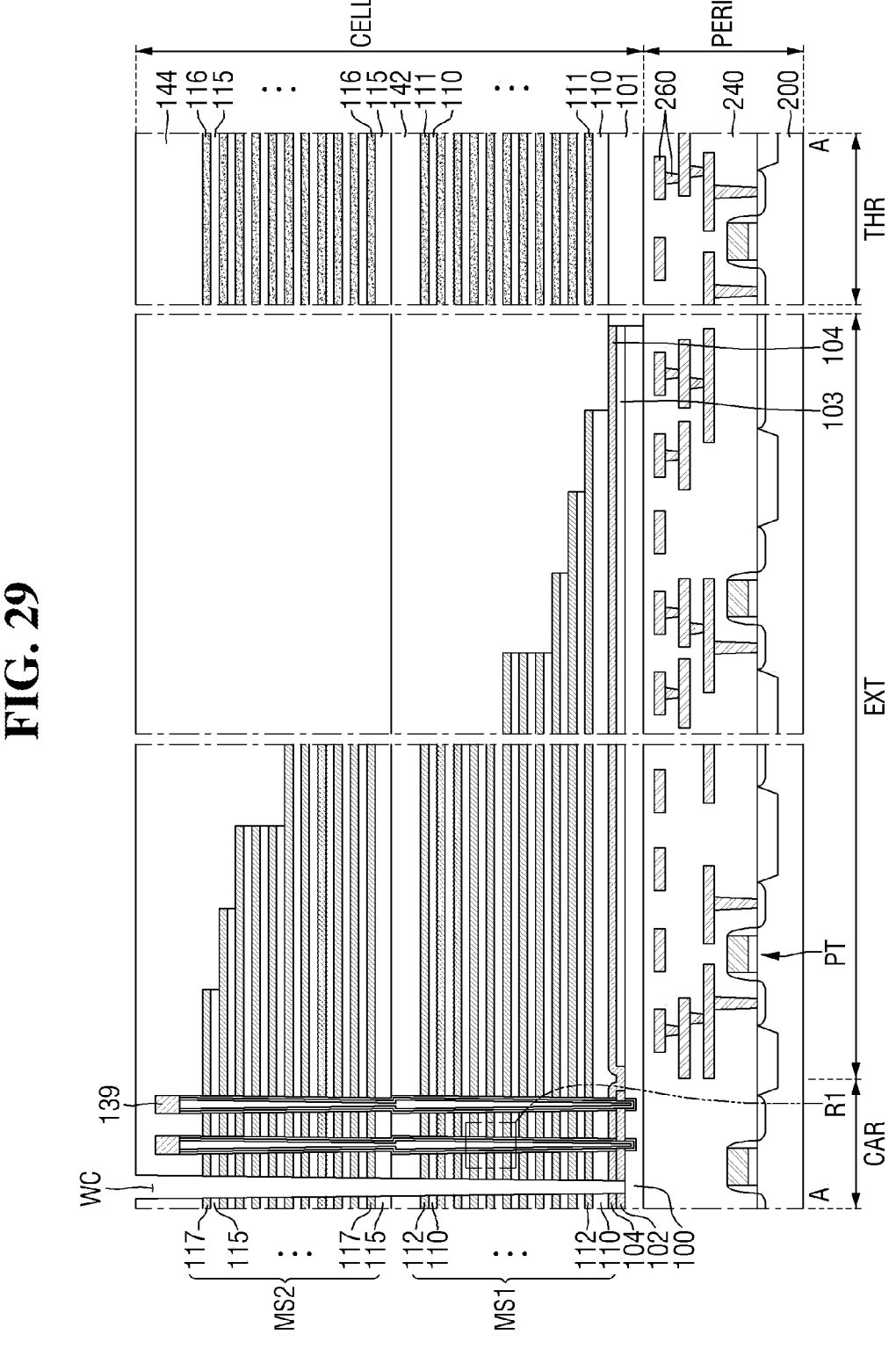
Figure 30:
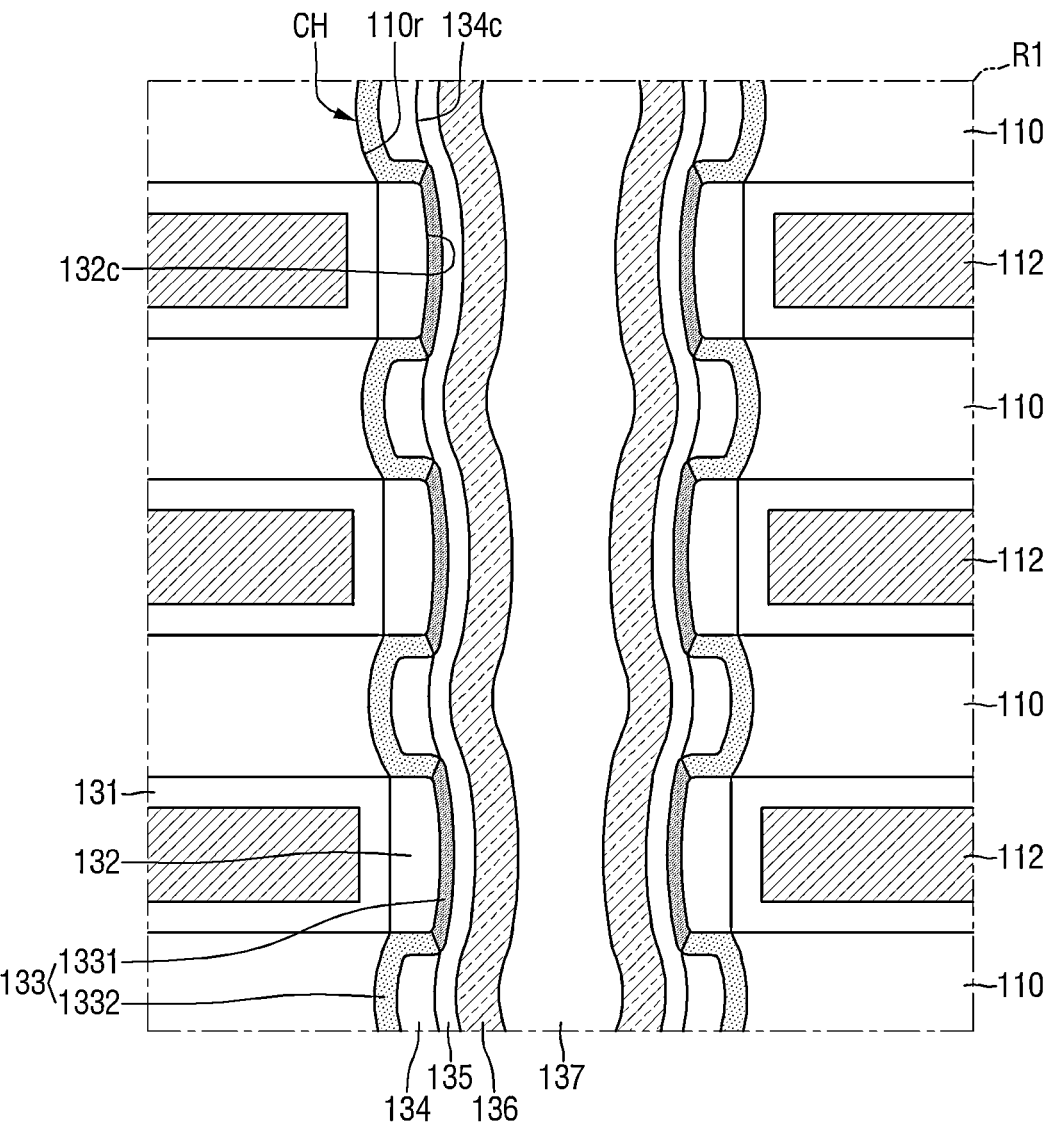

Referring to FIGS. 29 and 30, a plurality of gate electrodes 112 and 117 and a source layer 102 are formed. For reference, FIG. 30 is an enlarged view illustrating a region R1 of FIG. 29.

For example, the mold sacrificial layers 111 and 116 exposed by the word line cutting region WC may be selectively removed. Subsequently, the gate electrodes 112 and 117, which replace the region from which the mold sacrificial layers 111 and 116 are removed, may be formed. As a result, a first mold stack MS1 including the plurality of first gate electrodes 112 and a second mold stack MS2 including the plurality of second gate electrodes 117 may be formed.

In some example embodiments, before the gate electrodes 112 and 117 are formed, a gate dielectric layer 131 may be formed in the region from which the mold sacrificial layers 111 and 116 are removed. As a result, the gate dielectric layer 131 extended along an outer surface of each of the gate electrodes 112 and 117 may be formed.

In addition, for example, the source sacrificial layer 103 exposed by the word line cutting region WC may be selectively removed. In some example embodiments, a portion of the side surface of the semiconductor layer 136 may be exposed in the process of removing the source sacrificial layer 103. Subsequently, the source layer 102, which replaces the region from which the source sacrificial layer 103 is removed, may be formed. Therefore, the source layer 102 connected to the semiconductor layer 136 of each of the channel structures CH may be formed.

In some example embodiments, after the gate electrodes 112 and 117 and the source layer 102 are formed, the word line cutting region WC may be filled with an insulating material.

Then, referring to FIG. 4, a gate contact 162, a substrate contact 164, and a cell wiring structure 180 are formed on the mold stacks MS1 and MS2. As a result, the semiconductor memory device described above with reference to FIGS. 3 to 7 may be fabricated.

Figure 31:
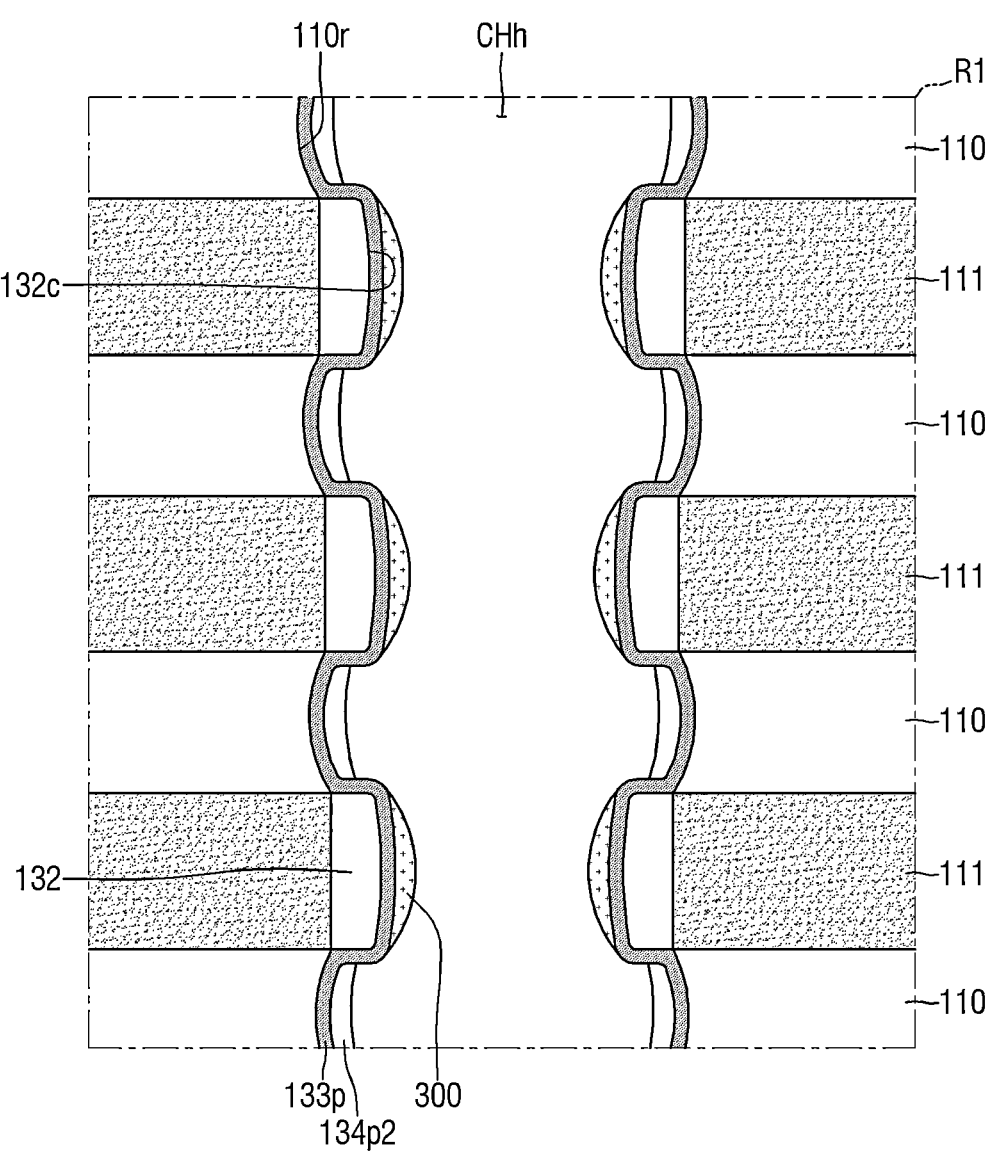
FIGS. 31 and 32 are views illustrating intermediate steps to describe a method for fabricating a semiconductor memory device according to some example embodiments.
Figure 32:
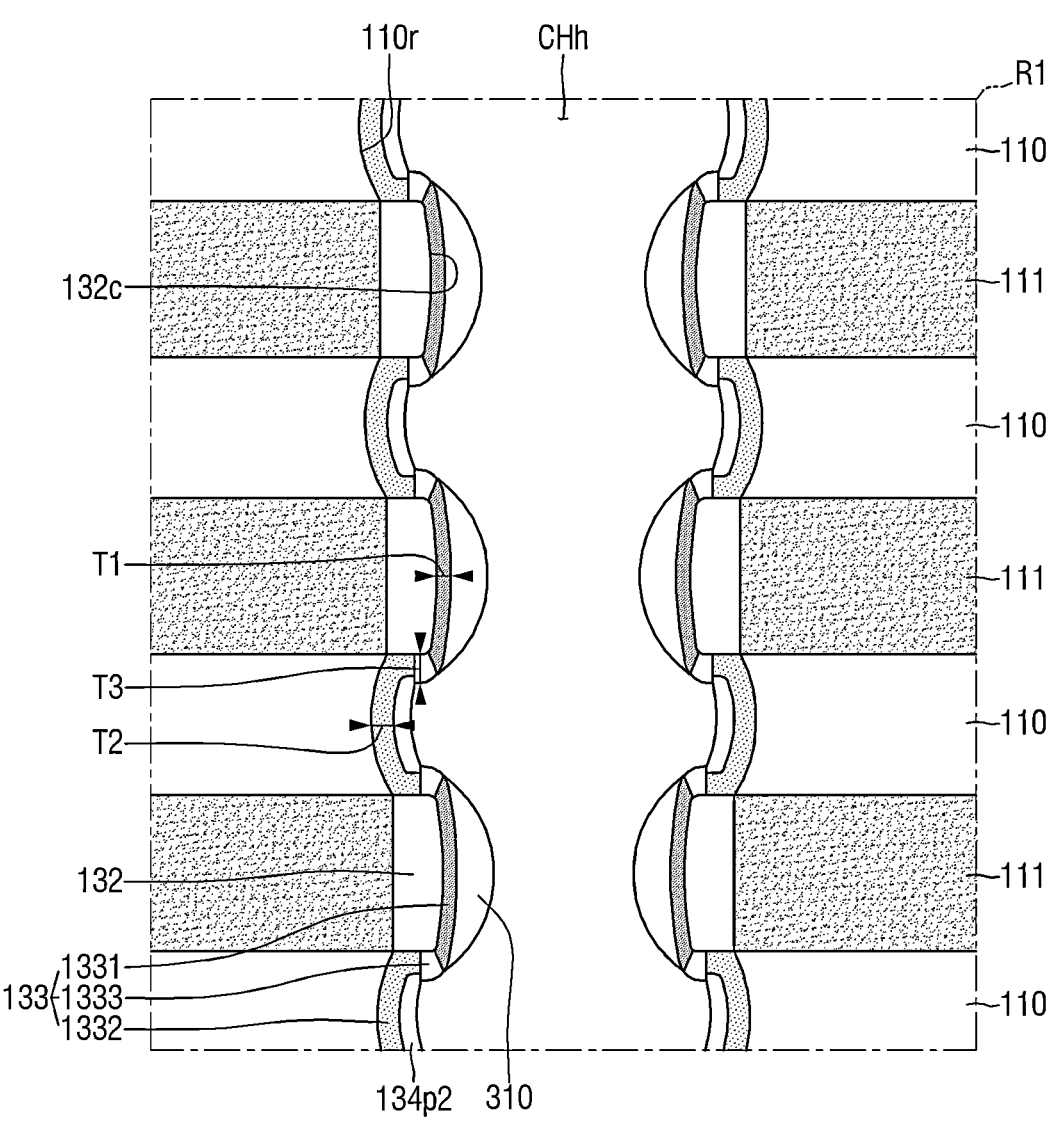

FIGS. 31 and 32 are views illustrating intermediate steps to describe methods for fabricating semiconductor memory devices according to some example embodiments. For reference, FIG. 31 is a view illustrating intermediate steps to describe steps subsequent to FIG. 22. For convenience of description, portions duplicated with those described with reference to FIGS. 1 to 30 will be briefly described or omitted.

Referring to FIG. 31, a fourth recess process is performed for the preliminary isolation insulating pattern 134p2.

As the fourth recess process is performed, the preliminary isolation insulating pattern 134p2 may expose a portion of the region of the preliminary charge storage layer 133p, which is not covered by the mask pattern 300. That is, a portion of the preliminary charge storage layer 133p may be exposed from the mask pattern 300 and the preliminary isolation insulating pattern 134p2.

Referring to FIG. 32, the second oxidation process is performed for the preliminary charge storage layer 133p.

In the second oxidation process, the degree of oxidation of the region of the preliminary charge storage layer 133p may be changed depending on the position at which the mask pattern 300 and the preliminary isolation insulating pattern 134p2 are formed. In detail, in the second oxidation process, the degree of oxidation of the region of the preliminary charge storage layer 133p, which is exposed from the mask pattern 300 and the preliminary isolation insulating pattern 134p2, may be greater than the degree of oxidation of the region of the preliminary charge storage layer 133p, which is covered by the mask pattern 300 or the preliminary isolation insulating pattern 134p2. Therefore, the charge storage layer 133 including the charge trap portion 1331, the first charge blocking portion 1332 and the second charge blocking portion 1333 may be formed.

For example, the region of the preliminary charge storage layer 133p, which is exposed from the mask pattern 300 and the preliminary isolation insulating pattern 134p2, may be relatively strongly oxidized or completely oxidized. As a result, the second charge blocking portion 1333 interposed between the charge trap portion 1331 and the first charge blocking portion 1332 may be formed. For example, the second charge blocking portion 1333 may include a silicon oxide layer formed by completely oxidizing a silicon nitride layer of the preliminary charge storage layer 133p.

Subsequently, the steps described above with reference to FIGS. 24 to 30 and 4 may be performed. As a result, the semiconductor memory device described above with reference to FIGS. 8e and 9 may be fabricated.

Hereinafter, an electronic system including a semiconductor memory device according to example embodiments will be described with reference to FIGS. 1 to 35.

Figure 33:
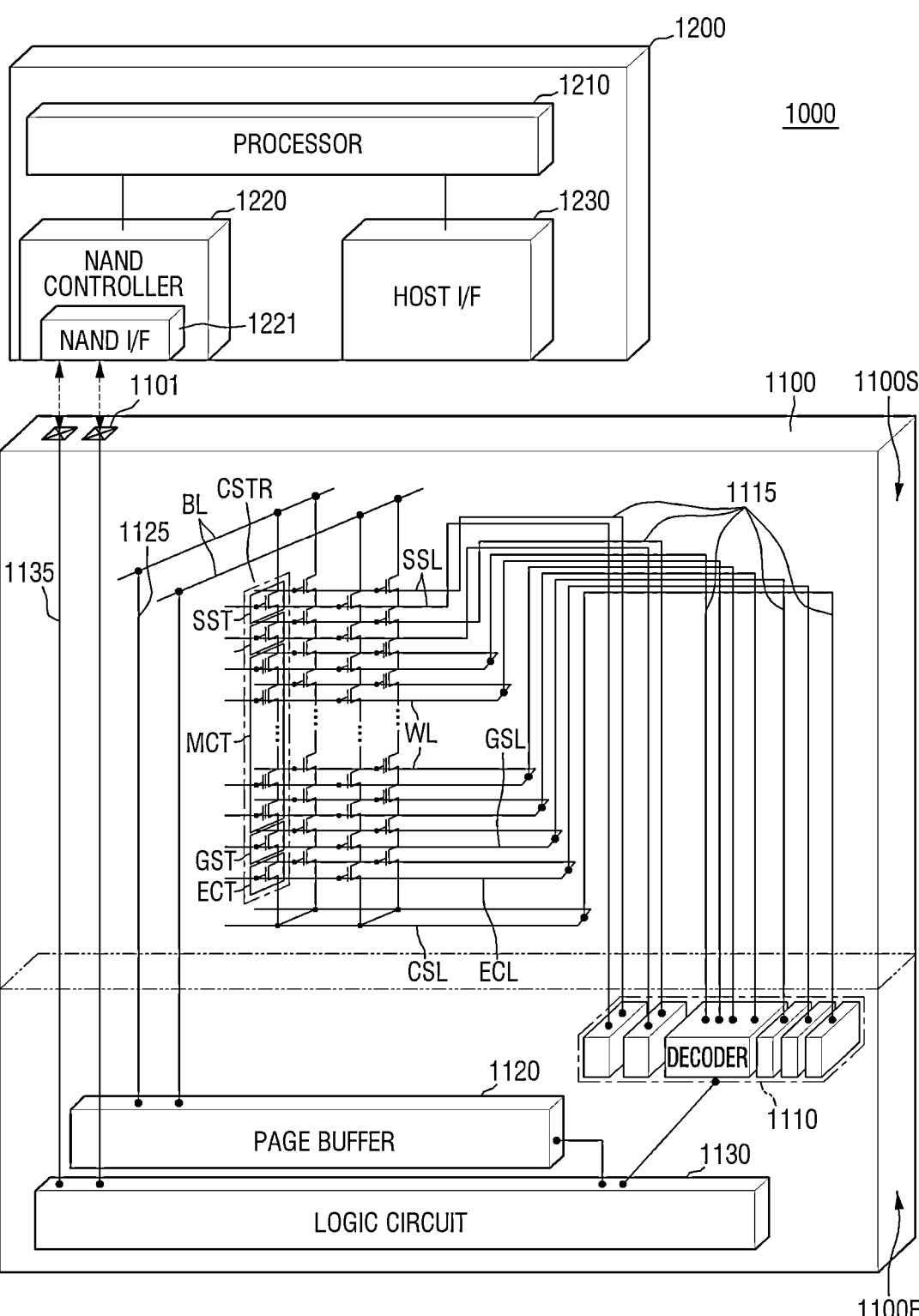
FIG. 33 is an example block diagram illustrating an electronic system according to some example embodiments.
Figure 34:
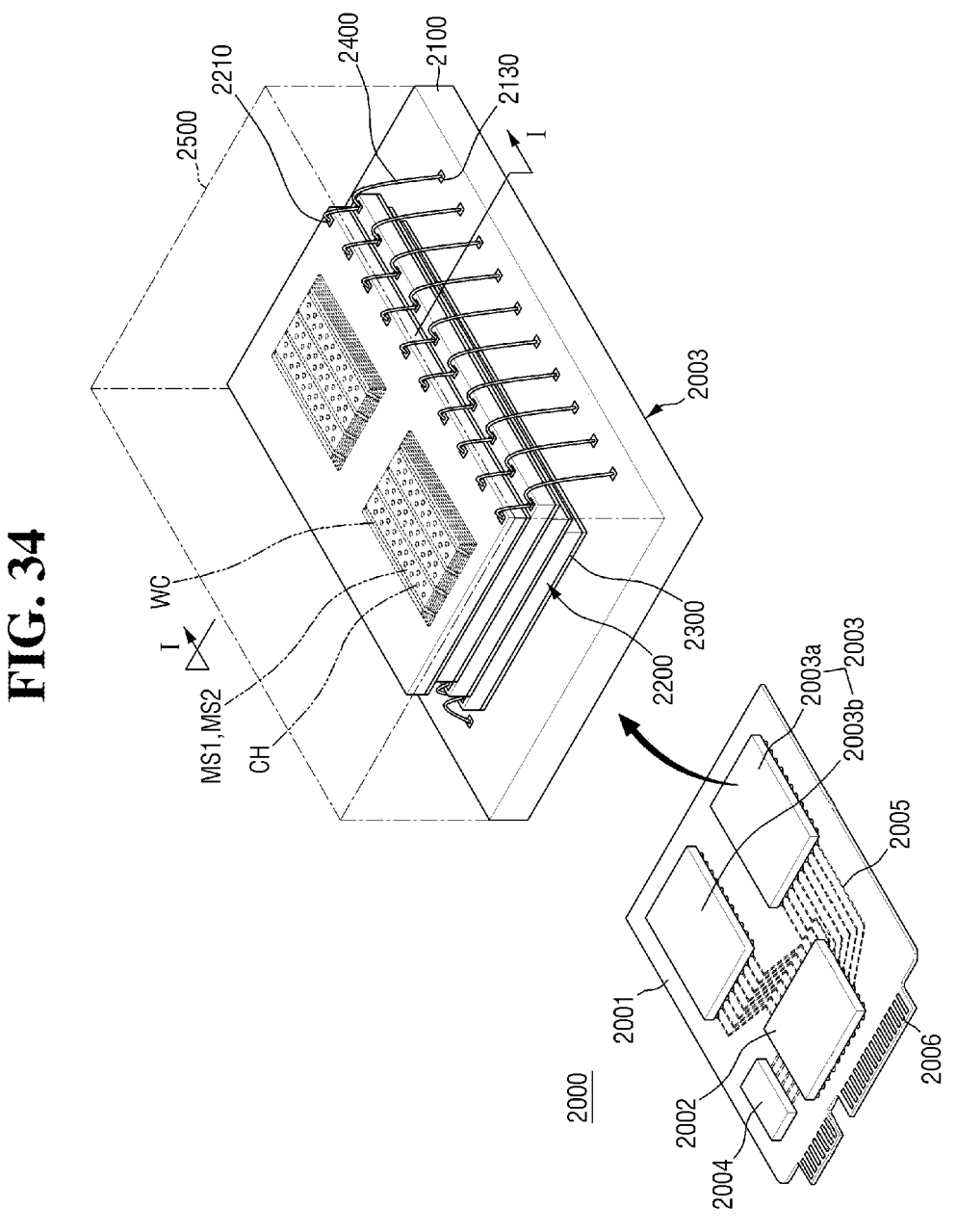
FIG. 34 is an example perspective view illustrating an electronic system according to some example embodiments.
Figure 35:
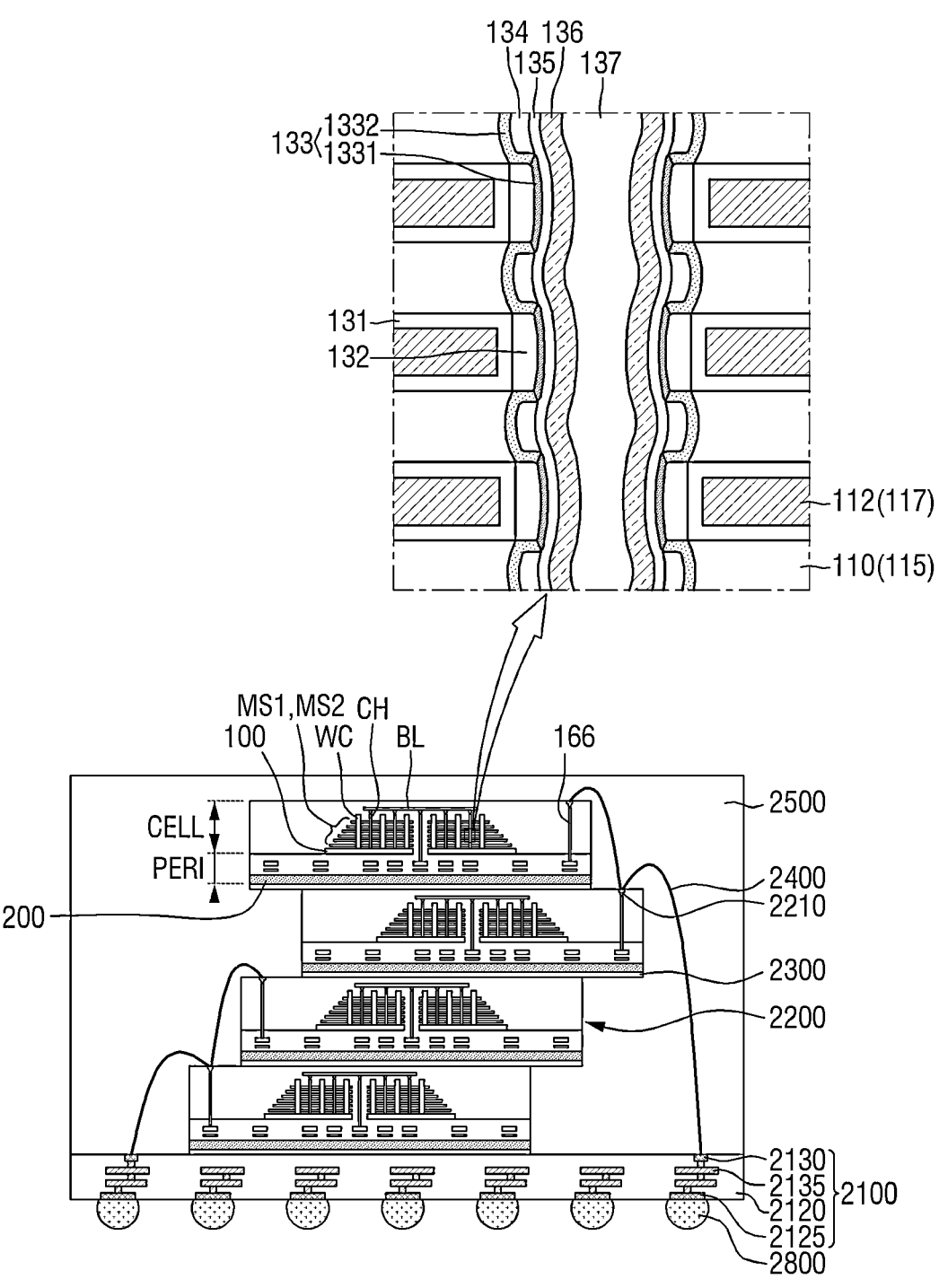
FIG. 35 is a schematic cross-sectional view taken along line I-I of FIG. 34.

FIG. 33 is an example block diagram illustrating an electronic system according to some example embodiments. FIG. 34 is an example perspective view illustrating an electronic system according to some example embodiments. FIG. 35 is a schematic cross-sectional view taken along line I-I of FIG. 34.

Referring to FIG. 33, an electronic system 1000 according to some example embodiments may include a semiconductor memory device 1100 and a controller 1200 electrically connected to the semiconductor memory device 1100. The electronic system 1000 may be a storage device including one or a plurality of semiconductor memory devices 1100 or an electronic device including the storage device. For example, the electronic system 1000 may be a solid state drive (SSD) device, a universal serial bus (USB), a computing system, a medical device or a communication device, which includes one or more semiconductor memory devices 1100.

The semiconductor memory device 1100 may be a non-volatile memory device (e.g., NAND flash memory device), and may be, for example, the semiconductor memory device described with reference to FIGS. 1 to 11. The semiconductor memory device 1100 may include a first structure 1100F and a second structure 1100S on the first structure 1100F.

The first structure 1100F may be a peripheral circuit structure that includes a decoder circuit 1110 (e.g., the row decoder 33 of FIG. 1), a page buffer 1120 (e.g., the page buffer 35 of FIG. 1) and a logic circuit 1130 (e.g., the control logic 37 of FIG. 1).

The second structure 1100S may include a common source line CSL, a plurality of bit lines BL and a plurality of cell strings CSTR, which are described above with reference to FIG. 2. The cell strings CSTR may be connected to the decoder circuit 1110 through a word line WL, at least one string selection line SSL and at least one ground selection line GSL. In addition, the cell strings CSTR may be connected to the page buffer 1120 through the bit lines BL.

In some example embodiments, the common source line CSL and the cell strings CSTR may be electrically connected to the decoder circuit 1110 through first connection lines 1115 extended from the first structure 1100F to the second structure 1100S. The first connection line 1115 may correspond to a portion of the through vias 166 described with reference to FIGS. 1 to 11. That is, the through via 166 may electrically connect each of the gate electrodes 112 and 117 and the decoder circuit 1110 (e.g., the row decoder 33 of FIG. 1).

In some example embodiments, the bit lines BL may be electrically connected to the page buffer 1120 through second connection lines 1125 extended from the first structure 1100F to the second structure 1100S. The second connection line 1125 may correspond to another portion of the through vias 166 described with reference to FIGS. 1 to 11. That is, the through via 166 may electrically connect the bit lines BL with the page buffer 1120 (e.g., the page buffer 35 of FIG. 1).

The semiconductor memory device 1100 may communicate with the controller 1200 through an input/output pad 1101 electrically connected to the logic circuit 1130 (e.g., the control logic 37 of FIG. 1). The input/output pad 1101 may be electrically connected to the logic circuit 1130 through an input/output connection line 1135 extended from the first structure 1100F to the second structure 1100S.

The controller 1200 may include a processor 1210, a NAND controller 1220 and a host interface 1230. In some example embodiments, the electronic system 1000 may include a plurality of semiconductor memory devices 1100, and in this case, the controller 1200 may control the plurality of semiconductor memory devices 1100.

The processor 1210 may control the overall operation of the electronic system 1000 including the controller 1200. The processor 1210 may operate in accordance with predetermined firmware, and may access the semiconductor memory device 1100 by controlling the NAND controller 1220. The NAND controller 1220 may include a NAND interface 1221 that processes communication with the semiconductor memory device 1100. A control command for controlling the semiconductor memory device 1100, data to be written in the memory cell transistors MCT of the semiconductor memory device 1100, data to be read from the memory cell transistors MCT of the semiconductor memory device 1100, etc. may be transmitted through the NAND interface 1221. The host interface 1230 may provide a communication function between the electronic system 1000 and an external host. When the control command is received from the external host through the host interface 1230, the processor 1210 may control the semiconductor memory device 1100 in response to the control command.

Referring to FIGS. 34 and 35, an electronic system 2000 according to some example embodiments may include a main board 2001, a main controller 2002 packaged on the main board 2001, one or more semiconductor packages 2003 and a DRAM 2004. The semiconductor package 2003 and the DRAM 2004 may be connected to the main controller 2002 by wiring patterns 2005 formed in the main board 2001.

The main board 2001 may include a connector 2006 that includes a plurality of pins coupled to the external host. The number and arrangement of the plurality of pins in the connector 2006 may be varied depending on the communication interface between the electronic system 2000 and the external host. In some example embodiments, the electronic system 2000 may perform communication with the external host in accordance with any one of interfaces such as a Universal Serial Bus (USB), a Peripheral Component Interconnect Express (PCI-Express), Serial Advanced Technology Attachment (SATA) and M-Phy for Universal Flash Storage (UFS). In some example embodiments, the electronic system 2000 may operate by a power source supplied from the external host through the connector 2006. The electronic system 2000 may further include a power management integrated circuit (PMIC) that distributes the power source supplied from the external host to the main controller 2002 and the semiconductor package 2003.

The main controller 2002 may write data in the semiconductor package 2003 or read the data from the semiconductor package 2003, and may improve the operating speed of the electronic system 2000.

The DRAM 2004 may be a buffer memory for mitigating a speed difference between the semiconductor package 2003 that is a data storage space and the external host. Also, the DRAM 2004 included in the electronic system 2000 may operate as a kind of a cache memory, and may provide a space for temporarily storing data in a control operation for the semiconductor package 2003. When the DRAM 2004 is included in the electronic system 2000, the main controller 2002 may further include a DRAM controller for controlling the DRAM 2004, in addition to the NAND controller for controlling the semiconductor package 2003.

The semiconductor package 2003 may include a first semiconductor package 2003a and a second semiconductor package 2003b, which are spaced apart from each other. Each of the first semiconductor package 2003a and the second semiconductor package 2003b may be a semiconductor package that includes a plurality of semiconductor chips 2200. Each of the first semiconductor package 2003a and the second semiconductor package 2003b may include a package substrate 2100, semiconductor chips 2200 on the package substrate 2100, adhesive layers 2300 disposed on lower surfaces of the respective semiconductor chips 2200, a connection structure 2400 for electrically connecting the semiconductor chips 2200 with the package substrate 2100, and a molding layer 2500 covering the semiconductor chips 2200 and the connection structure 2400 on the package substrate 2100.

The package substrate 2100 may be a printed circuit board that includes package upper pads 2130. Each semiconductor chip 2200 may include an input/output pad 2210. The input/output pad 2210 may correspond to the input/output pad 1101 of FIG. 33.

In some example embodiments, the connection structure 2400 may be a bonding wire for electrically connecting the input/output pad 2210 with the package upper pads 2130. Therefore, in each of the first semiconductor package 2003a and the second semiconductor package 2003b, the semiconductor chips 2200 may be electrically connected to each other in a bonding wire manner, and may be electrically connected to the package upper pads 2130 of the package substrate 2100. In some example embodiments, in each of the first semiconductor package 2003a and the second semiconductor package 2003b, the semiconductor chips 2200 may be electrically connected to each other by a connection structure that includes a through silicon via (TSV), instead of the connection structure 2400 of the bonding wire manner.

In some example embodiments, the main controller 2002 and the semiconductor chips 2200 may be included in one package. In some embodiments, the main controller 2002 and the semiconductor chips 2200 may be packaged on a separate interposer substrate different from the main board 2001, and the main controller 2002 may be connected with the semiconductor chips 2200 by a wire formed in the interposer substrate.

In some example embodiments, the package substrate 2100 may be a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and internal wires 2135 electrically connecting the upper pads 2130 with the lower pads 2125 inside the package substrate body portion 2120. The upper pads 2130 may be electrically connected to the connection structures 2400. The lower pads 2125 may be connected to the wiring patterns 2005 of the main board 2001 of the electronic system 2000 through conductive connectors 2800 as shown in FIG. 34.

In the electronic system according to some example embodiments, each of the semiconductor chips 2200 may include the semiconductor memory device described with reference to FIGS. 1 to 11. For example, each of the semiconductor chips 2200 may include a peripheral circuit structure PERI, and a memory cell structure CELL stacked on the peripheral circuit structure PERI. Illustratively, the peripheral circuit structure PERI may include the peripheral circuit board 200, etc., which are described with reference to FIGS. 3 to 7. Also, the memory cell structure CELL may include the cell substrate 100, the mold stacks MS1 and MS2, the channel structure CH, the word line cutting region WLC and the through via 166, which are described with reference to FIGS. 3 to 7. Also, the channel structure CH may include the blocking insulating pattern 132, the charge storage layer 133, the isolation insulating pattern 134, the tunnel insulating layer 135, the semiconductor layer 136 and the filling insulating layer 137.

In concluding the detailed description, those skilled in the art will appreciate that many variations and modifications may be made to the example embodiments without substantially departing from the principles of the present inventive concepts. Therefore, the disclosed example embodiments of the invention are used in a generic and descriptive sense only and not for purposes of limitation.

What is claimed is:

1. A semiconductor memory device comprising:
a cell substrate;
a mold stack including mold insulating layers and gate electrodes, which are alternately stacked on the cell substrate;
a semiconductor layer extended in a vertical direction crossing an upper surface of the cell substrate to pass through the mold stack;
a blocking insulating pattern between the semiconductor layer and each of the gate electrodes;
a charge storage layer including a charge trap portion and a first charge blocking portion, the charge trap portion between the semiconductor layer and the blocking insulating pattern, and the first charge blocking portion between the semiconductor layer and each of the mold insulating layers; and a tunnel insulating layer between the semiconductor layer and the charge storage layer,
wherein an oxygen concentration of the first charge blocking portion is higher than that of the charge trap portion.

2. The semiconductor memory device of claim 1, wherein a thickness of the first charge blocking portion is greater than that of the charge trap portion.

3. The semiconductor memory device of claim 1, wherein the charge trap portion includes a silicon nitride layer, and the first charge blocking portion includes a silicon oxynitride layer.

4. The semiconductor memory device of claim 1, wherein the blocking insulating pattern includes a convex surface that is convex toward the semiconductor layer, and the charge trap portion is extended along the convex surface.

5. The semiconductor memory device of claim 1, wherein each of the mold insulating layers includes a recess that is concave toward the semiconductor layer, and the first charge blocking portion is extended along the recess.

6. The semiconductor memory device of claim 1, further comprising:
an isolation insulating pattern between the first charge blocking portion and the tunnel insulating layer.

7. The semiconductor memory device of claim 1, wherein the charge storage layer further includes a second charge blocking portion between the charge trap portion and the first charge blocking portion, and an oxygen concentration of the second charge blocking portion is higher than that of the first charge blocking portion.

8. The semiconductor memory device of claim 7, wherein a thickness of the second charge blocking portion is greater than that of the first charge blocking portion.

9. The semiconductor memory device of claim 7, wherein the charge trap portion includes a silicon nitride layer, the first charge blocking portion includes a silicon oxynitride layer, and the second charge blocking portion includes a silicon oxide layer.

10. The semiconductor memory device of claim 1, further comprising:
a gate dielectric layer between the blocking insulating pattern and each of the gate electrodes.

11. A semiconductor memory device comprising:
a cell substrate;
a mold stack including mold insulating layers and gate electrodes, which are alternately stacked on the cell substrate; and
a channel structure extended in a vertical direction crossing an upper surface of the cell substrate to pass through the mold stack,
wherein the channel structure includes:
a blocking insulating pattern on a side surface of each of the gate electrodes;
a charge storage layer including a charge trap portion extended along the blocking insulating pattern and a first charge blocking portion extended along a side surface of each of the mold insulating layers;
an isolation insulating pattern on the first charge blocking portion;
a tunnel insulating layer extended along the charge trap portion and the isolation insulating pattern; and
a semiconductor layer extended along the tunnel insulating layer, wherein an oxygen concentration of the first charge blocking portion is higher than an oxygen concentration of the charge trap portion.

12. The semiconductor memory device of claim 11, wherein the blocking insulating pattern and the isolation insulating pattern are alternately arranged in the vertical direction.

13. The semiconductor memory device of claim 11, wherein each of the blocking insulating pattern and the isolation insulating pattern includes a silicon oxide layer.

14. The semiconductor memory device of claim 11, wherein the isolation insulating pattern includes a concave surface that is concave toward the semiconductor layer, and the tunnel insulating layer is extended along the concave surface.

15. The semiconductor memory device of claim 11, wherein the charge storage layer further includes a second charge blocking portion between the charge trap portion and the first charge blocking portion, and an oxygen concentration of the second charge blocking portion is higher than that of the first charge blocking portion.

16. The semiconductor memory device of claim 15, wherein a thickness of the first charge blocking portion is greater than a thickness of the charge trap portion, and a thickness of the second charge blocking portion is greater than a thickness of the first charge blocking portion.

17. The semiconductor memory device of claim 15, wherein the charge trap portion includes a silicon nitride layer, the first charge blocking portion includes a silicon oxynitride layer, and the second charge blocking portion includes a silicon oxide layer.

18. An electronic system comprising:

a main board;

a semiconductor memory device including a peripheral circuit structure and a memory cell structure, which are sequentially stacked on the main board; and a controller electrically connected to the semiconductor memory device on the main board, wherein the memory cell structure includes, a cell substrate;

a mold stack including mold insulating layers and gate electrodes, which are alternately stacked on the cell substrate;

a semiconductor layer extended in a vertical direction crossing an upper surface of the cell substrate to pass through the mold stack;

a blocking insulating pattern between the semiconductor layer and each of the gate electrodes;

a charge storage layer including a charge trap portion and a first charge blocking portion, the charge trap portion between the semiconductor layer and the blocking insulating pattern, and the first charge blocking portion between the semiconductor layer and each of the mold insulating layers; and a tunnel insulating layer between the semiconductor layer and the charge storage layer, wherein an oxygen concentration of the first charge blocking portion is higher than an oxygen concentration of the charge trap portion.

19. The electronic system of claim 18, wherein the charge storage layer further includes a second charge blocking portion between the charge trap portion and the first charge blocking portion, and an oxygen concentration of the second charge blocking portion is higher than an oxygen concentration of the first charge blocking portion.

20. The electronic system of claim 18, wherein the memory cell structure further includes:

a word line cutting region extended in a first horizontal direction crossing the vertical direction to cut the mold stack; and a bit line extended in a second horizontal direction crossing the vertical direction and the first horizontal direction, and electrically connected to the semiconductor layer, and the gate electrodes and the bit line are electrically connected to the controller.

* * * * *